United States Patent
Kato et al.

(10) Patent No.: US 10,236,875 B2
(45) Date of Patent: Mar. 19, 2019

(54) SEMICONDUCTOR DEVICE AND METHOD FOR OPERATING THE SEMICONDUCTOR DEVICE

(71) Applicant: Semiconductor Energy Laboratory Co., Ltd., Atsugi-shi, Kanagawa-ken (JP)

(72) Inventors: Kiyoshi Kato, Kanagawa (JP); Yutaka Shionoiri, Kanagawa (JP); Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/482,985

(22) Filed: Apr. 10, 2017

(65) Prior Publication Data
US 2017/0302271 A1  Oct. 19, 2017

(30) Foreign Application Priority Data

Apr. 15, 2016  (JP) .................... 2016-082257
Apr. 28, 2016  (JP) .................... 2016-091517

(51) Int. Cl.
*H03K 17/687*  (2006.01)
*G11C 5/02*  (2006.01)
(Continued)

(52) U.S. Cl.
CPC ......... *H03K 17/6871* (2013.01); *G11C 5/025* (2013.01); *G11C 7/06* (2013.01);
(Continued)

(58) Field of Classification Search
CPC .... H03K 17/0822; H03K 5/24; H03K 17/687; H03K 3/0315; H03K 5/08; H03K 3/02;
(Continued)

(56) References Cited

U.S. PATENT DOCUMENTS 5,251,153 A * 10/1993 Nielsen ................ G06F 3/0489
  137/551
5,731,856 A    3/1998 Kim et al.
(Continued)

FOREIGN PATENT DOCUMENTS

EP    1737044 A   12/2006
EP    2226847 A   9/2010
(Continued)

OTHER PUBLICATIONS

Tamura.H et al., "Embedded SRAM and Cortex-M0 Core Using a 60-nm Crystalline Oxide Semiconductor", IEEE Micro, Nov. 1, 2014, vol. 34, No. 6, pp. 42-53.
(Continued)

*Primary Examiner* — John W Poos
(74) *Attorney, Agent, or Firm* — Fish & Richardson P.C.

(57) ABSTRACT

A potential is held stably. A negative potential is generated with high accuracy. A semiconductor device with a high output voltage is provided. The semiconductor device includes a first transistor, a second transistor, a capacitor, and a comparator. The comparator includes a non-inverting input terminal, an inverting input terminal, and an output terminal. A gate and one of a source and a drain of the first transistor are electrically connected to each other. One of a source and a drain of the second transistor is electrically connected to the non-inverting input terminal of the comparator, one electrode of the capacitor, and a gate of the second transistor. The other of the source and the drain of the second transistor is electrically connected to the one of the source and the drain of the first transistor. The first transistor and the second transistor each contain an oxide semiconductor.

15 Claims, 46 Drawing Sheets

(51) Int. Cl.
*G11C 7/06* (2006.01)
*H01L 29/26* (2006.01)
*G11C 11/404* (2006.01)
*G11C 11/405* (2006.01)
*G11C 11/4074* (2006.01)
*G11C 11/4091* (2006.01)
*G11C 11/4097* (2006.01)
*H03K 19/0944* (2006.01)
*H02M 3/07* (2006.01)

(52) U.S. Cl.
CPC .......... *G11C 11/404* (2013.01); *G11C 11/405* (2013.01); *G11C 11/4074* (2013.01); *G11C 11/4091* (2013.01); *G11C 11/4097* (2013.01); *H01L 29/26* (2013.01); *H03K 19/0944* (2013.01); *H02M 3/07* (2013.01)

(58) Field of Classification Search
CPC .. G11C 5/147; G11C 5/14; G11C 5/06; G11C 16/30; G11C 5/145; G11C 7/10; G11C 5/02
USPC .................................. 327/436, 437, 534, 536
See application file for complete search history.

(56) References Cited

U.S. PATENT DOCUMENTS

| | | | |
|---|---|---|---|
| 5,744,864 A | 4/1998 | Cillessen et al. | |
| 6,069,518 A | 5/2000 | Nakai et al. | |
| 6,204,721 B1* | 3/2001 | Yuen | H02M 3/07 327/534 |
| 6,229,379 B1 | 5/2001 | Okamoto | |
| 6,294,274 B1 | 9/2001 | Kawazoe et al. | |
| 6,337,593 B1 | 1/2002 | Mizuno et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,737,109 B2 | 5/2014 | Yamazaki et al. | |
| 8,947,158 B2 | 2/2015 | Watanabe | |
| 9,385,592 B2 | 7/2016 | Watanabe et al. | |
| 9,501,119 B2 | 11/2016 | Watanabe | |
| 9,825,526 B2 | 11/2017 | Watanabe | |
| 9,847,406 B2 | 12/2017 | Miyairi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0241515 A1* | 9/2013 | Yamashiro | G05F 1/625 323/284 |
| 2016/0094236 A1* | 3/2016 | Shionoiri | H03M 1/002 341/122 |
| 2017/0179294 A1 | 6/2017 | Kato et al. | |
| 2017/0186473 A1 | 6/2017 | Ikeda et al. | |
| 2017/0186749 A1 | 6/2017 | Ohshima et al. | |
| 2017/0229486 A1 | 8/2017 | Matsuda et al. | |
| 2017/0230041 A1 | 8/2017 | Kato et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| JP | 07-231647 A | 8/1995 |
|---|---|---|
| JP | 08-264794 A | 10/1996 |
| JP | 11-505377 | 5/1999 |
| JP | 11-150230 A | 6/1999 |
| JP | 11-191611 A | 7/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-069932 A | 4/2012 |
| WO | WO-2004/114391 | 12/2004 |

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous An—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al, B: Mg, Mn, Fe, Ni, Cu,or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) Jun. 26, 2007, vol. 90, No. 26, pp. 262106-1-262106-3.

Park.S et al., "Challenge to Future Displays: Transparent AM-OLED Driven by PEALD Grown ZnO TFT"IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

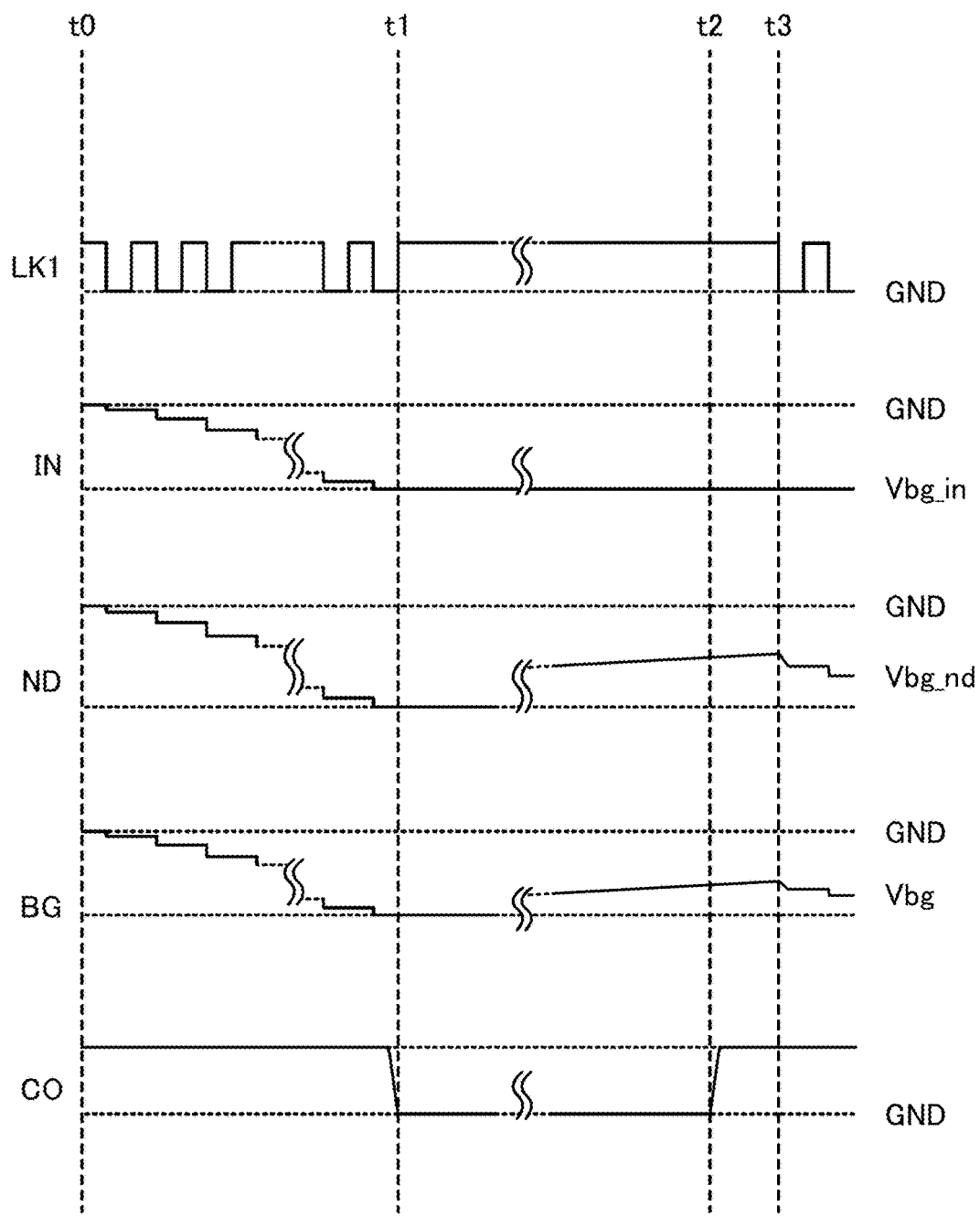

SEMICONDUCTOR DEVICE AND METHOD FOR OPERATING THE SEMICONDUCTOR DEVICE

BACKGROUND OF THE INVENTION

1. Field of the Invention

One embodiment of the present invention disclosed in the specification, drawings, and scope of claims of this application (hereinafter referred to as this specification and the like) relates to a semiconductor device, an operation method thereof, a usage method thereof, a manufacturing method thereof, and the like. Note that one embodiment of the present invention is not limited to these technical fields.

2. Description of the Related Art

A semiconductor device in which a negative potential lower than a ground potential is used is known. For example, in order to reduce subthreshold leakage current, a substrate bias potential in an n-channel MOS transistor is a negative potential, whereas a substrate bias potential in a p-channel MOS transistor is a positive potential (Patent Document 1). In a flash memory, a negative potential is used depending on the operation (Patent Document 2).

A negative potential can be generated by a charge pump circuit. Patent Documents 2 and 3 disclose a technique for generating negative potentials with high accuracy. In Patent Documents 2 and 3, a negative voltage output from a charge pump circuit is converted into a positive voltage, the difference between the positive voltage and a positive reference voltage is detected by a comparator circuit, and the operation of the charge pump circuit is controlled on the basis of the detection results.

A transistor in which an oxide semiconductor is used for a semiconductor layer where a channel is formed (hereinafter, an OS transistor) has an extremely low off-state current. Patent Document 4 discloses a memory device using an OS transistor including a first gate electrode and a second gate electrode. For a longer data holding time, a potential lower than a ground potential is input to the second gate electrode. Since the potential of the second gate electrode is a negative potential, the threshold voltage of the OS transistor is shifted on the positive side, and the off-state current of the OS transistor is small.

REFERENCE

Patent Documents

[Patent Document 1] Japanese Published Patent Application No. H11-191611
[Patent Document 2] Japanese Published Patent Application No. H7-231647
[Patent Document 3] Japanese Published Patent Application No. H11-150230
[Patent Document 4] Japanese Published Patent Application No. 2012-069932

Non-Patent Document

[Non-Patent Document 1] H. Tamura et al., "Embedded SRAM and Cortex-M0 Core Using a 60-nm Crystalline Oxide Semiconductor," *IEEE Micro,* 2014, vol. 34, No. 6, pp. 42-53.

SUMMARY OF THE INVENTION

An object of one embodiment of the present invention is to provide a novel semiconductor device. Another object of one embodiment of the present invention is to provide a novel memory device. Another object of one embodiment of the present invention is to provide a novel electronic component.

Another object of one embodiment of the present invention is to provide a method for operating a novel semiconductor device. Another object of one embodiment of the present invention is to provide a usage method of a novel semiconductor device.

Another object of one embodiment of the present invention is to hold a potential stably. Another object of one embodiment of the present invention is to generate a negative potential with high accuracy. Another object of one embodiment of the present invention is to compare two negative potentials directly. Another object of one embodiment of the present invention is to provide a semiconductor device with a high output voltage. Another object of one embodiment of the present invention is to provide a highly reliable semiconductor device. Another object of one embodiment of the present invention is to downsize a semiconductor device. Another object of one embodiment of the present invention is to reduce power consumption of a semiconductor device. Another object of one embodiment of the present invention is to provide a semiconductor device that operates with a single power source.

Note that one embodiment of the present invention does not necessarily achieve all the objects described above. The description of a plurality of objects does not preclude their coexistence. Other objects will be apparent from the description of this specification and the like, and such objects could be objects of one embodiment of the present invention.

One embodiment of the present invention is a semiconductor device including a first transistor, a second transistor, a capacitor, and a comparator. The comparator includes a non-inverting input terminal, an inverting input terminal, and an output terminal. A gate and one of a source and a drain of the first transistor are electrically connected to each other. One of a source and a drain of the second transistor is electrically connected to the non-inverting input terminal of the comparator, one electrode of the capacitor, and a gate of the second transistor. The other of the source and the drain of the second transistor is electrically connected to the one of the source and the drain of the first transistor. The first transistor and the second transistor each contain an oxide semiconductor.

In the above structure, it is preferable that the first transistor have a back gate, the gate and the back gate of the first transistor be electrically connected to each other, the second transistor have a back gate, and the gate and the back gate of the second transistor be electrically connected to each other. In the above structure, it is preferable that the other of the source and the drain of the first transistor be electrically connected to the inverting input terminal. In the above structure, a charge pump is preferably provided. An output terminal of the charge pump is preferably electrically connected to the other of the source and the drain of the first transistor. The charge pump preferably includes two or more and four or less transistors containing silicon in channel regions. The transistors are preferably electrically connected to each other in series through sources or drains of the transistors containing silicon in the channel regions. The charge pump preferably includes two or more and four or less transistors containing an oxide semiconductor in channel regions. The transistors are preferably electrically connected to each other in series through sources or drains of the transistors containing an oxide semiconductor in the channel regions. A transistor at one end of the two or more and four or less transistors whose channel regions contain silicon and a transistor at one end of the two or more and four or less transistors whose channel regions contain an oxide semiconductor are preferably electrically connected to each other in series through a source or a drain of the transistor at the one end of the two or more and four or less transistors whose channel regions contain silicon and a source or drain of the transistor at the one end of the two or more and four or less transistors whose channel regions contain an oxide semiconductor. One of a source and a drain of a transistor at the other end of the two or more and four or less transistors whose channel regions contain an oxide semiconductor is preferably electrically connected to the other of the source and the drain of the first transistor.

In the above structure, it is preferable that the semiconductor device include a third transistor and a fourth transistor, the third transistor and the fourth transistor be included in the comparator, the third transistor and the fourth transistor each contain an oxide semiconductor, the third transistor and the fourth transistor each have a back gate, a gate of the third transistor be electrically connected to the non-inverting input terminal, and a gate or the back gate of the fourth transistor be electrically connected to the inverting input terminal.

Another embodiment of the present invention is an electronic component including a chip and a lead. The lead is electrically connected to the chip. The chip includes the semiconductor device with any of the above structures.

Another embodiment of the present invention is an electronic component including a chip and a lead. The lead is electrically connected to the chip. The chip includes the semiconductor device with any of the above structures and at least one of a memory device and a processor core.

Another embodiment of the present invention is an electronic device including either of the above electronic components and at least one of a display portion, a touch sensor, a microphone, a speaker, an operation key, and a housing.

Another embodiment of the present invention is a semiconductor device including k holding circuits (k is a positive integer) and a charge pump. Each of the k holding circuits includes a comparator, a first transistor, a second transistor, and a capacitor. One of a source and a drain of the first transistor is electrically connected to a non-inverting input terminal of the comparator. One of a source and a drain of the second transistor is electrically connected to the other of the source and the drain of the first transistor. The capacitor is electrically connected to the other of the source and the drain of the first transistor. The charge pump is electrically connected to the other of the source and the drain of the second transistor included in each of the k holding circuits.

In the above structure, an inverting input terminal of the comparator included in each of the k holding circuits is preferably electrically connected to the charge pump.

The semiconductor device preferably includes a memory device. The memory device preferably includes a plurality of transistors each having a back gate and a channel region containing an oxide semiconductor. The back gate of each of the plurality of transistors is preferably electrically connected to the one of the source and the drain of the second transistor.

In the above structure, a channel region of the second transistor preferably includes a portion whose energy band gap is larger than an energy band gap of any of the plurality of transistors included in the memory device.

In the above structure, the channel region of the second transistor and the channel regions of the plurality of transistors included in the memory device preferably contain indium, an element M, and zinc. The element M is preferably one or more selected from aluminum, gallium, yttrium, tin, boron, silicon, titanium, iron, nickel, germanium, zirconium, molybdenum, lanthanum, cerium, neodymium, hafnium, tantalum, tungsten, and magnesium. When an atomic ratio of indium to the element M and zinc in the channel region of the second transistor is $x_2:y_2:z_2$ and an atomic ratio of indium to the element M and zinc in the channel region of any of the plurality of transistors included in the memory device is $x_5:y_5:z_5$, a portion where $y_5/x_5$ is larger than $y_2/x_2$ is preferably included.

Another embodiment of the present invention is an operation method of a semiconductor device including a first transistor, a second transistor, a capacitor, and a comparator. The comparator includes a non-inverting input terminal, an inverting input terminal, and an output terminal. A gate and one of a source and a drain of the first transistor are electrically connected to each other. A gate and one of a source and a drain of the second transistor are electrically connected to each other. The one of the source and the drain of the first transistor is electrically connected to the other of the source and the drain of the second transistor. One electrode of the capacitor is electrically connected to the one of the source and the drain of the second transistor. The one of the source and the drain of the second transistor is electrically connected to the non-inverting input terminal of the comparator. The first transistor and the second transistor each contain an oxide semiconductor. The comparator compares a first potential applied from the non-inverting input terminal and a second potential applied from the inverting input terminal and outputs a high potential signal or a low potential signal in response to a comparison result. When the high potential signal or the low potential signal is output, a potential of the one of the source and the drain of the first transistor is reduced.

In the above structure, it is preferable that the first transistor have a back gate, the gate and the back gate of the first transistor be electrically connected to each other, the second transistor have a back gate, and the gate and the back gate of the second transistor be electrically connected to each other.

In the above structure, it is preferable that the semiconductor device include a third transistor and a fourth transistor, the third transistor and the fourth transistor be included in the comparator, the third transistor and the fourth transistor each contain an oxide semiconductor, the third transistor and the fourth transistor each have a back gate, the first potential be applied to a gate of the third transistor, the second potential be applied to a gate of the fourth transistor, the first potential and the second potential be each a negative potential, and a positive potential be applied to the back gate of the third transistor and the back gate of the fourth transistor.

Another embodiment of the present invention is an operation method of a semiconductor device including a first transistor, a first capacitor, a second transistor, a second capacitor, a comparator, and a logic circuit. The logic circuit includes an input terminal and an output terminal. The comparator includes a non-inverting input terminal, an inverting input terminal, and an output terminal. One of a source and a drain of the first transistor is electrically connected to a gate of the first transistor and one electrode of the first capacitor. The other of the source and the drain of the first transistor is electrically connected to the inverting input terminal. One of a source and a drain of the second transistor is electrically connected to a gate of the second transistor, one electrode of the second capacitor, and the non-inverting input terminal of the comparator. The one of the source and the drain of the first transistor is electrically connected to the other of the source and the drain of the second transistor. The output terminal of the comparator is electrically connected to the input terminal of the logic circuit. The first transistor and the second transistor each contain an oxide semiconductor in a channel formation region. When the comparator outputs one of a high potential signal and a low potential signal, a potential of the one of the source and the drain of the first transistor is reduced. The output terminal of the logic circuit is electrically connected to the other electrode of the first capacitor. When the comparator outputs one of the high potential signal and the low potential signal, a clock signal is applied from the logic circuit to the one of the source and the drain of the first transistor.

The above semiconductor device preferably includes a third transistor, a fourth transistor, a third capacitor, and a fourth capacitor. One of a source and a drain of the third transistor is preferably electrically connected to a gate of the third transistor, one electrode of the third capacitor, and one of a source and a drain of the fourth transistor. The one of the source and the drain of the fourth transistor is preferably electrically connected to a gate of the fourth transistor and one electrode of the fourth capacitor. A clock signal is preferably applied to the other electrode of the fourth capacitor. The third transistor preferably contains silicon in a channel formation region. The fourth transistor preferably contains an oxide semiconductor in a channel formation region. The other of the source and the drain of the fourth transistor is preferably electrically connected to a plurality of transistors connected in series and the other of the source and the drain of the first transistor.

In the above structure, each of the plurality of transistors connected in series preferably contains an oxide semiconductor in a channel formation region.

Another embodiment of the present invention is an operation method of a semiconductor device including a transistor. In the case where an interval between signal applications to a gate of the transistor is longer than or equal to 1 second and shorter than 10 days, a first potential is applied to the gate. In the case where an interval between signal applications to the gate of the transistor is longer than or equal to 1 day and shorter than or equal to 20 years, a second potential is applied to the gate. The first potential is higher than the second potential.

The above semiconductor device preferably includes a second transistor, a third transistor, and a selector. One of a source and a drain of the second transistor or one of a source and a drain of the third transistor is preferably selected to be electrically connected to the gate of the transistor through the selector; the gate of the transistor is preferably electrically connected to the one of the source and the drain of the second transistor when the first potential is applied to the gate, whereas the gate of the transistor is preferably electrically connected to the one of the source and the drain of the third transistor when the second potential is applied to the gate. The transistor, the second transistor, and the third transistor preferably contain indium, an element M, and zinc. The transistor preferably includes a portion; a proportion of the number of indium atoms in the total number of indium atoms, atoms of the element M, and zinc atoms is higher in the portion than in the second transistor and the third transistor.

According to one embodiment of the present invention, a novel semiconductor device can be provided. According to one embodiment of the present invention, a novel memory device can be provided. According to one embodiment of the present invention, a novel electronic component can be provided.

According to one embodiment of the present invention, a method for operating a novel semiconductor device can be provided. According to one embodiment of the present invention, a usage method of a novel semiconductor device can be provided.

According to one embodiment of the present invention, a potential can be held stably. According to one embodiment of the present invention, a negative potential can be generated with high accuracy. According to one embodiment of the present invention, two negative potentials can be compared directly. According to one embodiment of the present invention, a semiconductor device with a high output voltage can be provided. According to one embodiment of the present invention, a highly reliable semiconductor device can be provided. According to one embodiment of the present invention, a semiconductor device can be downsized. According to one embodiment of the present invention, power consumption of a semiconductor device can be reduced. According to one embodiment of the present invention, a semiconductor device that operates with a single power source can be provided.

One embodiment of the present invention does not necessarily have all the effects listed above. Note that the descriptions of a plurality of effects do not preclude the existence of other effects. In one embodiment of the present invention, an object other than the above objects, an effect other than the above effects, and a novel feature will be apparent from the description of the specification and the drawings of this embodiment.

BRIEF DESCRIPTION OF THE DRAWINGS

FIG. 8 is a timing chart showing an operation example of a semiconductor device.

DETAILED DESCRIPTION OF THE INVENTION

Figure 1A:
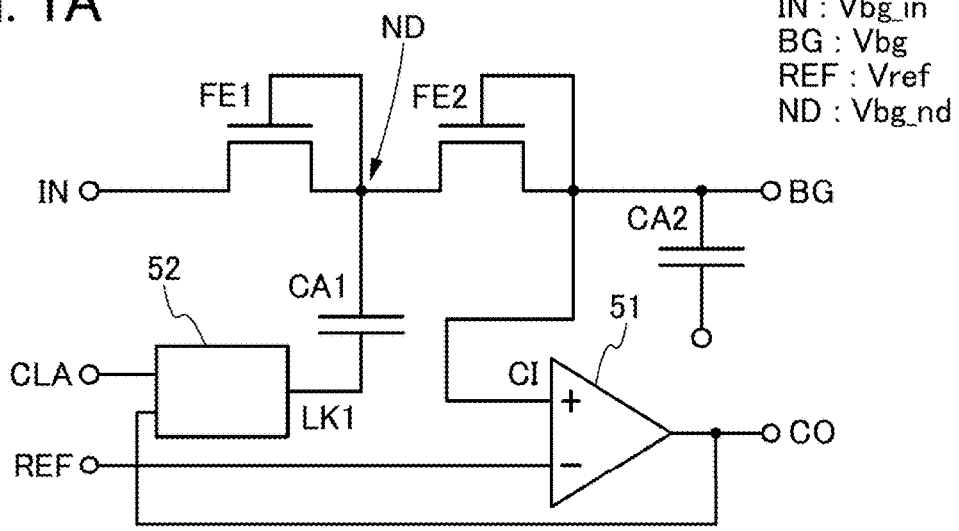
FIGS. 1A and 1B each illustrate a configuration example of a holding circuit.

An embodiment of the present invention will hereinafter be described. Note that any of the embodiments described in this specification can be combined as appropriate. In addition, in the case where a plurality of structure examples (including operation examples and manufacturing method examples) are given in one embodiment, any of the structure examples can be combined as appropriate. Furthermore, the present invention can be implemented in various different modes, and it is easily understood by those skilled in the art that modes and details of the present invention can be changed in various ways without departing from the spirit and scope of the present invention. Thus, the present invention should not be interpreted as being limited to the following description of the embodiments.

In the drawings, the size, the layer thickness, the region, or the like is exaggerated for clarity in some cases. Therefore, the size, the layer thickness, the region, or the like is not limited to the illustrated scale. Drawings are schematic views of ideal examples, and the embodiments of the present invention are not limited to the shape or the value illustrated in the drawings. For example, the following can be included: variation in signal, voltage, or current due to noise or difference in timing.

In this specification, terms for describing arrangement, such as "over," "above," "under," and "below," are used for convenience in describing a positional relationship between components with reference to drawings in some cases. Furthermore, the positional relationship between components is changed as appropriate depending on a direction in which each component is described. Thus, there is no limitation on terms used in this specification, and description can be made appropriately depending on the situation.

The positional relations of circuit blocks illustrated in a block diagram are specified for description; therefore, the positions of circuit blocks of one embodiment of the present invention are not limited thereto. Even when a diagram illustrates that different functions are achieved by different circuit blocks in a block diagram, one circuit block may be actually configured to achieve different functions. Functions of circuit blocks in a diagram are specified for description, and even when a diagram shows one circuit block performing given processing, a plurality of circuit blocks may be actually provided to perform the processing.

In this specification and the like, a transistor in which an oxide semiconductor is used for a semiconductor layer where a channel is formed is also referred to as an "OS transistor." In this specification and the like, a transistor in which silicon is used for a semiconductor layer where a channel is formed is also referred to as a "Si transistor." In this specification and the like, a transistor in which silicon having crystallinity is used for a semiconductor layer where a channel is formed is also referred to as a "crystalline Si transistor." The crystalline Si transistor tends to obtain relatively high mobility as compared to the OS transistor. On the other hand, the crystalline Si transistor has difficulty in obtaining an extremely low off-state current unlike the OS transistor. Thus, it is important that the semiconductor material used for the semiconductor layer be selected depending on the purpose and the usage. For example, depending on the purpose and the usage, the OS transistor and the crystalline Si transistor may be used in combination.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are semiconductor devices. Moreover, a storage device, a display device, a light-emitting device, a lighting device, an electronic device, and the like themselves might be semiconductor devices, or might each include a semiconductor device.

In this specification and the like, a ground potential is regarded as 0 V, and a potential higher than the ground potential is regarded as a positive potential and a potential lower than the ground potential is regarded as a negative potential.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer).

Note that a transistor includes three terminals: a gate, a source, and a drain. A gate is a node that controls the conduction state of a transistor. Depending on the channel type of the transistor or levels of potentials applied to the terminals, one of two input/output nodes functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

Note that voltage refers to a potential difference between a given potential and a reference potential (e.g., a ground potential or a source potential) in many cases. Voltage can be referred to as a potential. Note that a potential has a relative value. Accordingly, a ground potential does not necessarily mean 0 V.

In this specification and the like, the terms "film" and "layer" can be interchanged with each other depending on the case or circumstances. For example, in some cases, the term "conductive layer" can be changed into the term "conductive film," and the term "insulating film" can be changed into the term "insulating layer."

In this specification and the like, ordinal numbers such as "first," "second," and "third" are used to avoid confusion among components, and thus do not limit the number of components or do not limit the order.

(Embodiment 1)

In this embodiment, a semiconductor device of one embodiment of the present invention will be described.

A transistor in which an oxide semiconductor is used for a semiconductor layer where a channel is formed (hereinafter, an OS transistor) has an extremely low off-state current. Thus, the transistor has a low leakage current when being off and is excellent in holding charges.

The semiconductor device of one embodiment of the present invention has a function of holding charges using the OS transistor and supplying a potential stably. The semiconductor device of one embodiment of the present invention can supply a potential stably to a semiconductor element included in a memory device, a CPU, or the like. Note that the semiconductor element is, for example, a transistor, a diode, or a capacitor.

In the case of supplying a potential from the semiconductor device to the semiconductor element, the potential is gradually changed by the leakage current of the semiconductor element or the like, in some cases. The semiconductor device of one embodiment of the present invention can measure a change in a potential that is supplied to the semiconductor element using a comparator and can make the potential have the value before the change.

<Example of Voltage Holding Circuit>

Figure 2A:
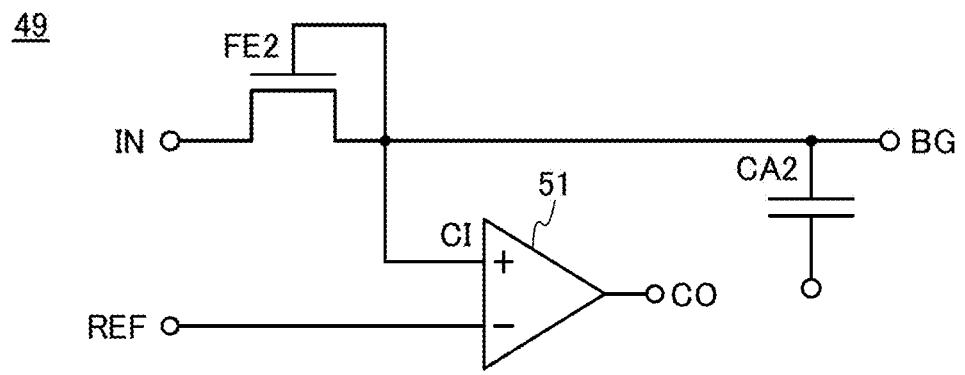
FIGS. 2A and 2B are circuit diagrams each illustrating a configuration example of a holding circuit.

A holding circuit 49 illustrated in FIG. 2A includes a comparator 51, a terminal IN, a terminal BG, an input terminal REF, a transistor FE2, and a capacitor CA2. The holding circuit 49 is a voltage holding circuit that can supply a potential. The holding circuit 49 measures a change in a potential output from the terminal BG using the comparator 51 and supplies a potential through the terminal IN when there is a potential change.

A holding circuit 50 illustrated in FIG. 1A has a structure in which a transistor FE1, a capacitor CA1, a logic circuit 52, and the like are added to the holding circuit 49 illustrated in FIG. 2A. In the holding circuit 50, when a clock signal is applied from the logic circuit 52 to one electrode of the capacitor CA1, the potential of the other electrode of the capacitor CA1 can be changed and the potential of the terminal BG can be adjusted, for example.

The holding circuit 50 illustrated in FIG. 1A includes the comparator 51, the logic circuit 52, the terminal IN, the terminal BG, the input terminal REF, an input terminal CLA, the transistor FE1, the transistor FE2, the capacitor CA1, and the capacitor CA2. The holding circuit 50 is a voltage holding circuit that can supply a potential.

The comparator 51 includes an input terminal CI, a second input terminal, and an output terminal CO. The second input terminal is electrically connected to the input terminal REF. Note that the comparator is called a comparator circuit in some cases. The input terminal CI and the second input terminal correspond to a non-inverting input terminal and an inverting input terminal, for example.

The comparator 51 outputs a potential corresponding to the comparison result between a potential applied to the input terminal CI (hereinafter, Vbg) and a potential applied to the input terminal REF (hereinafter, Vref) through the output terminal CO. Through the output terminal CO, for example, a high potential (hereinafter, $V_CH$) is output when Vbg is higher than Vref and a low potential is output when Vbg is lower than or equal to Vref In an example of a timing chart in FIG. 8, which will be described later, a ground potential (hereinafter, GND) is output as a low potential through the output terminal CO.

The potential of the input terminal CLA and the potential of the output terminal CO of the comparator 51 are applied to the logic circuit 52. The logic circuit 52 outputs the potential of the input terminal CLA through an output terminal LK1 when a high potential is applied from the output terminal CO.

Here, one of a source and a drain of the transistor FE1 is called a node ND. A first gate of the transistor FE1 and the other electrode of the capacitor CA1 are electrically connected to the node ND. The other of the source and the drain of the transistor FE1 is electrically connected to the terminal IN. One electrode of the capacitor CA1 is electrically connected to the output terminal LK1 of the logic circuit 52. The transistor FE1 functions as a diode. Although the transistor FE1 is diode-connected in the holding circuit 50 illustrated in FIG. 1A, another semiconductor element functioning as a diode can be used instead.

Note that the parasitic capacitance of the transistor FE1 or a parasitic capacitance between the transistor FE1 and a wiring can be used as the capacitor CA1, for example.

One of a source and a drain of the transistor FE2 is electrically connected to one electrode of the capacitor CA2, the terminal CI, and the terminal BG. Furthermore, GND is applied to the other electrode of the capacitor CA2, for example. The other of the source and the drain of the transistor FE2 is electrically connected to the node ND.

A first gate of the transistor FE2 is preferably connected to one of the source and the drain of the transistor FE2.

When an OS transistor is used as the transistor FE2, a holding circuit that is excellent in holding charges can be fabricated.

An OS transistor has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

When an OS transistor is used as the transistor FE1 and the transistor FE2, the absolute value of voltage supplied from the holding circuit can be increased. In other words, a negative potential with a large absolute value can be supplied. Moreover, a highly reliable holding circuit can be fabricated.

Figure 1B:
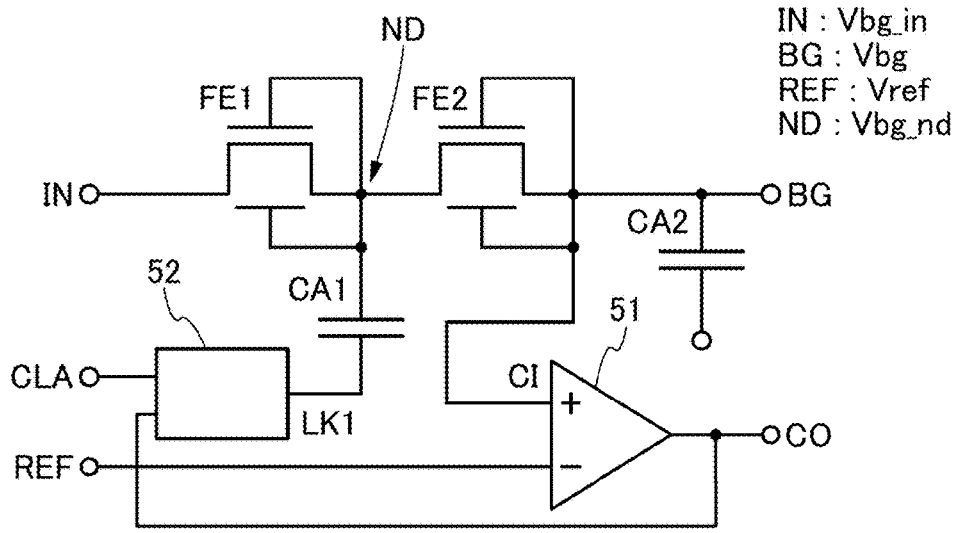

As illustrated in FIG. 1B, the transistor FE1 and the transistor FE2 may include each a second gate (hereinafter, referred to as a back gate). The back gate of the transistor FE1 is preferably connected to one of the source and the drain of the transistor FE1. The back gate of the transistor FE2 is preferably connected to one of the source and the drain of the transistor FE2. In some cases, a first gate is called a front gate.

Figure 2B:
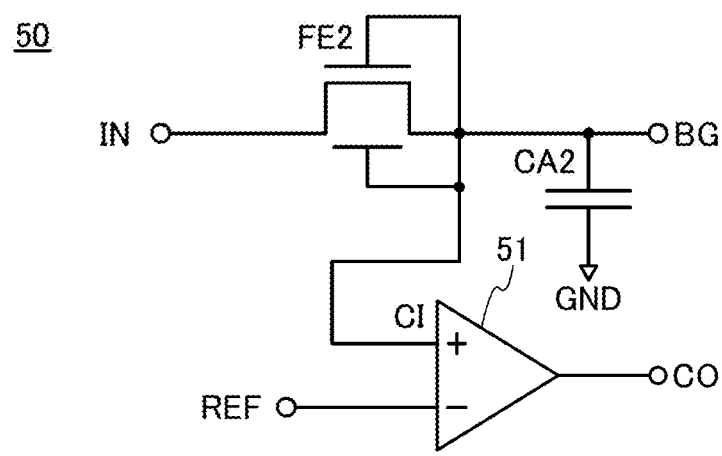

FIG. 2B illustrates an example in which the transistor FE2 in FIG. 2A includes a back gate.
<Back Gate>

In a transistor, a back gate and a front gate may be electrically connected to each other and supplied with the same potential. Alternatively, a potential applied to the back gate may be different from a potential applied to the front gate. A potential application to the back gate can shift the threshold value of the transistor. For example, when a negative constant potential is applied to a back gate of an n-channel transistor, the threshold value of the transistor shifts in the positive direction, in some cases. Furthermore, a potential application to the back gate can improve current drive capability. When the gate and the back gate are formed using conductive layers, the transistor has a function of preventing an electric field generated outside the transistor from influencing a semiconductor layer in which a channel is formed (in particular, an electric field blocking function against static electricity and the like). When the back gate is formed larger than the semiconductor layer to cover the semiconductor layer in the plan view, the electric field blocking function can be enhanced.

An OS transistor has an extremely low off-state current. In an n-channel OS transistor, a threshold value can shift in the positive direction when a negative potential is applied to its back gate. The shift of the threshold value in the positive direction can reduce a cutoff current (e.g., a current obtained when a front gate and a source have the same potential).

With the holding circuit of one embodiment of the present invention, a negative potential can be supplied to the back gate of the OS transistor included in the semiconductor device stably, which enables the OS transistor to have an extremely low off-state current.

Note that each of the transistors FE1 and FE2 is preferably an n-channel OS transistor. The threshold value of each of the transistors FE1 and FE2 is preferably high enough to obtain a sufficiently low cutoff current. The threshold value is, for example, higher than or equal to 0.5 V and lower than or equal to 6 V, or higher than or equal to 1 V and lower than or equal to 4 V.

Figure 3A:
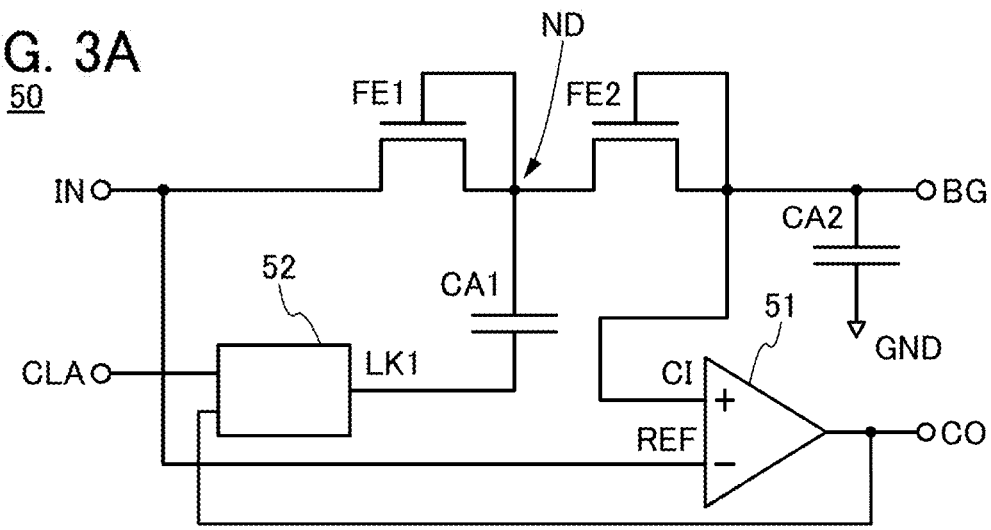
FIGS. 3A and 3B are circuit diagrams each illustrating a configuration example of a holding circuit.

FIG. 3A illustrates a configuration example of the holding circuit 50 in FIG. 1A in which the same potential is applied to the terminal REF and the terminal IN.

Figure 3B:
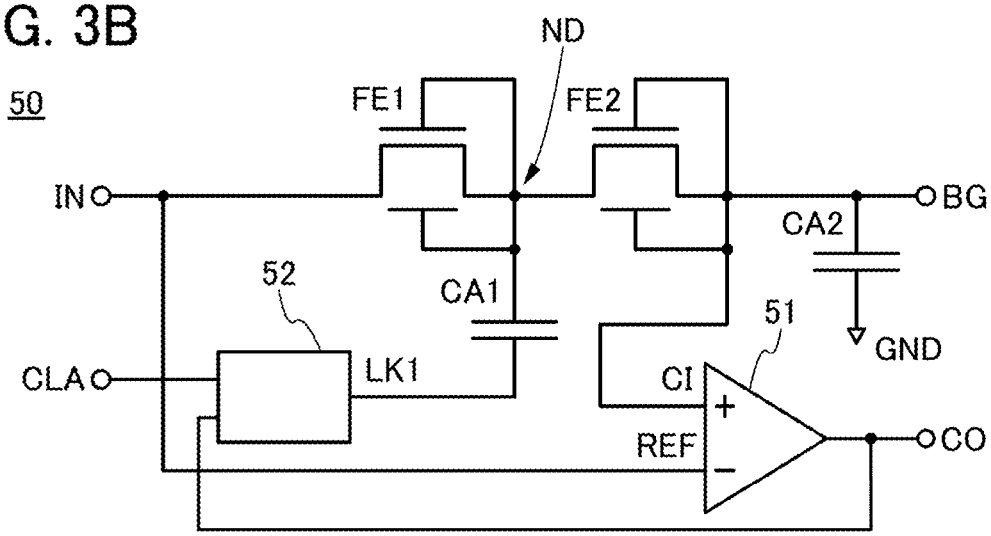

FIG. 3B illustrates a configuration example in which each of the transistors FE1 and FE2 in FIG. 3A has a back gate.

The capacitance of the capacitor CA2 is preferably larger than that of the capacitor CA1. For example, the capacitance of the capacitor CA2 is three times, five times, or ten times as large as the capacitance of the capacitor CA1. Alternatively, the parasitic capacitance of the transistor FE1 or a parasitic capacitance between the transistor FE1 and a wiring can be used as the capacitor CA1, for example.

When an OS transistor is used as the transistor FE2, a holding circuit that is excellent in holding charges can be fabricated. In each of the holding circuits 50 illustrated in FIGS. 3A and 3B, the transistor FE2 has an extremely low off-state current; thus, a potential can be supplied stably. Furthermore, an OS transistor has a high withstand voltage between its source and drain. Thus, the absolute value of the output voltage of the holding circuit 50 can be increased.

Owing to the high withstand voltage between the source and the drain, a highly reliable transistor can be provided. Accordingly, a highly reliable semiconductor device or the like can be provided.

The holding circuit 50 includes the transistor FE1, whereby a potential applied to the terminal IN can be changed. In other words, a potential can be adjusted in the holding circuit 50. The potential adjustment is controlled by a signal supplied from the terminal LK1 of the logic circuit 52. Since a potential can be adjusted in the holding circuit 50, the circuit design flexibility is enhanced.

In the case of using a plurality of the holding circuits 50 as in an example described later, variation of a potential output from each of the holding circuits 50 can be suppressed using the potential adjustment function, even when the characteristics of transistors, capacitors, and the like included in each of the holding circuits 50 are varied.

The number of terminals can be smaller in the holding circuit 50 illustrated in FIG. 3B than in the holding circuit 50 illustrated in FIG. 2B. Furthermore, the number of wirings can possibly be reduced. In the case where a voltage generation circuit is necessary for each terminal, the number of the circuits can possibly be reduced as the number of terminals is reduced.

Note that each of the transistors FE1 and FE2 is preferably an n-channel OS transistor. Furthermore, each of the transistors FE1 and FE2 preferably has a low cutoff current (e.g., a current obtained when a front gate and a source have the same potential); thus, the threshold value of each of the transistors FE1 and FE2 is preferably high enough to obtain a sufficiently low cutoff current. The threshold value is, for example, higher than or equal to 0.5 V and lower than or equal to 6 V, or higher than or equal to 1 V and lower than or equal to 4 V.

Figure 5:
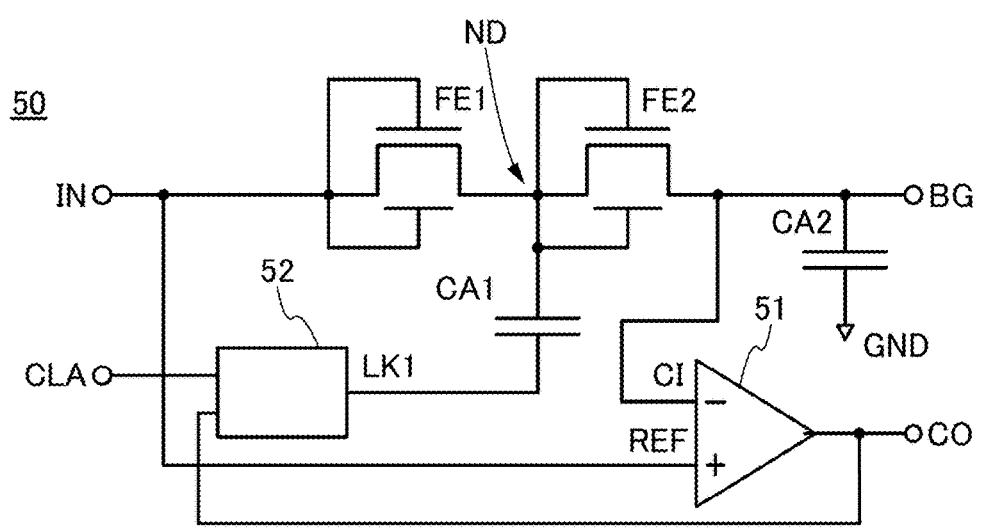
FIG. 5 illustrates a configuration example of a holding circuit.

FIGS. 1A and 1B and other drawings each illustrate the holding circuit 50 as an example of a negative voltage holding circuit; however, the holding circuit 50 can be a positive voltage holding circuit when the direction of the diode-connection of the transistor is reversed. In the case where the gate of the transistor FE1 is connected not to the node ND but to the terminal IN as illustrated in FIG. 5, positive voltage can be generated using the capacitor CA1 and the transistor FE1. Accordingly, the holding circuit 50 can be a positive voltage holding circuit.

Figure 4A:
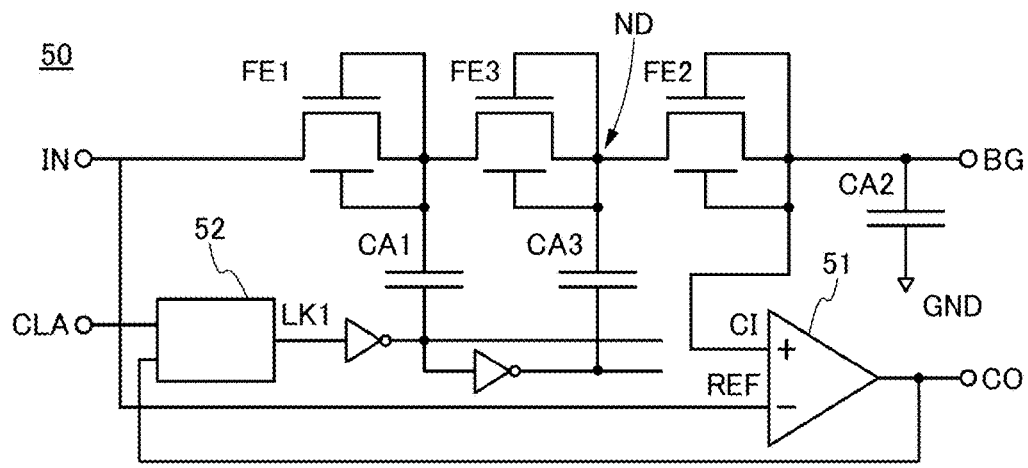
FIGS. 4A and 4B are circuit diagrams each illustrating a configuration example of a holding circuit.

The holding circuit 50 illustrated in FIG. 4A is different from that illustrated in FIG. 3B in that a transistor FE3 and a capacitor CA3 are provided between the transistor FE1 and the transistor FE2.

One of a source and a drain of the transistor FE3 is electrically connected to the node ND, and the other is electrically connected to one of the source and the drain of the transistor FE1. One electrode of the capacitor CA3 is electrically connected to one of the source and the drain of the transistor FE3. One electrode of the capacitor CA1 is electrically connected to the terminal LK1 through an inverter. The other electrode of the capacitor CA3 is electrically connected to the terminal LK1 through two inverters.

Figure 4B:
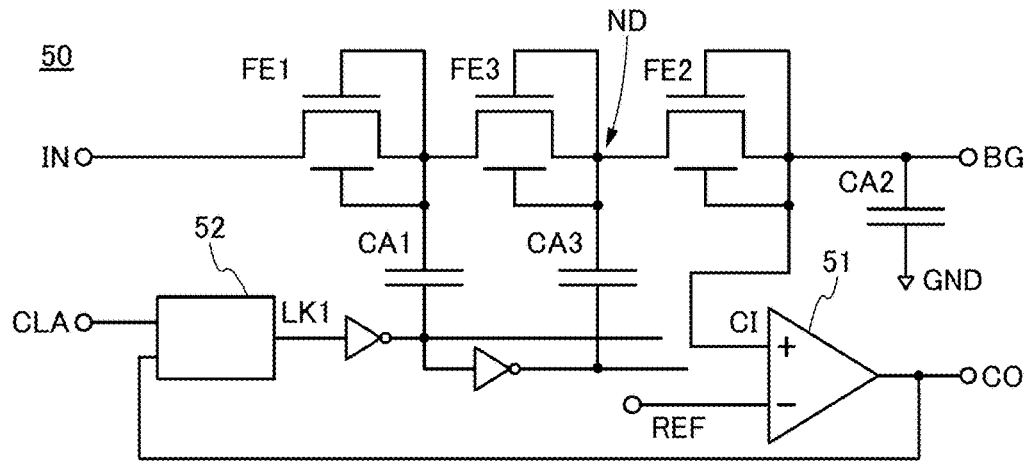

FIG. 4B is different from FIG. 4A in that the terminal IN is not electrically connected to the terminal REF; that is, a signal is input independently to each of the terminals.

<Example of Semiconductor Device>

Figure 6A:
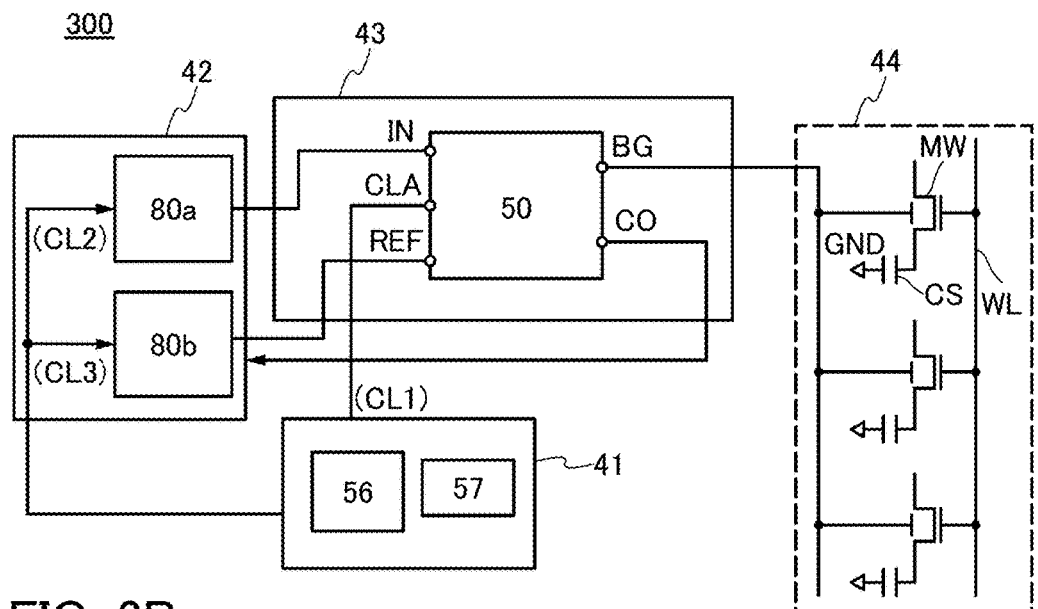
FIGS. 6A and 6B are block diagrams each illustrating a configuration example of a semiconductor device.

A semiconductor device 300 illustrated in FIG. 6A includes a control portion 41, a voltage generation portion 42, a voltage holding portion 43, and a cell array 44. The cell array 44 serves as part of a memory device, a CPU, or an imaging device, for example.

The voltage generation portion 42 includes a charge pump 80a and a charge pump 80b.

The control portion 41 includes a logic circuit 56 and a clock generation circuit 57. The clock generation circuit 57 can generate clock signals such as a signal CL1, a signal CL2, and a signal CL3.

The control portion 41 supplies the signal CL2 to the charge pump 80a and the signal CL3 to the charge pump 80b. The control portion 41 also supplies the signal CL1 to the logic circuit 52.

Figure 7A:
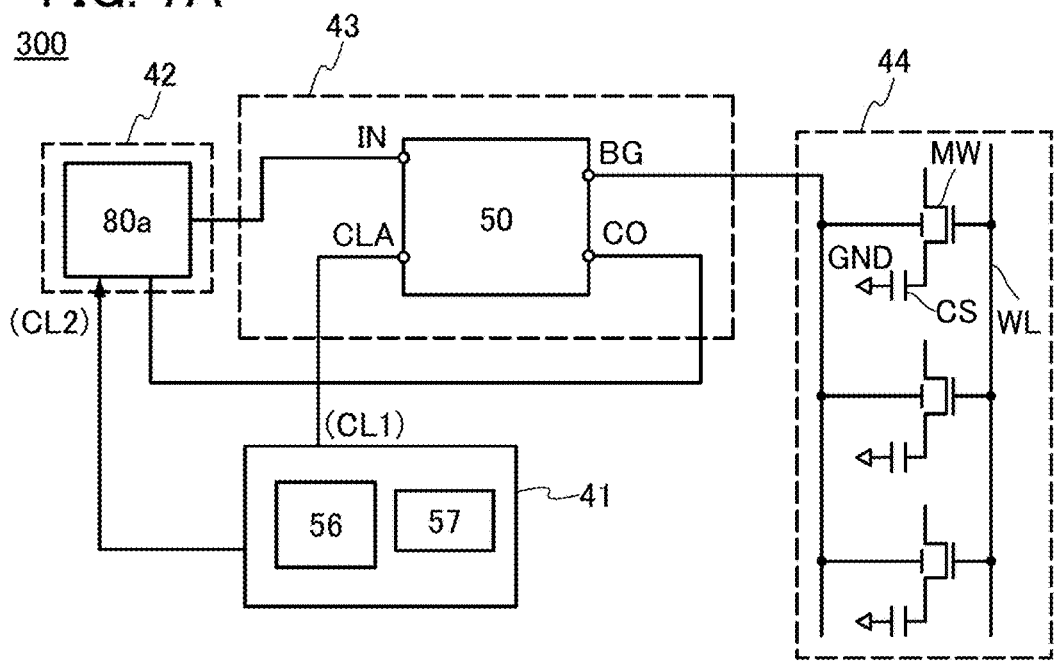
FIGS. 7A and 7B are block diagrams each illustrating a configuration example of a semiconductor device.

FIG. 7A illustrates a configuration example of the semiconductor device 300 in which the terminal IN is used as a common terminal, for example, to eliminate the terminal REF of the holding circuit 50 in FIG. 6A, and the charge pump 80b is eliminated. It is preferable to use any of the holding circuits 50 illustrated in FIGS. 1A and 1B, FIGS. 3A and 3B, FIGS. 4A and 4B, FIG. 5, and other drawings as the holding circuit 50 illustrated in FIG. 7A, for example.

Figure 7B:
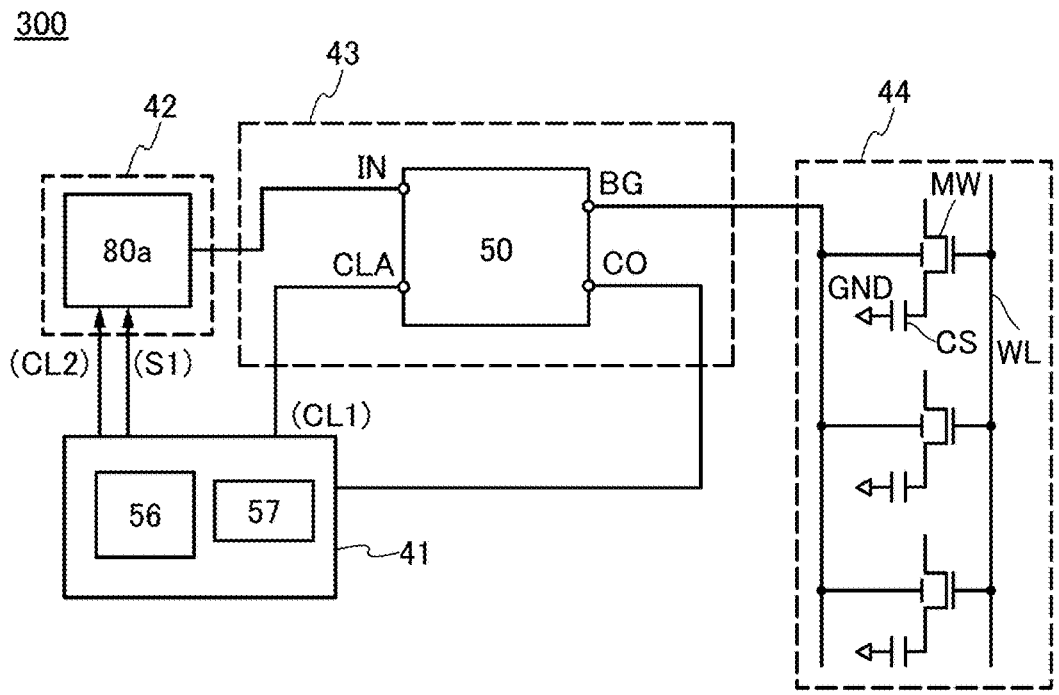

The voltage holding portion 43 includes the holding circuit 50. The terminal CO of the comparator included in the holding circuit 50 is electrically connected to the charge pump 80a. Alternatively, a signal output from the terminal CO may be input to the control portion 41, and a signal (signal 51 in the drawing) may be applied to the charge pump 80a through the control portion 41, as illustrated in FIG. 7B. In each of FIGS. 7A and 7B, the terminal IN included in the holding circuit 50 functions as an input terminal of the voltage holding portion 43, and the terminal BG functions as an output terminal of the voltage holding portion 43.

The control portion 41 supplies the signal CL1 to the terminal CLA of the logic circuit 52 in the holding circuit 50 included in the voltage holding portion 43.

Note that each of the transistors FE1 and FE2 included in the voltage holding portion 43 has a high withstand voltage. Furthermore, the voltage holding portion 43 can reduce voltage using the holding circuit 50. Thus, the semiconductor device 300 can generate voltage whose absolute value is larger than the absolute value of the withstand voltage of the voltage generation portion 42.

The cell array 44 preferably includes at least one OS transistor having a back gate. A potential output from the holding circuit 50 included in the voltage holding portion 43 is applied to the back gate. In each of FIGS. 7A and 7B, the cell array 44 includes a transistor MW, a capacitor CS, and a wiring WL. The transistor MW is an OS transistor having a back gate. A front gate of the transistor MW is electrically connected to the wiring WL. One of a source and a drain of the transistor MW is electrically connected to one electrode of the capacitor CS. The other electrode of the capacitor CS is supplied with GND, for example. The terminal BG of the holding circuit 50 included in the voltage holding portion 43 is electrically connected to the transistor MW.

Note that the terminal BG of the holding circuit 50 included in the voltage holding portion 43 and the transistor MW may be electrically connected to each other with a buffer circuit or the like provided therebetween.

<Operation Example of Semiconductor Device>

FIG. 8 is a timing chart showing an operation example of the semiconductor device 300 illustrated in FIG. 7B.

(Time t0)

The operation of the semiconductor device 300 at Time t0 is described. From the holding circuit 50 included in the voltage holding portion 43, a potential corresponding to the comparison result between Vbg and Vref is output through the terminal CO. The potential of the terminal CO is applied to the logic circuit 52. FIG. 8 shows an example in which Vbg is higher than Vref in the holding circuit 50, so that $V_CH$ is output from the terminal CO to the logic circuit 52.

Moreover, $V_CH$ is applied to the control portion 41 from the terminal CO of the holding circuit 50. When the potential of the terminal CO is $V_CH$, the signal CL1 is applied from the control portion 41 to the logic circuit 52 in the holding circuit 50.

When $V_CH$ is applied to the control portion 41, the signal CL2 is applied from the control portion 41 to the voltage generation portion 42, and the charge pump 80a is brought into an operation state. In a period from Time t0 to Time t1, a potential applied to the terminal IN (hereinafter, Vbg_in) is gradually increased or reduced (in the example in FIG. 8, the potential is reduced in each clock) in response to the operation of the charge pump 80a. In the case of using any of the holding circuits 50 illustrated in FIGS. 3A and 3B, FIG. 4A, FIG. 5, and FIGS. 7A and 7B, Vref and Vbg_in can be supplied from the same charge pump. Thus, the number of charge pumps included in the semiconductor device 300 can be reduced, leading to a reduction in the circuit area. In addition, power consumption can be reduced, in some cases.

Before Time t0, the potential of the terminal LK1 of the logic circuit 52 is kept at a high potential. When $V_CH$ is applied to the logic circuit 52 at Time t0, the logic circuit 52 outputs the signal CL1 through the terminal LK1 to one electrode of the capacitor CA1. The signal CL1 is changed from a high potential to a low potential; thus, the potential of one electrode of the capacitor CA1 is reduced by, for example, $\Delta V_C$. Accordingly, a potential applied to the node ND (hereinafter, Vbg_nd) and the potential of the terminal BG (Vbg) are reduced. When the threshold value of the transistor FE1 is Vt1 and the threshold value of the transistor FE2 is Vt2, Vbg_nd=(Vbg_in+Vt1−$\Delta V_C$) and Vbg=(Vbg_nd+Vt2) are satisfied. Although an example where the holding circuit 50 generates a negative voltage by reducing voltage is described here, the potential of the node ND may be increased by a signal output from the terminal LK1 in the case where the holding circuit 50 generates a positive voltage.

Note that in the semiconductor device 300, the voltage generation portion 42 does not necessarily always operate in synchronization with a signal from the terminal CO. For example, the signal CL2 may be applied from the control portion 41 to start the voltage generation portion 42 at a given time.

(Time t1)

When Vbg becomes lower than Vref in the holding circuit 50 at Time t1, GND is output from the terminal CO, the output of the signal CL1 from the terminal LK1 of the logic circuit 52 is stopped, and a high potential is held. In the control portion 41, the generation of the signal CL1 is stopped. The generation of the signal CL2 can also be stopped to bring the charge pump 80a into a standby state.

At Time t1, Vbg_in is −5 V, Vbg_nd is −8 V, and Vbg is −5 V, for example.

In a period from Time t1 to Time t2, Vbg and Vbg_nd are gradually changed by the leakage current of the cell array 44 or the like.

(Time t2)

At Time t2, Vbg becomes higher than Vref in the holding circuit 50. Then, $V_CH$ is applied from the comparator 51 included in the holding circuit 50 to the control portion 41 and the logic circuit 52 included in the holding circuit.

(Time t3)

After $V_CH$ is applied to the logic circuit 52 at Time t2, the logic circuit 52 supplies a low potential to the node ND through the terminal LK1 at Time t3.

When Vbg becomes lower than or equal to Vref in the holding circuit 50, GND is output from the terminal CO, and a high potential is held at the terminal LK1 of the logic circuit 52. Furthermore, the generation of the signal CL1 in the control portion 41 is stopped.

The cell array 44 may be divided into a plurality of blocks. The cell array 44 illustrated in FIG. 6B includes k blocks 90. The m-th block 90 included in the cell array 44 is referred to as the block 90_m.

Figure 6B:
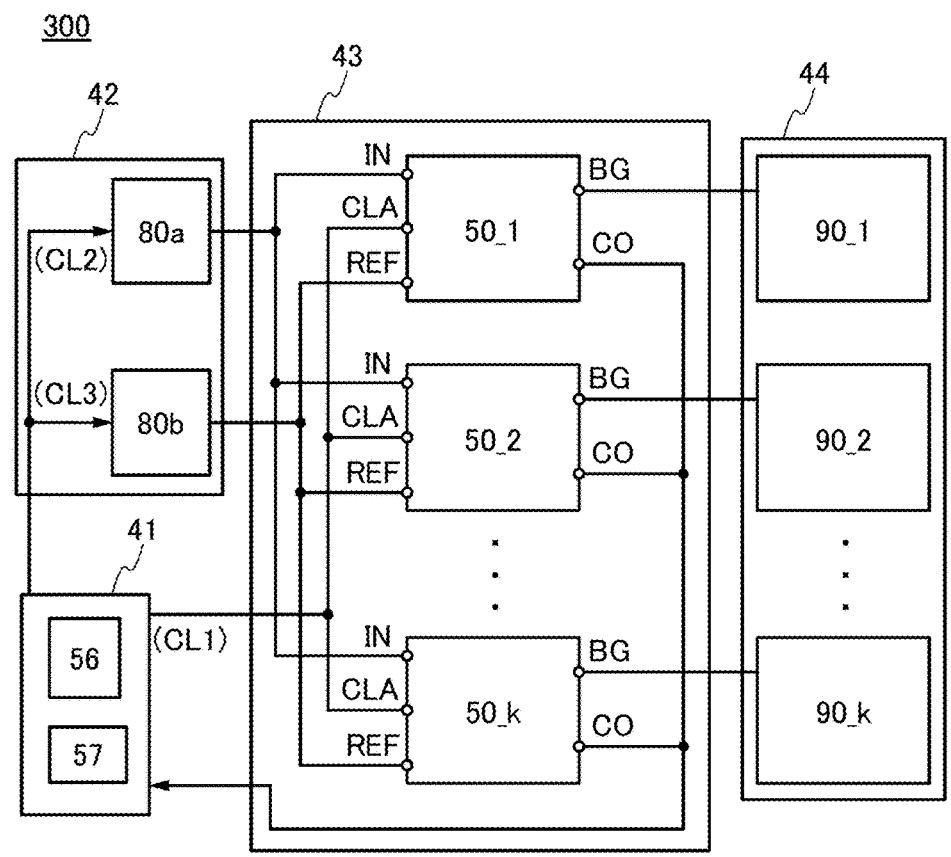

The voltage holding portion 43 preferably includes a plurality of holding circuits 50 whose number corresponds to the number of the blocks 90 included in the cell array 44. The voltage holding portion 43 in FIG. 6B includes k holding circuits 50. The m-th holding circuit 50 included in the voltage holding portion 43 is referred to as the holding circuit 50_m. In FIG. 6B, the control portion 41 supplies the signal CL1 to the logic circuit 52 included in each of the holding circuits 50_1 to 50_k.

Since each of the holding circuits 50_1 to 50_k includes the logic circuit 52, even when transistors in each of the holding circuits 50_1 to 50_k have variations in characteristics such as threshold values, variations in generated potentials between circuits can be reduced by adjusting a potential using the comparator and the logic circuit in each circuit.

Figure 10:
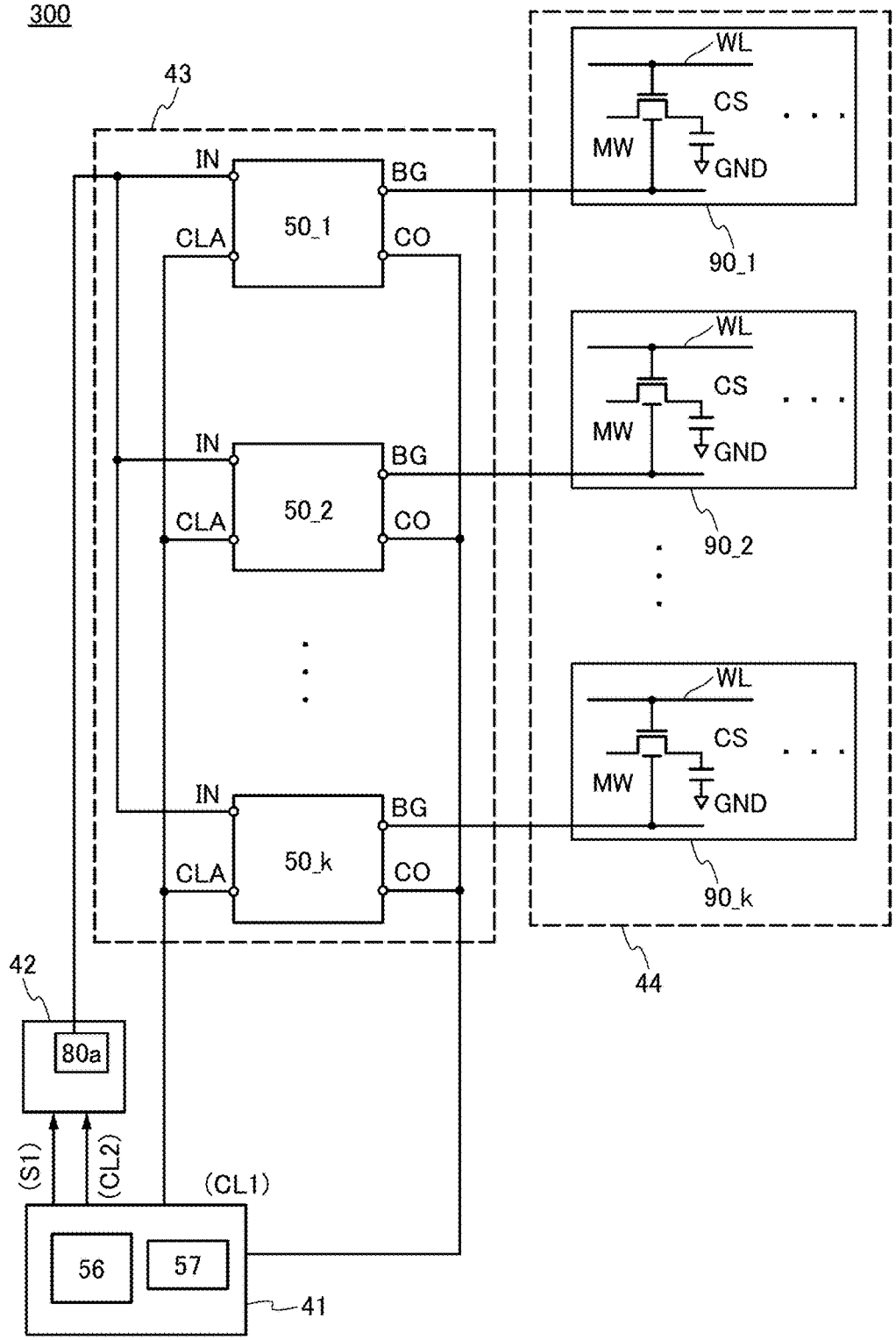
FIG. 10 is a block diagram illustrating a configuration example of a semiconductor device.

Although not illustrated in FIG. 6B, each of the blocks 90 includes the transistor MW, which is an OS transistor having a back gate, as illustrated in FIG. 10 described later.

<Operation Example of Semiconductor Device>

Figure 9:
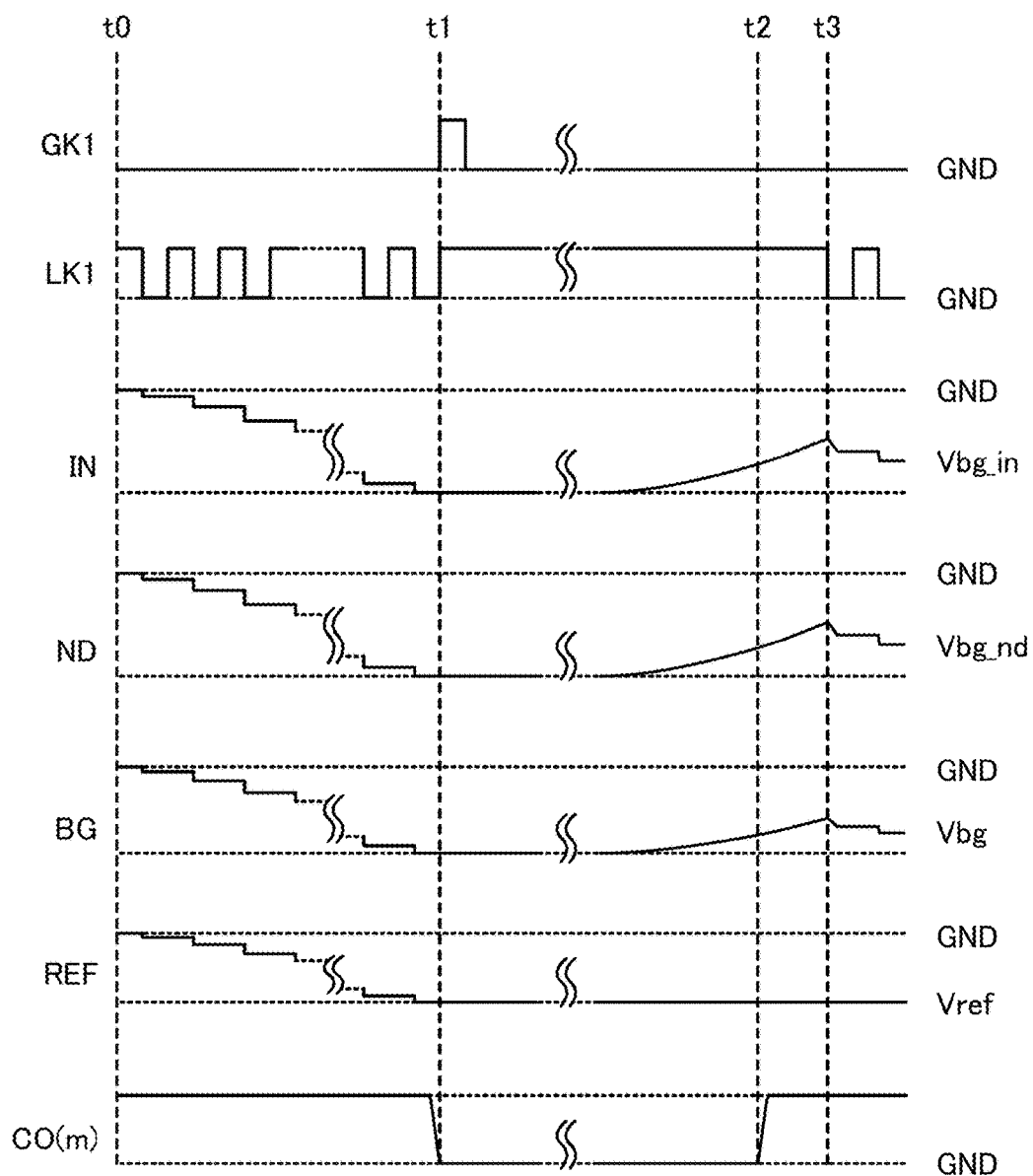
FIG. 9 is a timing chart showing an operation example of a semiconductor device.

FIG. 9 is a timing chart showing an operation example of the semiconductor device 300 illustrated in FIG. 6B.

(Time t0)

The operation of the semiconductor device 300 at Time t0 is described. From the holding circuit 50_m included in the voltage holding portion 43, a potential corresponding to the comparison result between Vbg and Vref is output through the output terminal CO of the comparator 51. The potential of the output terminal CO is applied to the logic circuit 52. FIG. 9 shows an example in which Vbg is higher than Vref in the holding circuit 50_m, so that $V_CH$ is output from the output terminal CO to the logic circuit 52.

Moreover, $V_CH$ is applied to the control portion 41 from the output terminals CO of the holding circuits 50_1 to 50_k. When the potential of the output terminal CO of the holding circuit 50_m is $V_CH$, the signal CL1 is applied from the control portion 41 to the logic circuit 52 in the holding circuit 50_m.

When $V_CH$ is applied to the control portion 41, the signal CL2 and the signal CL3 are applied from the control portion 41 to the voltage generation portion 42, and the charge pumps 80a and 80b are brought into operation states. In the period from Time t0 to Time t1, Vbg_in is gradually increased or reduced (in the example in FIG. 9, the potential is reduced in each clock) in response to the operation of the charge pump 80a. Similarly, Vref is gradually increased or reduced (in the example in FIG. 9, Vref is reduced in each clock) in response to the operation of the charge pump 80b.

Before Time t0, the potentials of the output terminal LK1 of each of the logic circuits 52 is kept at a high potential. When $V_CH$ is applied to the logic circuit 52 at Time t0, the logic circuit 52 outputs the signal CL1 through the output terminal LK1 to one electrode of the capacitor CA1. The signal CL1 is changed from a high potential to a low potential; thus, the potential of one electrode of the capacitor CA1 is reduced by, for example, $\Delta V_C$. Accordingly, a potential applied to the node ND (hereinafter, Vbg_nd) and the potential of the terminal BG (Vbg) are reduced. When the threshold value of the transistor FE1 is Vt1 and the threshold value of the transistor FE2 is Vt2, Vbg_nd=(Vbg_in+Vt1−$\Delta V_C$) and Vbg=(Vbg_nd+Vt2) are satisfied.

Note that in the semiconductor device 300, the voltage generation portion 42 does not necessarily always operate in synchronization with signals from the output terminals CO. For example, the signal CL2 and the signal CL3 may be applied from the control portion 41 to start the voltage generation portion 42 at a given time.

(Time t1)

When Vbg becomes lower than Vref in the holding circuit 50_m at Time t1, GND is output from the output terminal CO, the output of the signal CL1 from the output terminal LK1 of the logic circuit 52 is stopped, and a high potential is held. When GND is output from the output terminals CO of all of the holding circuits 50_1 to 50_k, the generation of the signal CL1 and the signal CL2 in the control portion 41 is stopped. Since the generation of the signal CL2 is stopped, the charge pump 80a is brought into a standby state. At this time, it is possible not to stop the generation of the signal CL3 to keep the charge pump 80b in an operation state, or to stop the generation of the signal CL3 to bring the charge pump 80b into a standby state. Note that Vbg keeps being reduced after the holding circuit 50 outputs a low potential signal (here, GND) until the logic circuit 52 stops the charge pump 80a; thus, a potential difference between Vbg and Vref is further increased, in some cases.

At Time t1, Vref is −2.5 V, Vbg_in is −6 V, Vbg_nd is −6 V, and Vbg is −3 V, for example.

Although the control portion 41 brings the charge pump 80a or the like of the voltage generation portion 42 into a standby state by clock gating from Time t1 to Time t2, the voltage generation portion 42 can be brought into a standby state by power gating, if necessary.

In a period from Time t1 to Time t2, Vbg, Vbg_nd, and Vbg_in are gradually changed by the leakage current of the cell array 44, the charge pump 80a, or the like.

(Time t2)

At Time t2, Vbg becomes higher than Vref in at least one of the holding circuits 50_1 to 50_k. Then, $V_CH$ is applied from the comparator 51 included in the corresponding holding circuit to the control portion 41 and the logic circuit 52 included in the holding circuit. The timing chart in FIG. 9 shows the potential of the terminal CO when Vbg is higher than Vref in the holding circuit 50_m.

(Time t3)

After $V_CH$ is applied to the logic circuit 52 at Time t2, the logic circuit 52 supplies a low potential to the node ND through the output terminal LK1 at Time t3. In addition, at Time t3, the signal CL2 and the signal CL3 are applied from the control portion 41 to the voltage generation portion 42, so that the charge pump 80a and the charge pump 80b return to the operation states from the standby states.

When Vbg becomes lower than or equal to Vref in the holding circuit 50_m, GND is output from the output terminal CO, and a high potential is held at the output terminal LK1 of the logic circuit 52. When GND is output from the output terminals CO of all of the holding circuits 50_1 to 50_k, the generation of the signal CL1 in the control portion 41 is stopped.

FIG. 10 illustrates a configuration example of the semiconductor device 300 in which the terminal IN is used as a common terminal, for example, to eliminate the terminal REF of the holding circuit 50 in FIG. 6B, and the charge pump 80b is eliminated.

The block 90_m includes a plurality of units of cells. It is preferable that one unit include the transistor MW whose gate is connected to the wiring WL and whose back gate is electrically connected to the terminal BG and the capacitor CS electrically connected to one of the source and the drain of the transistor MW, as in the block 90_1 illustrated in FIG. 10, for example.

The voltage generation portion 42 can include a charge pump circuit or the like. The configuration example of the voltage generation portion 42 will be described below.

Figure 13A:
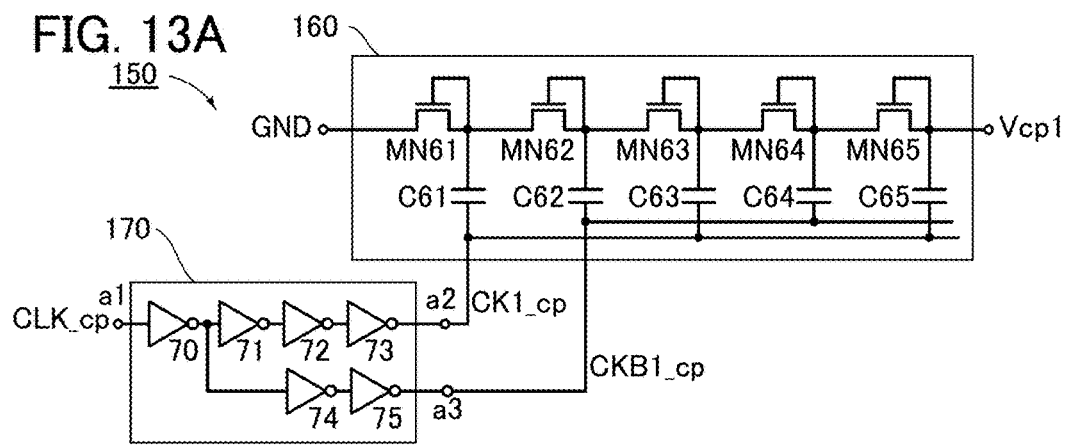
FIGS. 13A to 13E are circuit diagrams illustrating configuration examples of voltage generation circuits.

A negative potential generation circuit 150 illustrated in FIG. 13A includes a charge pump 160 and a clock buffer circuit 170. The negative potential generation circuit 150 and the charge pump 160 can be used as the voltage generation portion 42 and the charge pump 80a, respectively.

(Clock Buffer Circuit)

The clock buffer circuit 170 includes inverters 70 to 75 and terminals a1 to a3. The clock buffer circuit 170 has a function of generating signals CK1_cp and CKB1_cp from a signal CLK_cp. The terminal a1 is an input terminal for the signal CLK_cp, and the terminals a2 and a3 are output terminals for the signals CK1_cp and CKB1_cp, respectively. The signal CLK_cp is a clock signal output from the control portion 41. For example, the control portion 41 divides a reference clock signal and generates the signal CLK_cp. The signals CK1_cp and CKB1_cp are complementary clock signals.

Figure 13B:
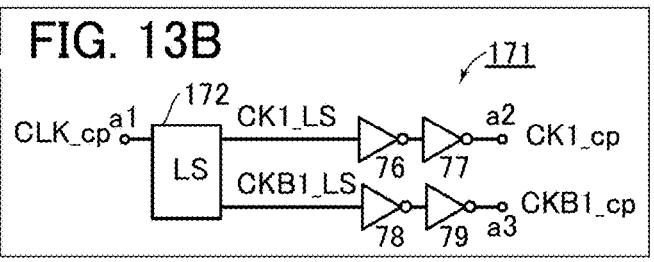

The clock buffer circuit may include a level shifter (LS). FIG. 13B illustrates a configuration example of such a case. A clock buffer circuit 171 illustrated in FIG. 13B includes an LS 172 and inverters 76 to 79. The LS 172 level-shifts the signal CLK_cp to generate signals CK1_LS and CKB1_LS. The signals CK1_cp and CKB1_cp are output from the inverters 77 and 79, respectively.

Although the clock buffer circuit 170 includes six inverters, the number of inverters is not limited to six. The clock buffer circuit 170 includes at least the inverters 70 and 71. The clock buffer circuit 170 can serve as a delay circuit for the signal CLK_cp. The number of inverters can be determined depending on the delay time. For example, the same applies to the clock buffer circuit 171.

(Charge Pump)

The charge pump 160 is a step-down charge pump which lowers the pressure of the potential GND to generate a potential Vcp1. Note that the input potential is not limited to the potential GND. The charge pump 160 includes transistors MN61 to MN65 and capacitors C61 to C65. The number of stages of the charge pump 160 is five but is not limited thereto.

Figure 13C:
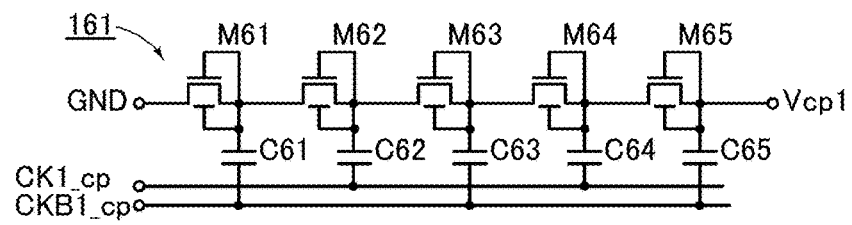
Figure 13D:
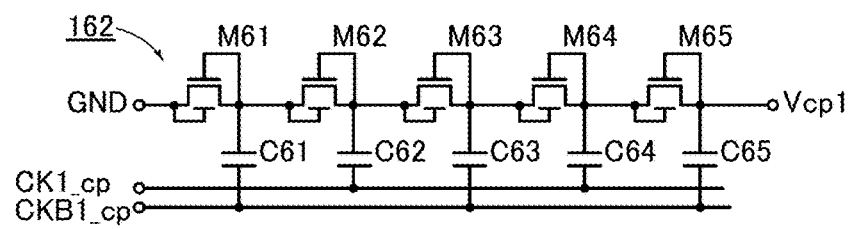
Figure 13E:
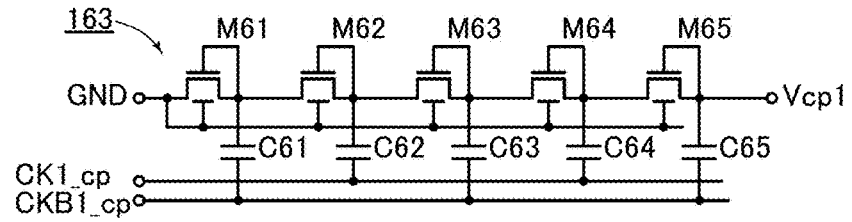

The transistors MN61 to MN65 are diode-connected n-channel Si transistors. Instead of the transistors MN61 to MN65, diode-connected p-channel Si transistors or diode-connected OS transistors may be provided. In the case of using OS transistors, the OS transistors may have back gates. FIGS. 13C to 13E each illustrate a configuration example of such a case. A transistor 100 or a transistor 200 described later can be used as an OS transistor having a back gate.

A charge pump 161 illustrated in FIG. 13C includes transistors M61 to M65 and the capacitors C61 to C65. Charge pumps 162 and 163 illustrated in FIGS. 13D and 13E are modification examples of the charge pump 161. Each of the charge pumps 161, 162, and 163 can be used as the charge pump 80a.

In these examples, a Dickson charge pump is provided in the negative-potential generation portion, but a Cockcroft-Walton charge pump may be provided instead.

An OS transistor has a high withstand voltage between its source and drain. Thus, it is preferable to use an OS transistor for the charge pumps 161, 162, and 163 and the like.

Figure 14A:
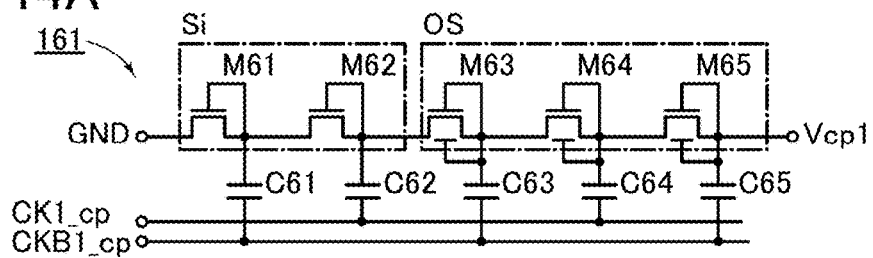
FIGS. 14A to 14E are circuit diagrams each illustrating a configuration example of a voltage generation circuit.

It is possible to use both Si transistors and OS transistors. OS transistors are preferably used as transistors in latter stages in each of which a higher voltage is applied between its source and drain. Each of the OS transistors preferably has a back gate. The charge pumps 161, 162, and 163 illustrated in FIGS. 14A, 14D, and 14E correspond to, for example, the charge pumps 161, 162, and 163 illustrated in FIGS. 13C, 13D, and 13E, respectively, and include Si transistors as the transistors M61 and M62 and OS transistors as the transistors M63 to M65.

A charge (e.g., a fixed charge) in a transistor at the interface between a semiconductor layer and an insulating layer on the back channel side or in the insulating layer in some cases causes variation or fluctuation in threshold value. In other words, the stability of the transistor might be decreased. Owing to the back gate, the transistor can have high reliability, and a charge pump with improved reliability can be obtained. When the same potential is applied to the back gate and a front gate, for example, the current drive capability of the transistor is improved and the charging rate of the capacity included in the charge pump is improved, in some cases.

In the semiconductor device of one embodiment of the present invention, an OS transistor can be stacked over a circuit including a Si transistor as described later, in which case the circuit area seen from the top can be reduced.

Figure 14B:
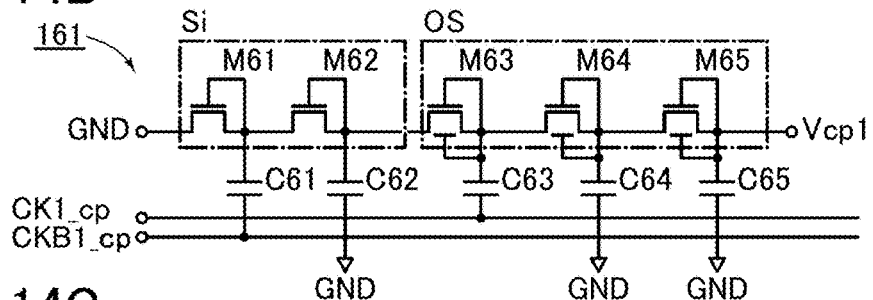

FIG. 14B illustrates an example in which GND is applied to the capacitors C62, C64, and C65.

Figure 14C:
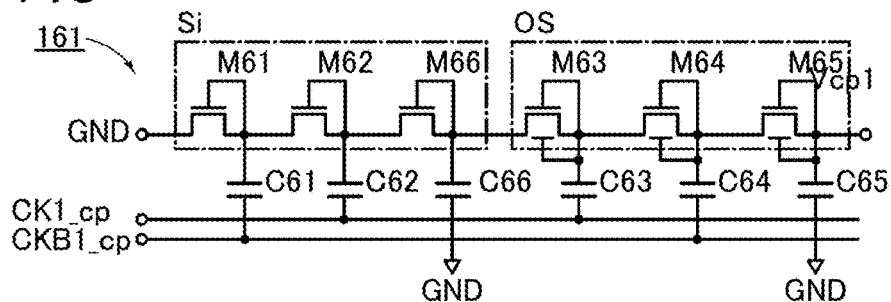
Figure 14D:
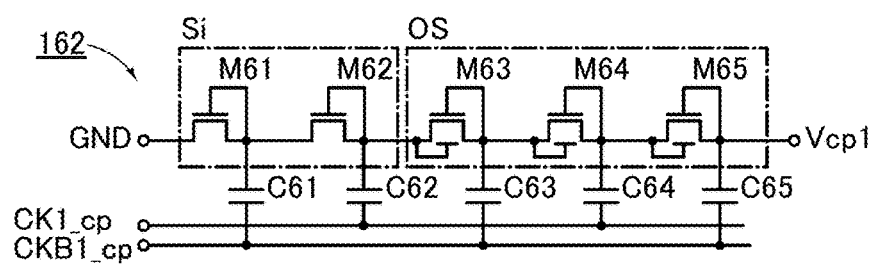
Figure 14E:
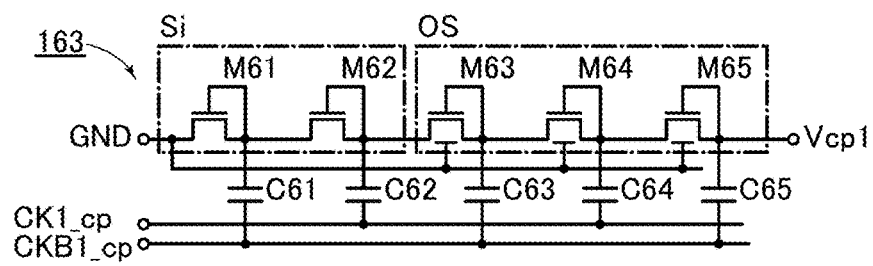

FIG. 14C illustrates an example in which a transistor M66, which is a Si transistor, is provided between the transistors M62 and M63. A source or a drain of the transistor M66 is connected to a capacitor C66. Si transistors in three adjacent stages are connected in series, and in the following three stages, OS transistors are connected in series. The capacitor C66 in the third stage and the capacitor C65 in the sixth stage are supplied with GND.

(Embodiment 2)

In this embodiment, an example of the semiconductor device of one embodiment of the present invention will be described.

<Potential of Back Gate>

The cell array 44 serves as part of a memory device, a CPU, or an imaging device, for example. In the cell array 44, a potential applied to the back gate of the transistor MW can be changed depending on the usage.

Figure 11A:
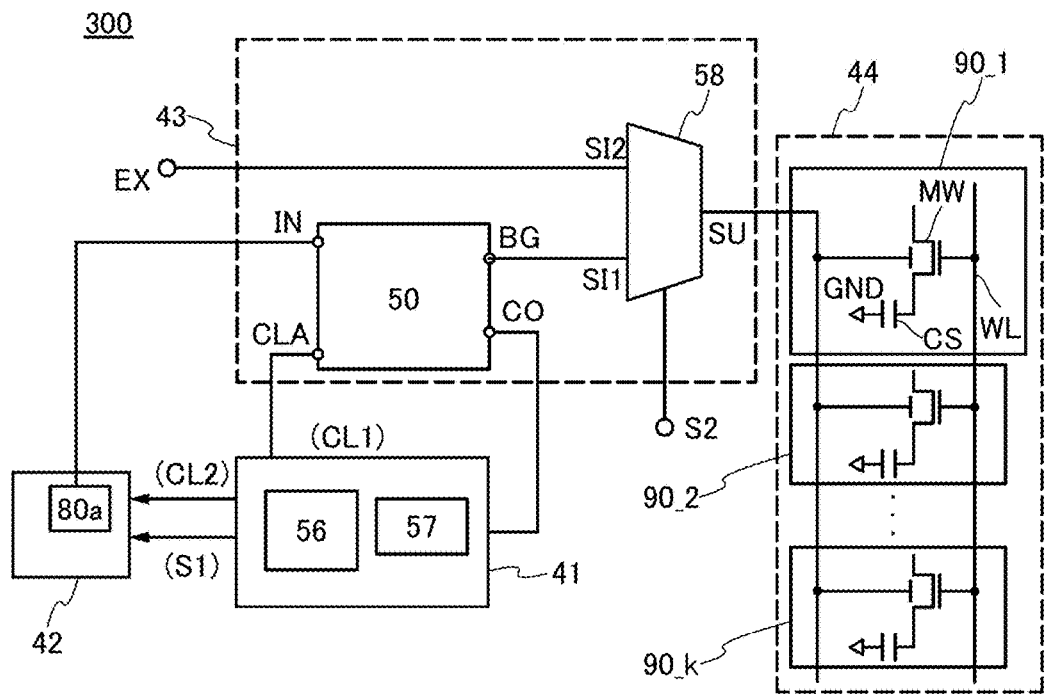
FIGS. 11A and 11B are block diagrams each illustrating a configuration example of a semiconductor device.
Figure 11B:
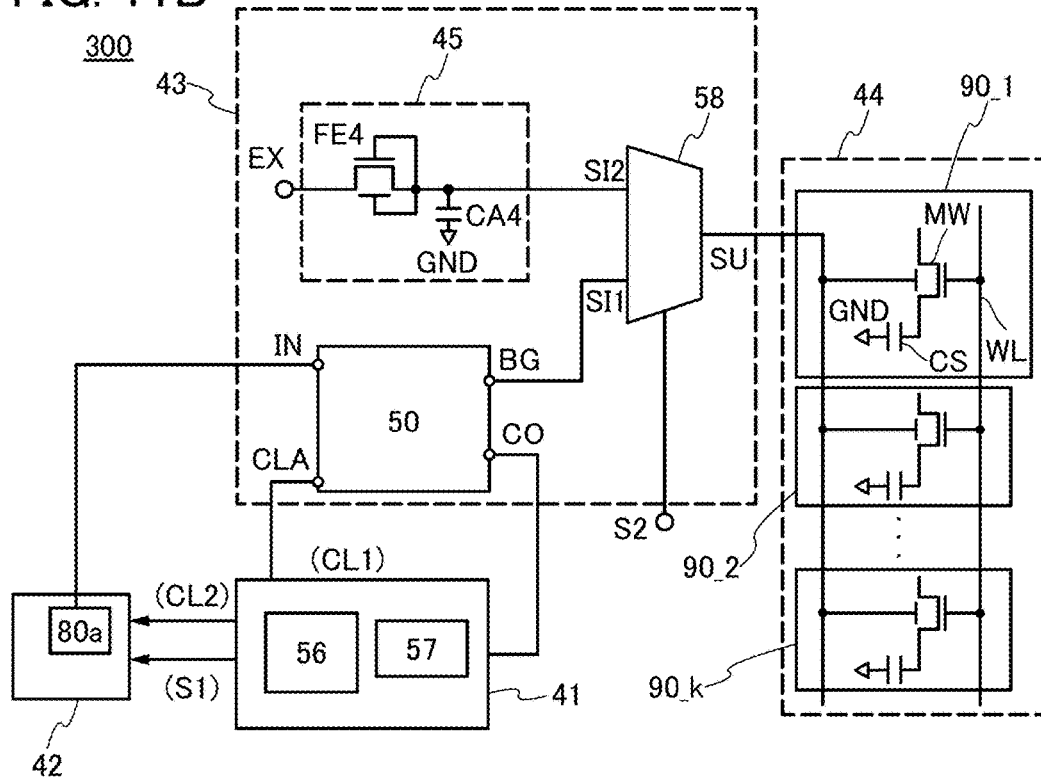

FIGS. 11A and 11B each illustrate an example of a semiconductor device in which a first potential and a second potential are applied to the back gate of the transistor MW. The semiconductor device 300 illustrated in FIG. 11A is an example in which a selector 58 is provided between the holding circuit 50 included in the voltage holding portion 43 and the cell array 44 in FIG. 7B. In FIG. 11A, the voltage holding portion 43 includes the holding circuit 50 and the selector 58.

The selector 58 includes two input terminals (a terminal SI1 and a terminal SI2) and a terminal SU serving as an output terminal. The terminal SI1 is electrically connected to the terminal BG of the holding circuit 50, and the terminal SI2 is electrically connected to a terminal EX. The selector 58 may include three or more input terminals. Potentials from the terminal EX and the terminal BG may each be applied through a buffer circuit.

The terminal SU of the selector 58 is electrically connected to the back gate of the transistor MW. The terminal SU of the selector 58 may be electrically connected to the back gate of the transistor MW through a buffer circuit. A potential is applied from the terminal SU in the voltage holding portion 43 to the back gate of the transistor MW included in the cell array 44.

The semiconductor device 300 illustrated in FIG. 11B is an example in which a potential applied to the terminal EX is input to the terminal SI2 of the selector 58 through a holding circuit 45. The voltage holding portion 43 in FIG. 11B includes the holding circuit 50, the selector 58, and the holding circuit 45. The holding circuit 45 includes a transistor FE4 and a capacitor CA4. One of a source and a drain of the transistor FE4 is electrically connected to a gate of the transistor FE4 and one electrode of the capacitor CA4. The other of the source and the drain of the transistor FE4 is electrically connected to the terminal EX. The other electrode of the capacitor CA4 is supplied with GND, for example. The descriptions of the transistor FE2 and the capacitor CA2 can be referred to for the details of the transistor FE4 and the capacitor CA4, for example.

The holding circuit 50 described in Embodiment 1 can be used as the holding circuit 50 in each of FIGS. 11A and 11B. In each of FIGS. 11A and 11B, the terminal IN functions as the input terminal of the voltage holding portion 43 and the terminal SU functions as the output terminal of the voltage holding portion 43.

In each of the examples illustrated in FIGS. 11A and 11B, the holding circuit 50 and the terminal EX to which a potential is applied from the outside are included so that a potential output from the voltage holding portion 43 can be selected. Alternatively, potentials generated in the voltage generation portion 42 and the voltage holding portion 43 can be changed so that the potential output from the voltage holding portion 43 can be changed, as described later. In that case, the selector 58 and the terminal EX are not necessary.

In each of FIGS. 11A and 11B, for example, the potential output from the voltage holding portion 43 can be switched between two potentials: a potential used for operating the semiconductor device 300 at high speed and a potential used for keeping a certain state for a long time.

The potential of the voltage holding portion 43 is held after being applied to the back gate of the transistor MW, for example. In the process of holding a potential, a charge gradually leaks through a semiconductor element or a wiring included in the voltage holding portion 43 and the cell array 44, which leads to a potential change (a potential increase in the case of a negative potential). For this reason, the potential needs to be applied again to the back gate of the transistor MW after the potential holding for a certain period.

In the case of holding a potential for a longer time, voltage with a larger absolute value is applied. In that case, however, it takes a long time to obtain a desired potential, as described later.

Thus, in the case of operating the semiconductor device 300 at high speed, voltage with a small absolute value is applied so that the operation frequency of the semiconductor device 300 can be improved. In that case, a period until the potential is applied again is shortened. When a negative potential with a small absolute value is applied to a back gate of an n-channel transistor, on-state current can be increased; thus, the operation frequency of a circuit including the transistor can be improved, in some cases.

Accordingly, a potential output from the voltage holding portion 43 can be selected depending on the operation frequency or the like of the semiconductor device 300.

For example, the potential can be selected depending on the operation frequency of a memory device, an MCU, a flip-flop, an imaging device, a programmable circuit, or the like described later in another embodiment. The potential can be selected in response to, for example, the frequency of data rewriting to the memory device.

<Operation Example of Semiconductor Device>

Operation examples of the semiconductor devices 300 illustrated in FIGS. 11A and 11B will be described.

A signal S2 is used to select a potential of which terminal, the terminal SI1 or the terminal SI2, is to be output from the terminal SU, for example. In the case where a high potential signal (High) is input as the signal S2, the potential of the terminal SI1 is selected, whereas in the case where a low potential signal (Low) is input as the signal S2, the potential of the terminal SI2 is selected, for example. A potential output from the selector 58 when the terminal SI1 is selected is referred to as Vs1, and a potential output from the selector 58 when the terminal SI2 is selected is referred to as Vs2. Furthermore, the potential of the terminal SU is referred to as Vsu.

The absolute value of Vs2 is preferably larger than that of Vs1. In that case, Vs2 is lower than Vs1 when Vs1 and Vs2 are negative potentials. In some cases where the absolute value of Vs2 is larger than that of Vs1, it takes a longer time to write the potential to the cell array 44.

In the case where the transistor MW is an n-channel transistor, the threshold value of the transistor MW can shift more in the positive direction when a negative and lower potential is applied to the back gate. The more the threshold value shifts in the positive direction, the lower the cutoff current becomes, for example. On the other hand, the shift of the threshold value in the positive direction might cause a reduction in on-state current. Note that the cutoff current here is drain current when the potential difference between the gate and the source is zero, and the on-state current here is drain current when the potential difference between the gate and the source is larger than the threshold value, for example.

The transistor MW functions as a switch used for accumulating a charge in the capacitor CS or the like. The lower the cutoff current is, the higher the charge holding capability is.

When Vs2 is applied to the back gate of the transistor MW, for example, a charge accumulated in the capacitor CS or the like can be held for a long time as compared with the case of applying Vs1. When Vs1 is applied, in contrast, the on-state current of the transistor MW can be increased more, leading to a shorter writing time of a charge to the capacitor CS or the like.

If the interval between the writing operations of Vs1 and the interval between the writing operations of Vs2 to the back gate of the transistor MW are $\Delta tb1$ and $\Delta tb2$, respectively, $\Delta tb1$ is preferably shorter than $\Delta tb2$.

Here, $\Delta tb1$ is preferably longer than or equal to 50 milliseconds and shorter than 10 days, further preferably longer than or equal to 1 second and shorter than 1 day, and still further preferably longer than or equal to 10 seconds and shorter than 12 hours. Furthermore, $\Delta tb2$ is preferably longer than or equal to 12 hours and shorter than or equal to 20 years, further preferably longer than or equal to 1 day and shorter than or equal to 20 years, and still further preferably longer than or equal to 10 days and shorter than or equal to 10 years.

Figure 12A:
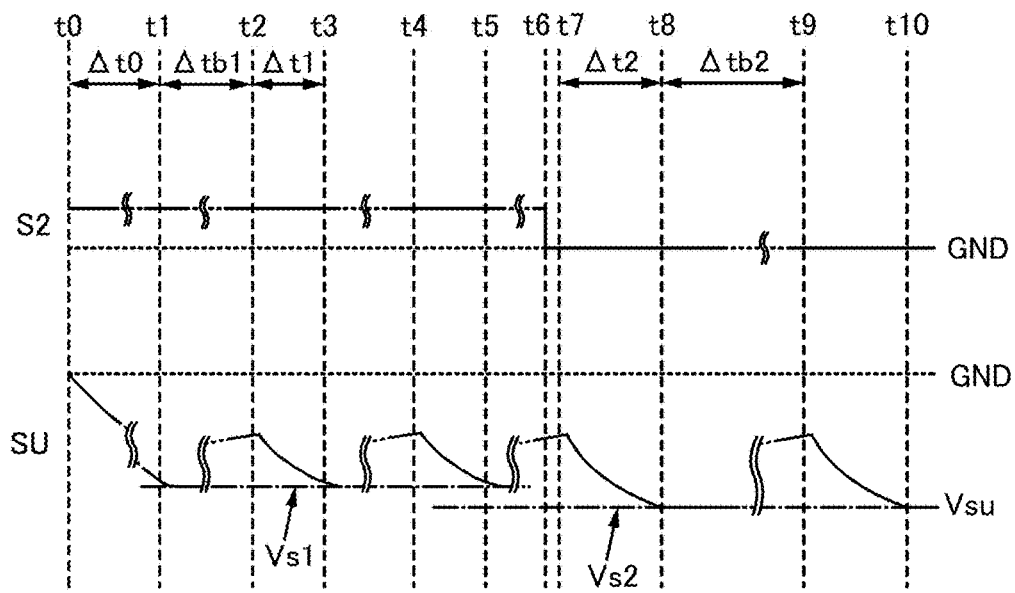
FIGS. 12A and 12B are timing charts each showing an operation example of a semiconductor device.

FIG. 12A is a timing chart showing the operation example of the semiconductor devices 300 illustrated in FIGS. 11A and 11B.

(First Potential)

The signal S2 is High at Time t0, and a potential output from the voltage holding portion 43 is reduced so that Vsu reaches Vs1 at Time t1. Here, a period from Time t0 to Time t1 is referred to as $\Delta t0$.

A period from Time t1 to Time t2 is a holding period. In the holding period, Vsu is increased because of the leakage through an element included in the cell array 44, the voltage holding portion 43, or the like. After $\Delta tb1$ (Time t2), Vs1 is written again as Vsu and the writing terminates at Time t3. Here, a period from Time t2 to Time t3 is referred to as $\Delta t1$.

A period from Time t3 to Time t4 is a holding period. At Time t4, Vs1 is written again as Vsu and the writing terminates at Time t5. A period from Time t5 to Time t6 is a holding period.

(Second Potential)

The signal S2 becomes Low at Time t6, and the potential of the terminal SI2 is selected at Time t7. When a period from Time t7 to Time t8 is referred to as $\Delta t2$, Vsu reaches Vs2 when $\Delta t2$ passes (at Time t8).

A period from Time t8 to Time t9 is a holding period. After $\Delta tb2$ (Time t9), Vs2 is written again as Vsu and the writing terminates at Time t10.

Here, the interval between the writing operations (each of $\Delta tb1$ and $\Delta tb2$) is set to a given period (e.g., a predetermined number of clocks). For example, the interval can be determined by the number of clocks. To change the number of clocks, a counter may be provided in the control portion 41. Alternatively, the interval can be controlled by changing frequency while not changing the number of clocks. In that case, a counter is not necessary. Further alternatively, Vsu and a certain reference potential can be compared using the comparator 51 to change the interval in response to the comparison result. In that case, for example, it is preferable to be able to input a plurality of potentials to the terminal REF of the comparator 51. For example, Vmax is input to the terminal REF only in the holding period. A selector or the like can be used to make the potential input to the terminal REF different between the holding period and the other period. Alternatively, the operation time of the charge pump or the like can be controlled, as described later, to change the potential.

Figure 12B:
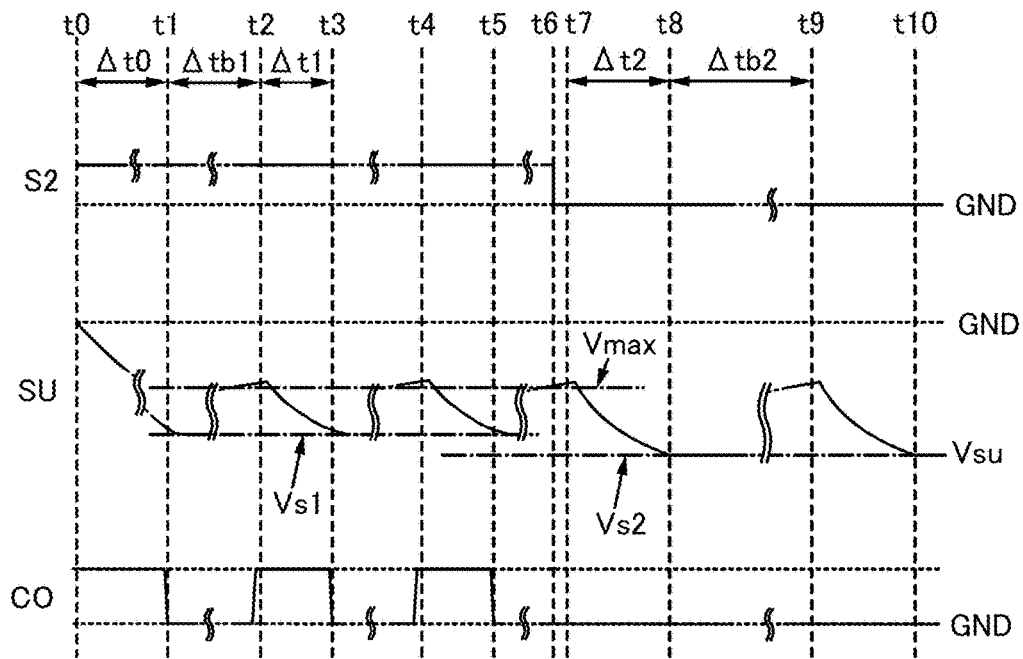

FIG. 12B shows the following case: Vmax, which is used as an upper limit potential, and Vsu are compared using the comparator 51, a high potential signal is output from the comparator 51 when Vsu reaches Vmax, and Vsu is decreased using the voltage generation portion 42 and the voltage holding portion 43. FIG. 12B shows the relationship between Vsu and the potential of the terminal CO of the comparator 51 in a period during which the potential of the terminal SI1 is selected. Note that $\Delta tb2$ may be controlled using the comparator in a period during which the terminal SI2 is selected.

Although FIGS. 11A and 11B each illustrate the case of obtaining a plurality of potentials using a selector, a plurality of potentials may be output from the terminal BG. For example, the potential output from the terminal BG is controlled by the writing time.

Figure 18A:
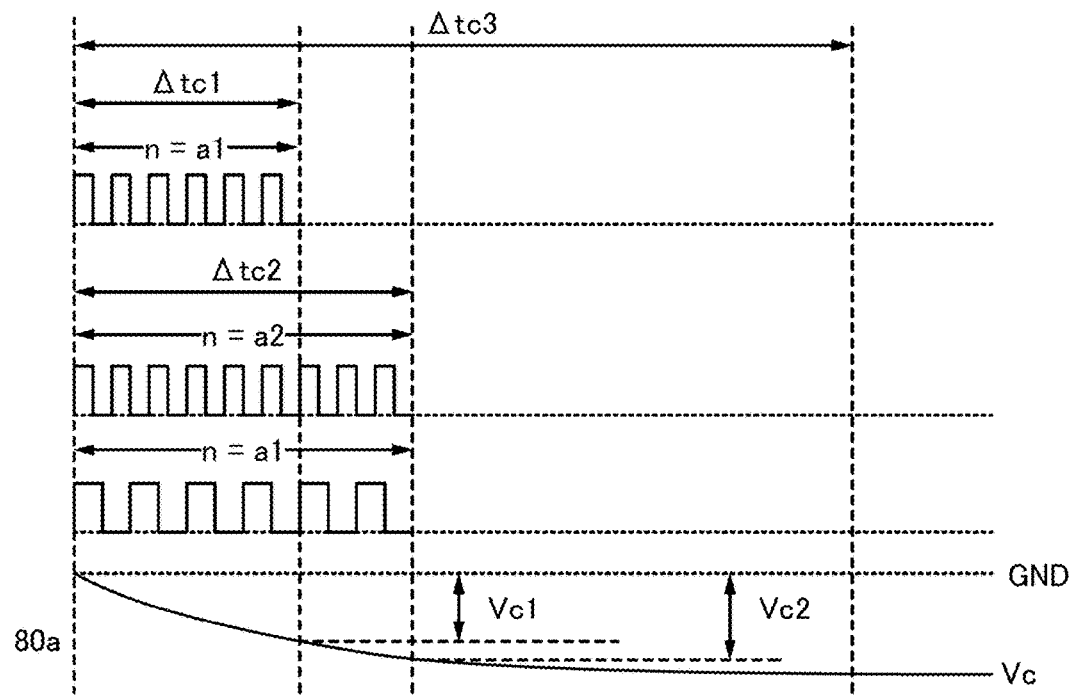
FIGS. 18A to 18C are timing charts each showing an operation example of a semiconductor device.

FIG. 18A shows Vc, which is a potential output from the charge pump 80a. A period in which Vc is substantially saturated is referred to as $\Delta tc3$. In $\Delta tc1$ and $\Delta tc2$, which are both shorter than $\Delta tc3$, the charge pump is stopped. The potential can be controlled by time to be either a potential Vc1 obtained after $\Delta tc1$ or a potential Vc2 obtained after $\Delta tc2$. That is, a potential depending on the writing time can be obtained. In the case of reducing voltage using the capacitor CA1 and the transistor FE1 in the holding circuit 50, the potential can be changed depending on the time in a similar manner. The time can be controlled by the number of clocks or frequency. In FIG. 18A, the time for obtaining Vc1 is controlled by a1 clocks and the time for obtaining Vc2 is controlled by a2 clocks or by the a1 clocks with reduced frequency.

Alternatively, a comparison with a certain reference potential can be made using the comparator 51 to control the time in response to the comparison result. In that case, for example, it is preferable to be able to input a plurality of values to the terminal REF of the comparator 51. To input a plurality of values, a plurality of signals are input using a selector or the like, for example. Further alternatively, a potential can be controlled by voltage reduction time (or voltage increasing time) of the voltage generation circuit connected to the terminal REF.

Figure 15:
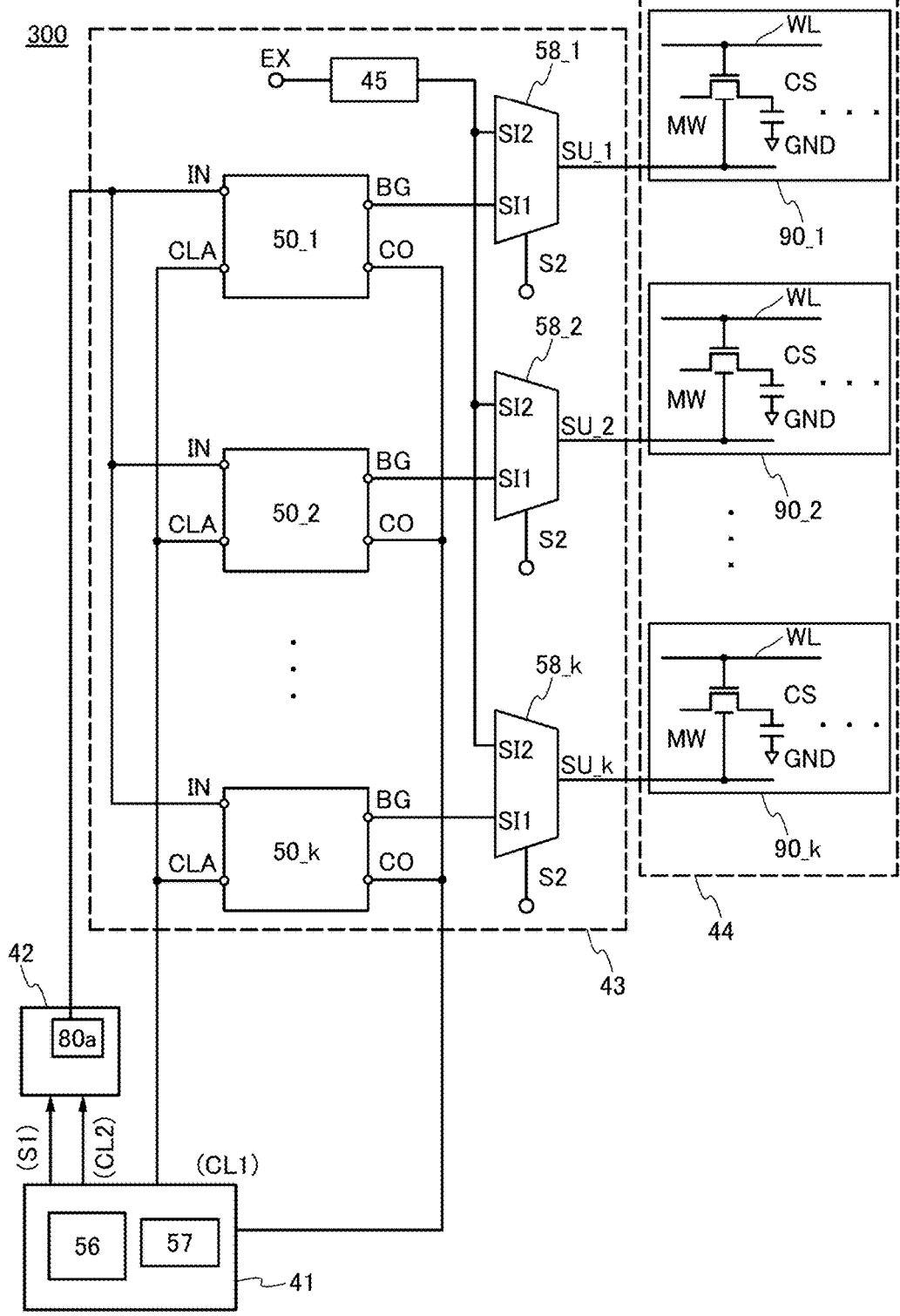
FIG. 15 is a block diagram illustrating a configuration example of a semiconductor device.

The semiconductor device 300 illustrated in FIG. 15 includes k selectors 58. The m-th selector 58 included in the semiconductor device 300 is referred to as the selector 58_m. The semiconductor device 300 illustrated in FIG. 15 includes the selector 58_m between the holding circuit 50_m and the block 90_m. The selector 58_m includes a plurality of input terminals. A potential from the terminal BG of the holding circuit 50_m is applied to a first input terminal, and a potential from the terminal EX is applied to a second input terminal through the holding circuit 45.

Figure 16:
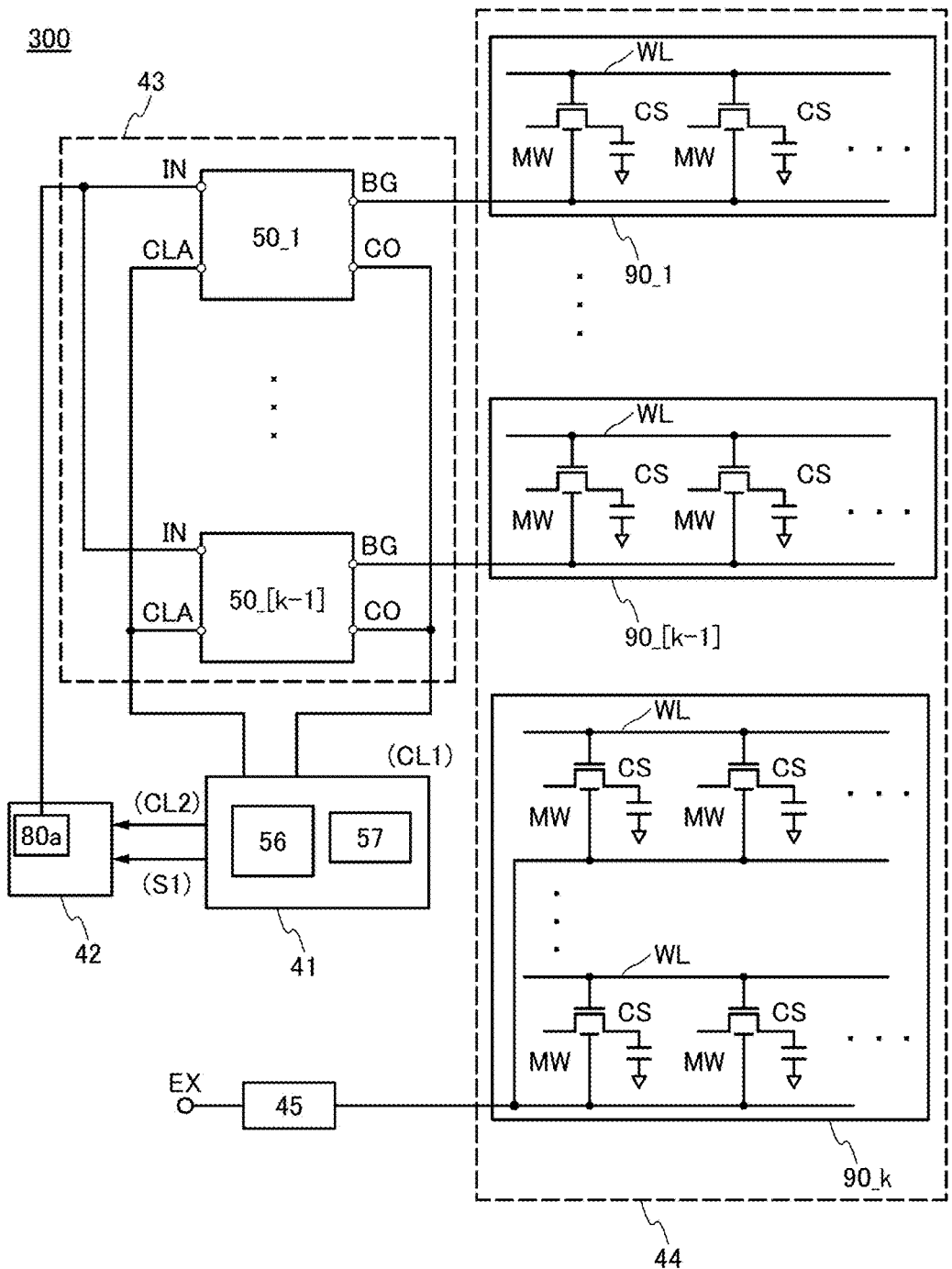
FIG. 16 is a block diagram illustrating a configuration example of a semiconductor device.

As illustrated in FIG. 16, the semiconductor device 300 may include, among the plurality of blocks 90, a block connected to the holding circuit 50_m and a block to which a potential is applied from the terminal EX through the holding circuit 45. In the example illustrated in FIG. 16, the blocks 90_1 to 90_[k−1] are electrically connected to the holding circuits 50_1 to 50_[k−1], respectively. In addition, a potential is applied to the block 90_k from the terminal EX through the holding circuit 45.

Figure 17:
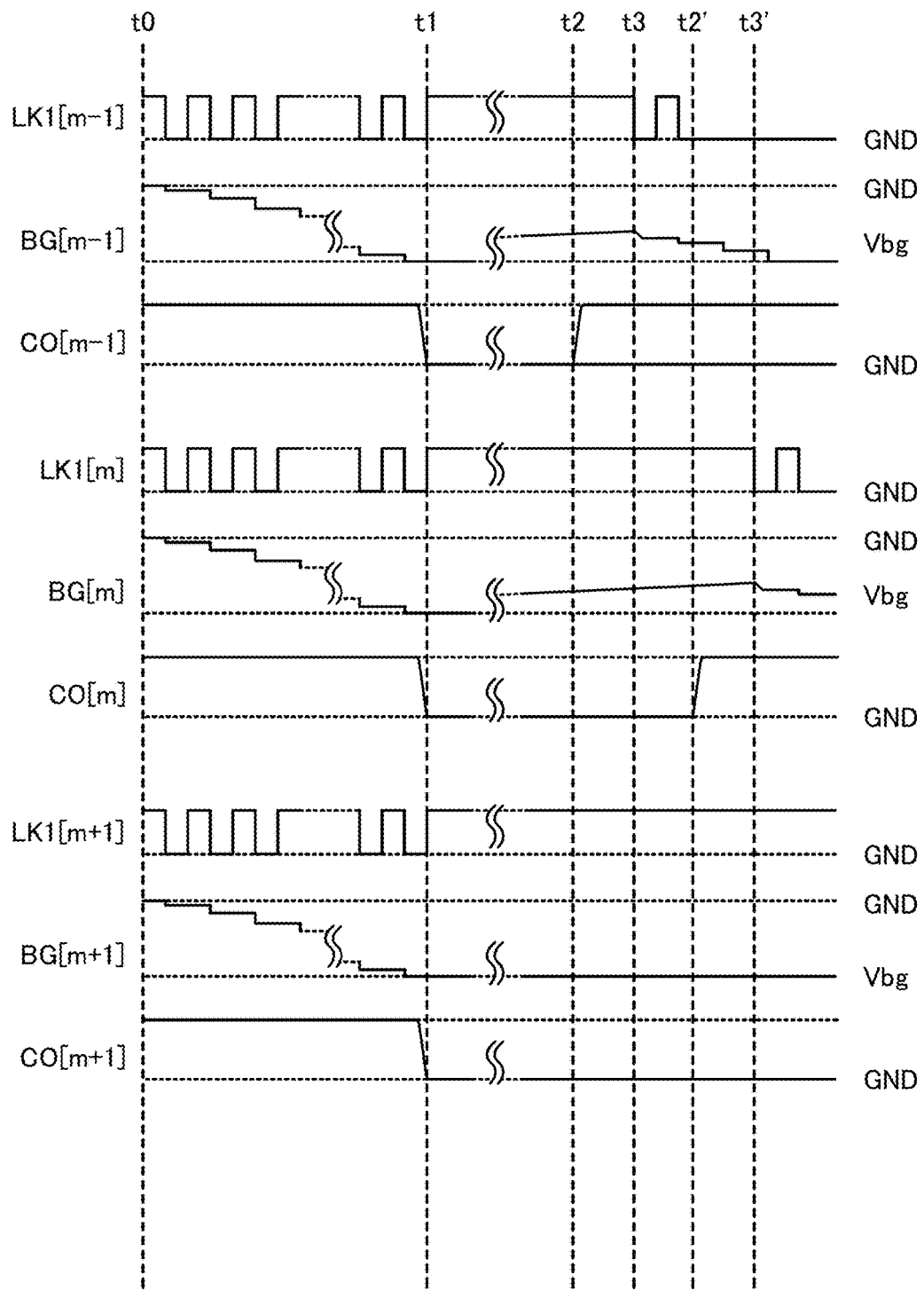
FIG. 17 is a timing chart showing an operation example of a semiconductor device.

A timing chart in FIG. 17 shows the potentials of the terminal LK1, the terminal BG, and the terminal CO in the case where the semiconductor device 300 includes a plurality of holding circuits 50 as illustrated in FIG. 10, FIG. 15, FIG. 16, and other drawings.

<Operation Example (2) of Semiconductor Device>

FIG. 17 shows the potentials of the terminals LK1, BG, and CO (shown as LK1[m−1], BG[m−1], and CO[m−1]) included in the holding circuit 50_[m−1], the terminals LK1, BG, and CO (shown as LK1[m], BG[m], and CO[m]) included in the holding circuit 50_m, and the terminals LK1, BG, and CO (shown as LK1[m+1], BG[m+1], and CO[m+1]) included in the holding circuit 50_[m+1].

At Time t0, high potential signals are output from the terminals CO[m−1], CO[m], and CO[m+1], clock signals are output from the terminals LK1[m−1], LK1[m], and LK[m+1], and the potentials of the terminals BG[m−1], BG[m], and BG[m+1] in the holding circuits 50[m−1], 50[m], and 50[m+1] start to be reduced. At Time t1, Vbg becomes lower than the reference potential (Vref) that is input to the comparators 51 included in the holding circuits 50; thus, low potential signals are output from the terminals CO[m−1], CO[m], and CO[m+1], the terminals LK1[m−1], LK1[m], and LK1[m+1] stop outputting the clock signals, and Vbg is held.

Note that the writing time to the cell array 44 can be shortened in some cases when each holding circuit includes the capacitor CA2 in the semiconductor devices 300 illustrated in FIG. 10, FIG. 15, FIG. 16, and other drawings.

At Time t2, Vbg output from the terminal BG[m−1] becomes higher than Vref and a high potential signal is output from the terminal CO[m−1], and Vbg starts to be reduced at Time t3. Meanwhile, the terminals BG[m] and BG[m+1] output Vbg lower than Vref; thus, a voltage reduction is unnecessary in the holding circuits 50_m and 50_[m+1].

At Time t2', Vbg output from the terminal BG[m] becomes higher than Vref and a high potential signal is output from the terminal CO[m], and Vbg starts to be reduced at Time t3'. The terminal BG[m+1] outputs Vbg lower than Vref; thus, a voltage reduction is unnecessary in the holding circuit 50_[m+1].

<Variation in Writing Voltage>

Figure 18B:
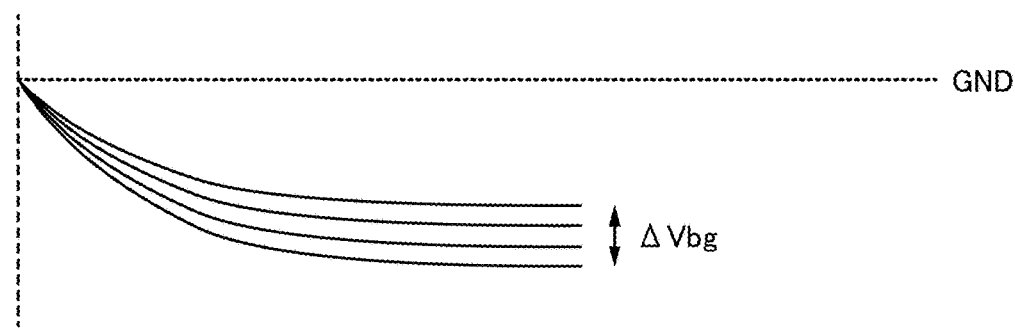
Figure 18C:
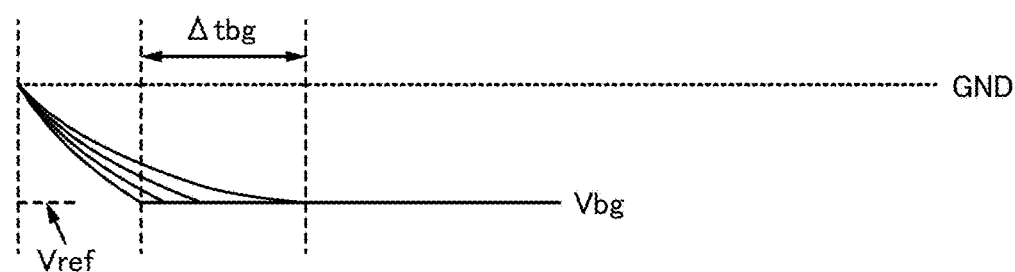

In the holding circuit 50, in some cases, voltage is substantially saturated after a certain period of time depending on the current drive capability or the like of the charge pump 80a, the transistor FE1, and the capacitor CA1. FIG. 18B shows the case where Vbg output from the plurality of holding circuits 50 has variation (ΔVbg) after a certain period of time in which Vbg is substantially saturated. FIG. 18C shows an example where Vbg is controlled using the reference potential Vref applied to the terminal REF of the comparator 51. Each of the holding circuits 50 compares Vbg with Vref, whereby variation in Vbg among the plurality of holding circuits 50 can be reduced.

(Embodiment 3)

In this embodiment, an example of a semiconductor device in which the voltage holding portion, the voltage generation portion, the control portion, or the like described in either of the above embodiments can be used will be described. The semiconductor device described below may include the cell array described in either of the above embodiments, for example.

<Memory Device 1>

In an example described below, a cell array 203 included in a memory device 210 illustrated in FIG. 19A corresponds to the cell array 44 included in the semiconductor device 300.

Figure 19A:
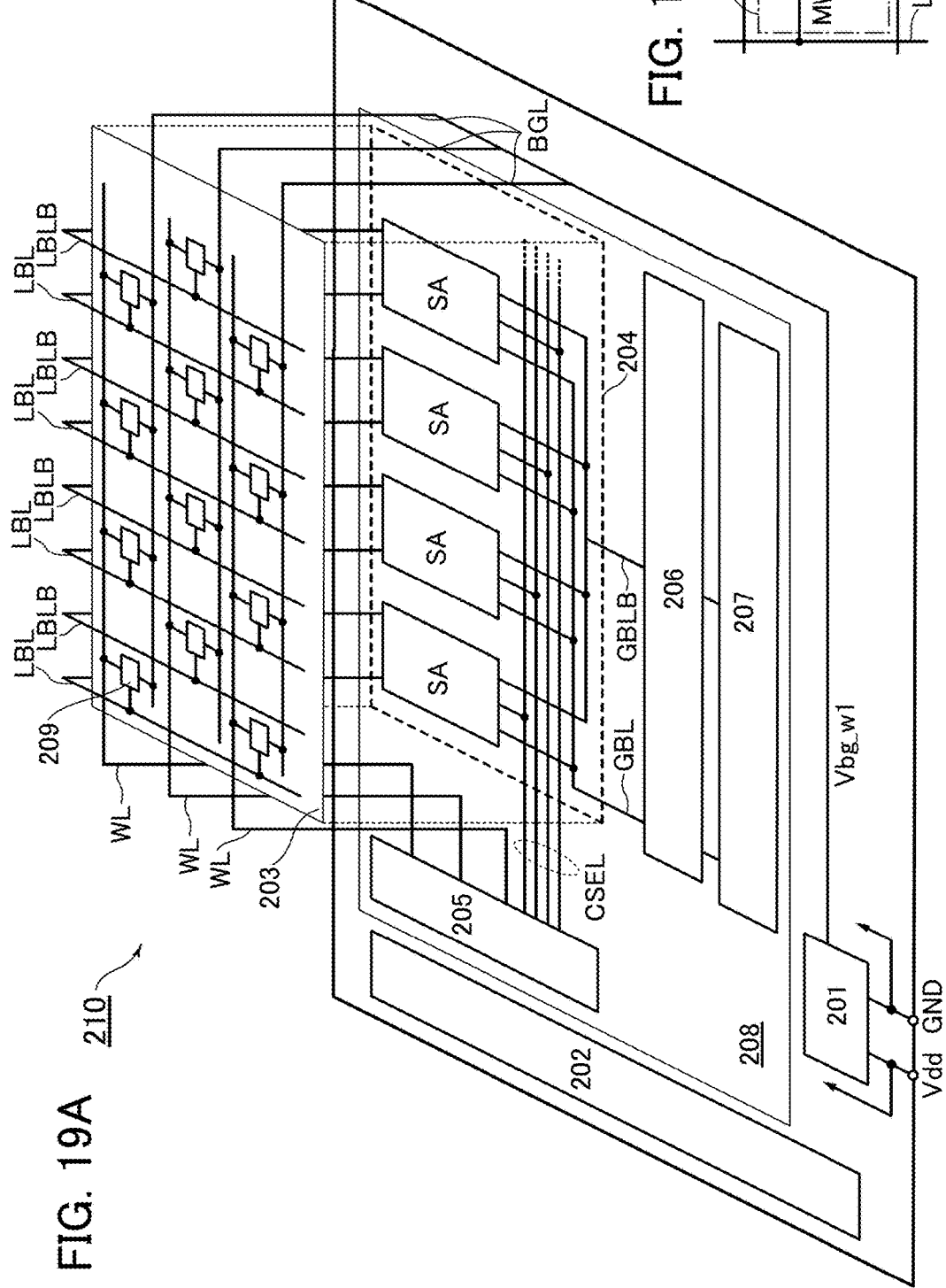
FIG. 19A is a block diagram illustrating a configuration example of a memory device and FIG. 19B is a circuit diagram illustrating a configuration example of a memory cell.

The memory device 210 illustrated in FIG. 19A includes the cell array 203. The cell array 203 includes a memory cell 209. The cell arrays 44 illustrated in FIGS. 7A and 7B and other drawings can each be used as the cell array 203 illustrated in FIG. 19A. A plurality of blocks are provided in the cell array 203 like the blocks 90 illustrated in FIG. 6B, for example.

Figure 19B:
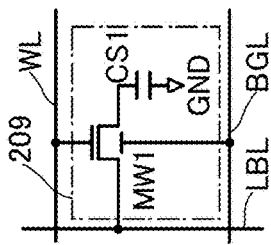

The cell array 203 includes a plurality of memory cells 209. FIG. 19B is a circuit diagram illustrating an example of the memory cell 209.

The memory device 210 illustrated in FIG. 19A includes a potential generation portion 201, a control portion 202, the cell array 203, and a periphery circuit 208. The periphery circuit 208 includes a sense amplifier circuit 204, a driver 205, a main amplifier 206, and an input/output circuit 207.

The memory cell array 203 includes a plurality of memory cells 209. The memory cells 209 are electrically connected to wirings WL, LBL (or LBLB), and BGL. The wiring WL is a word line. The wirings LBL and LBLB are local bit lines.

FIG. 19B illustrates a configuration example of the memory cell 209. The memory cell 209 includes a transistor MW1 and a capacitor CS1. The memory cell 209 has a circuit configuration similar to that of a memory cell for a DRAM. Here, the transistor MW1 is an OS transistor having a back gate. The back gate of the transistor MW1 is electrically connected to the wiring BGL. Since the transistor MW1 is an OS transistor, the memory cell 209 does not consume power while data is retained. In other words, the memory cell 209 is a low-power-consuming memory cell that can retain data for a long time. The transistor 100 or the transistor 200 described later can be used as the transistor MW1. It is particularly preferable to use the transistor 100. The same applies to transistors MW2, MW3, MW5, and MW6 and the like described later.

The driver 205 is electrically connected to a plurality of wirings WL and CSEL. The driver 205 generates signals output to the plurality of wirings WL and CSEL.

The cell array 203 is stacked over the sense amplifier circuit 204. The sense amplifier circuit 204 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 204, one wiring GBL is provided for four wirings LBL, and one wiring GBLB is provided for four wirings LBLB. However, the configuration of the sense amplifier circuit 204 is not limited to the configuration example of FIG. 19A.

The main amplifier 206 is connected to the sense amplifier circuit 204 and the input/output circuit 207. The main amplifier 206 has a function of amplifying the voltage of the wiring GBL. The main amplifier 206 is not necessarily provided.

The input/output circuit 207 has a function of inputting a potential corresponding to a write data to the wiring GBL and a function of outputting the potential of the wiring GBL or an output potential of the main amplifier 206 to the outside as a read data.

The sense amplifier SA from which data is read and the sense amplifier SA to which data is written can be selected using the signal of the wiring CSEL. Therefore, there is no need to provide a selection circuit such as a multiplexer in the input/output circuit 207. Thus, the input/output circuit 207 can have a simple circuit configuration and a small occupied area.

The control portion 202 has a function of controlling the memory device 210. For example, the control portion 202 controls the driver 205, the main amplifier 206, and the input/output circuit 207.

Potentials Vdd and GND are input as power supply potentials to the memory device 210. Potentials other than the potentials Vdd and GND are generated in the potential generation portion 201. The potentials generated in the potential generation portion 201 is input to the circuits in the memory device 210. The potential Vdd is used as a drive potential for the OS transistor (the transistor MW1). The drive potential for the OS transistor may be generated in the potential generation portion 201.

The potential generation portion 201 has a function of generating the potential Vbg_w1. The potential Vbg_w1 is input to the wiring BGL. For example, the potential Vbg_w1 is set to a negative potential, and the threshold voltage (hereinafter also referred to as Vt) of the transistor MW1 is shifted in the positive potential side. As a result, the charge retention time of the memory cell 209 can be increased.

The memory device 210 can be driven with a single power source owing to the potential generation portion 201. In addition, the circuits included in the memory device 210 can be integrated into one IC chip.

The voltage holding portion 43, the voltage generation portion 42, and the control portion 41 described in either of the above embodiments can be used in the memory device 210.

The potential generation portion 201 preferably includes the voltage holding portion 43 described in either of the above embodiments. The voltage holding portion 43 can apply a negative potential and/or a positive potential. For example, the potential Vbg_w1 is applied from the voltage holding portion 43 to the back gates of the transistors MW1 included in the cell array 203. The control portion 41 and the voltage generation portion 42 may be included in the potential generation portion 201, or in another circuit region such as the control portion 202.

Although the example of FIG. 19A illustrates a folded-bit-line random access memory (RAM), an open-bit-line RAM may be alternatively employed.

<Circuit Area>

Next, the circuit area of the semiconductor device of one embodiment of the present invention is estimated. The holding circuit 50 illustrated in either of FIGS. 3A and 3B is used as the holding circuit and a seven-stage charge pump is used as the charge pump. An OS transistor is used in the last stage of the charge pump. In the memory device, each memory cell includes one transistor and one capacitor as illustrated in FIGS. 19A and 19B. The capacity of the memory device is 1 Mbit. The areas of the logic circuit 52, the comparator 51, and the other region (hereinafter, a region Q) in the holding circuit 50, the control portion 41, the charge pump 80a, a charge pump for generating Vref (here, the charge pump 80b), and the memory device 210 are estimated. For the estimation, the logic circuit 52 is assumed to have 2 gates and the control portion 41 is assumed to have 300 gates. Table 1 shows the estimation results. Note that the capacitance of the capacitor CA1 and that of the capacitor CA2 in the holding circuit are set to 0.1 pF and 0.5 pF, respectively.

TABLE 1

|  | Area [μm$^2$] |
| --- | --- |
| Memory device 210 | 2816000 |
| Charge pump 80a | 75800 |
| Charge pump 80b | 75800 |
| Region Q | 24640 |
| Logic circuit 52 | 4480 |
| Control portion 41 | 5625 |
| Comparator 51 | 51200 |
| Total | 3053545 |

The total area is 3053545 μm$^2$. The memory device 210 occupies 92.2% of the total area. Note that the charge pump 80b is unnecessary when the holding circuit 50 illustrated in any of FIGS. 3A and 3B and FIG. 4A is used. In the case where the charge pump 80b is not included, the total area can be reduced to 2977745 μm$^2$, and the proportion of the area of the memory device 210 in the total area can be 94.6%. In addition, the area of a region other than the memory device 210 can be reduced by approximately 30%.

<Memory Device 2>

In an example described below, a cell array 223 included in a memory device 220 illustrated in FIG. 20A corresponds to the cell array 44 included in the semiconductor device 300.

Figure 20A:
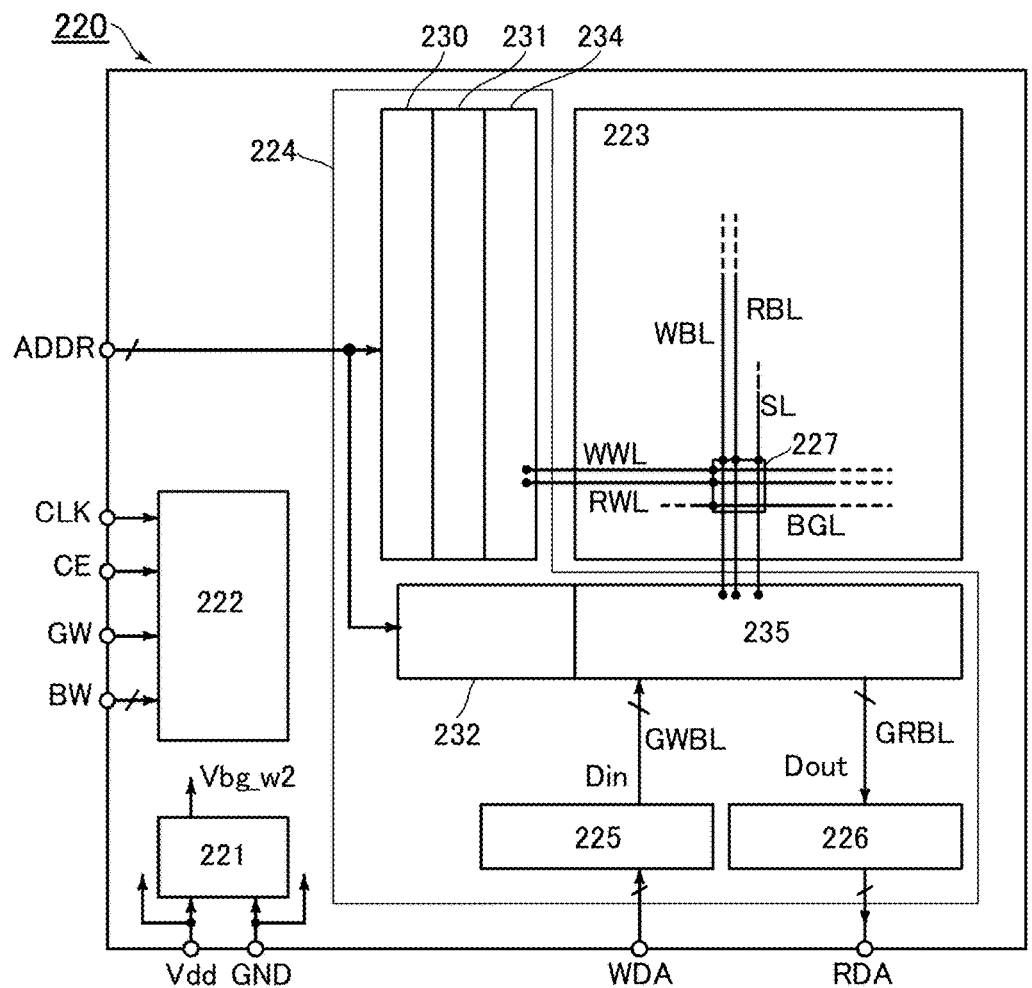
FIG. 20A is a block diagram illustrating a configuration example of a memory device and FIG. 20B is a circuit diagram illustrating a configuration example of a memory cell.

The memory device 220 illustrated in FIG. 20A includes the cell array 223. The cell array 223 includes a memory cell 227. The cell arrays 44 illustrated in FIG. 6B and other drawings can each be used as the cell array 223 illustrated in FIG. 20A. A plurality of blocks are provided in the cell array 223 like the blocks 90 illustrated in FIG. 6B, for example.

Figure 20B:
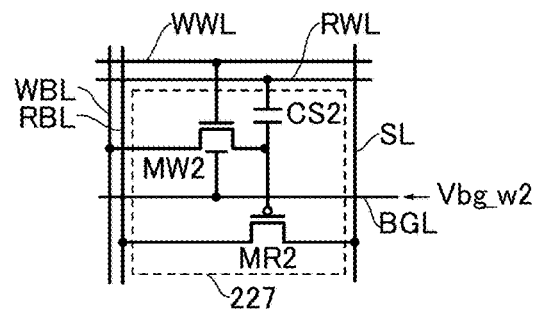

The cell array 223 includes a plurality of memory cells 227. FIG. 20B is a circuit diagram illustrating an example of the memory cell 227.

The memory device 220 illustrated in FIG. 20A includes a potential generation portion 221, a control portion 222, the cell array 223, and a peripheral circuit 224. The peripheral circuit 224 includes an input circuit 225, an output circuit 226, a predecoder 230, a row decoder 231, a column decoder 232, a row driver 234, and a column driver 235.

In the memory device 220, the circuits, signals, and voltages are selected and used as appropriate. Another circuit or another signal may further be incorporated. Structures (e.g., bit lengths) of an input signal and an output signal of the memory device 220 are determined by the architecture of a host device connected to the memory device 220, the operation mode of the memory device 220, the configuration of the cell array 223, and the like.

Signals CLK, CE, GW, BW, ADDR, and WDA are signals input from the outside. A signal RDA is a signal output to the outside. The signal CLK is a clock signal. The signals CE, GW, and BW are control signals. The signal CE is a chip enable signal. The signal GW is a global write enable signal. The signal BW is a byte write enable signal. The signal ADDR is an address signal. The signal WDA is a write data signal. The signal RDA is a read data signal.

The control portion 222 is a logic circuit having a function of controlling the entire operation of the memory device 220. For example, the control portion 222 performs a logical operation on the signals CE, GW, and BW to determine the operation mode. The control portion 222 generates a control signal for the peripheral circuit 224 so that the operation mode can be performed. The control portion 222 may have a function of generating an internal clock signal from the signal CLK.

The cell array 223 includes a plurality of memory cells 227, a plurality of wirings WWL, a plurality of wirings RWL, a plurality of wirings WBL, a plurality of wirings RBL, a plurality of wirings SL, and a plurality of wirings BGL. The plurality of memory cells 227 are arranged in a matrix. In each row, the memory cells 227 are electrically connected to the wirings WWL, RWL, and BGL. In each column, the memory cells 227 are electrically connected to the wirings WBL, RBL, and SL. The wiring WWL is a write word line. The wiring RWL is a read word line. The wiring WBL is a write bit line. The wiring RBL is a read bit line. The wiring SL is a source line.

FIG. 20B illustrates a configuration example of the cell array 223. The memory cell 227 in this example is a 2-transistor gain cell. The memory cell 227 includes a transistor MW2, a transistor MR2, and a capacitor CS2. The transistor MW2 is an OS transistor having a back gate, which is electrically connected to the wiring BGL. A potential Vbg_w2 is input to the wiring BGL. The potential Vbg_w2 is a potential generated in the potential generation portion 221.

The voltage holding portion 43, the voltage generation portion 42, and the control portion 41 described in either of the above embodiments can be used in the memory device 220.

The potential generation portion 221 preferably includes the voltage holding portion 43 described in either of the above embodiments. The voltage holding portion 43 can apply a negative potential and/or a positive potential. For example, the potential Vbg_w2 is applied from the voltage holding portion 43 to the back gates of the transistors MW2 included in the cell array 223. The control portion 41 and the voltage generation portion 42 may be included in the potential generation portion 221, or in another circuit region such as the control portion 222.

Since the transistor MW2 is an OS transistor, the memory cell 227 is a low-power-consuming memory cell in which power is not consumed for data retention and data can be retained for a long time. Thus, the memory device 220 can be used as a non-volatile memory device. Since the transistor MW2 and the capacitor C2 can be stacked over the transistor MR2, the integration degree of the cell array 223 can be increased.

The peripheral circuit 224 is a circuit for writing and reading data to/from the cell array 223. The peripheral circuit 224 has a function of driving the wirings WWL, RWL, WBL, RBL, and SL, for example.

The predecoder 230, the row decoder 231, and the column decoder 232 are configured to decode the signal ADDR. The predecoder 230 is provided in the case where the cell array 223 is divided into a plurality of blocks, for example. In that case, the predecoder 230 has a function of specifying a block to be accessed. The row decoder 231 has a function of specifying a row to be accessed. The column decoder 232 has a function of specifying a column to be accessed.

The column driver 235 has a function of writing data to the cell array 223, a function of reading the data from the cell array 223, a function of amplifying the read data, and a function of retaining the read data, for example. More specifically, the column driver 235 has a function of controlling voltages of the wirings WBL, RBL, and SL, for example.

The row driver 234 has a function of activating the wirings WWL and RWL in a row specified by the row decoder 231. By activating the wiring WWL, the memory cell 227 in the specified row is selected and data is written to the selected memory cell 227 by the column driver 235. By activating the wiring RWL, the memory cell 227 in the specified row is selected. Data is written to the selected memory cell 227 by the column driver 235.

The input circuit 225 has a function of holding the WDA. The data held in the input circuit 225 is output to the column driver 235 through a wiring GWBL (global write bit line). Note that Din is data that is output from the input circuit 225 and written to the cell array 223.

A data signal Dout that is read from the memory cell by the column driver 235 is output to the output circuit 226 through a wiring GRBL (global read bit line). The output circuit 226 has a function of holding the data signal Dout. The output circuit 226 outputs the held data to the outside of the memory device 220. The data signal output from the output circuit 226 is the signal RDA.

The potentials Vdd and GND are input as power supply potentials to the memory device 220. Potentials other than the potentials Vdd and GND are generated in the potential generation portion 221 and input to the circuits in the memory device 220. The potential Vdd is used as a drive potential for the OS transistor (the transistor MW2). Needless to say, the drive potential for the OS transistor may be generated in the potential generation portion 221.

For example, the potential generation portion 221 has a function of generating the potential Vbg_w2. For example, the potential Vbg_w2 is set to a negative potential, and the Vt of the transistor MW2 is shifted in the positive potential side. As a result, the charge retention time of the memory cell 227 can be increased.

The memory device 220 can be driven when the potential generation portion 221 is used for a power-supply circuit. The circuits included in the memory device 220 can be integrated into one IC chip.

Figure 21A:
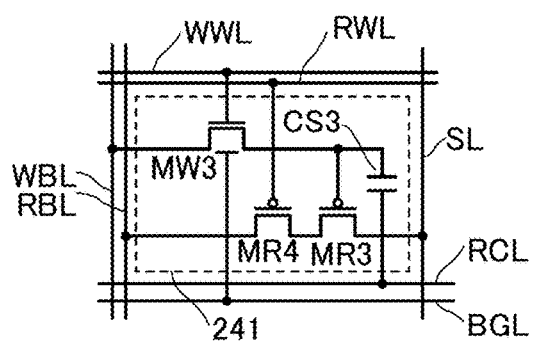
FIGS. 21A to 21E are block diagrams each illustrating a configuration example of a memory cell.
Figure 21B:
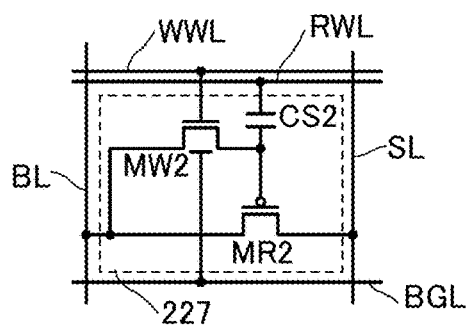
Figure 21C:
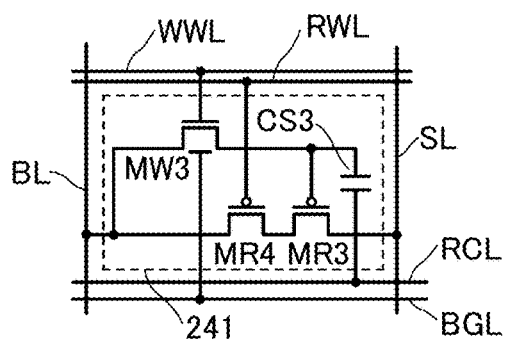
Figure 21D:
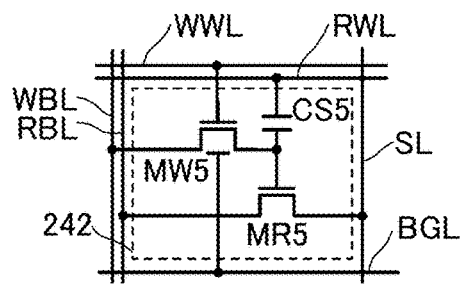
Figure 21E:
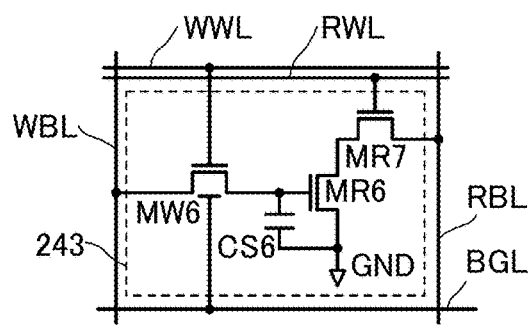

The cell array 223 may include, instead of the memory cell 227 illustrated in FIG. 20B, a memory cell 241 illustrated in FIG. 21A, the memory cell 227 illustrated in FIG. 21B, the memory cell 241 illustrated in FIG. 21C, a memory cell 242 illustrated in FIG. 21D, or a memory cell 243 illustrated in FIG. 21E.

FIGS. 21A to 21E each illustrate a configuration example of the cell array (one row and one column).

FIG. 21A illustrates a configuration example of a cell array with a 3-transistor gain cell. A wiring RCL is provided for each row of the cell array in FIG. 21A. A memory cell 241 is electrically connected to the wirings WWL, RWL, WBL, RBL, SL, RCL, and BGL. The memory cell 241 includes transistors MW3, MR3, and MR4, and a capacitor CS3. The transistor MW3 is an OS transistor with a back gate. The back gate is electrically connected to the wiring BGL. The transistors MR4 and MR3 are p-channel Si transistors.

A cell array illustrated in FIG. 21B is a modification example of FIG. 20B, and a cell array illustrated in FIG. 21C is a modification example of FIG. 21A. In these cell arrays, a bit line for writing and reading (wiring BL) is provided instead of the wirings WBL and RBL.

A cell array illustrated in FIG. 21D is a modification example of FIG. 20B. In FIG. 21D, in which an n-channel Si transistor is used instead of the transistor MR2. A memory cell 242 illustrated in FIG. 21D is electrically connected to the wirings WWL, RWL, WBL, RBL, SL, and BGL. The memory cell 242 includes transistors MW5 and MR5, and a capacitor CS5. The transistor MW5 is an OS transistor with a back gate. The transistor MR5 is an n-channel Si transistor. Also in the cell array in FIG. 21D, the wiring BL may be provided instead of the wirings WBL and RBL in a manner similar to that of FIG. 21B.

Note that when the cell array illustrated in FIG. 21D is employed for the memory device 220, a negative potential and a positive potential are preferably input to the wiring RWL in a non-selected row and the wiring RWL in a selected row, respectively. The negative potential input to the wiring RWL can be generated in the potential generation portion 221.

A cell array illustrated in FIG. 21E is a modification example of FIG. 21A, in which n-channel Si transistors are used instead of the transistors MR3 and MR4. A memory cell 243 illustrated in FIG. 21E is electrically connected to the wirings WWL, RWL, WBL, RBL, and BGL and a wiring to which a potential GND is input. The memory cell 243 includes transistors MW6, MR6, and MR7, and a capacitor CS6. The transistor MW6 is an OS transistor with a back gate. The transistors MR6 and MR7 are n-channel Si transistors. Also in the cell array in FIG. 21E, the wiring BL may be provided instead of the wirings WBL and RBL in a manner similar to that of FIG. 21C.

Note that the memory cell 209 included in the cell array 203 and any of the memory cells 227, 241, 242, and 243 included in the cell array 223 each include one transistor having a back gate (the transistor MW2, MW3, MW5, or MW6).

<<MCU 250>>

Figure 22:
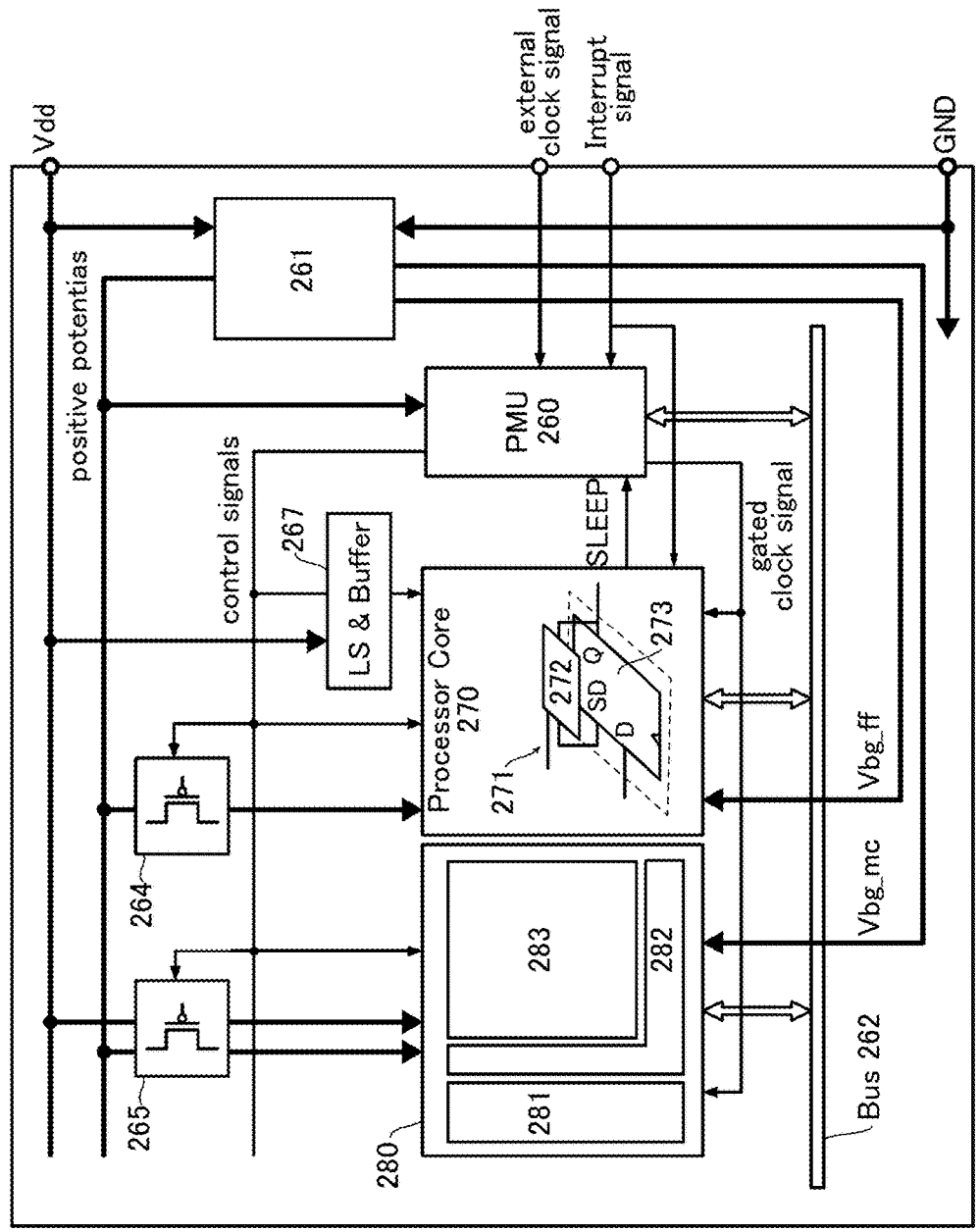
FIG. 22 is a block diagram illustrating a configuration example of a microcontroller unit.

FIG. 22 illustrates a configuration example of a microcontroller unit (MCU). An MCU 250 in FIG. 22 is a semiconductor device that is capable of clock gating and power gating.

The MCU 250 includes a power management unit (PMU) 260, a potential generation unit 261, a bus 262, power switches 264 and 265, a level shifter (LS) and buffer circuit 267, a core (or a processor core) 270, and a memory 280. The exchange of data and the like between the PMU 260, the core 270, and the memory 280 is performed through the bus 262.

In order to reduce the power consumption of a semiconductor device, circuits that do not need to be operated are stopped by power gating or clock gating. A flip-flop is a kind of sequential circuit (storage circuit that holds its state) included in a semiconductor device in many cases. Thus, a reduction in power consumption of the flip-flop is effective in reducing the power consumption of a semiconductor device including the flip-flop. In general, the state of the flip-flop is erased (data held therein is lost) when power supply is stopped. It is thus necessary to make backup of the state of the flip-flop so that the semiconductor device is power gated.

The core 270 includes a plurality of flip-flops 271. The flip-flop 271 is provided for a variety of registers in the core 270. The flip-flop 271 includes a backup circuit 272 and a scan flip-flop 273. In other words, the flip-flop 271 is a scan flip-flop including a backup circuit.

The backup circuit 272 is provided for the flip-flop 271 to store data of the flip-flop 271 in clock gating and power gating. The backup circuit 272 includes a plurality of OS transistors having back gates. The backup circuit 272 can be stacked over a logic cell composed of a Si transistor because no Si transistor is included in the backup circuit 272.

The memory 280 includes a control portion 281, a periphery circuit 282, and a cell array 283. The cell array 283 includes a plurality of memory cells including OS transistors. The above-described memory device can be employed for the memory 280.

Power-supply potentials such as the potentials Vdd and GND are input to the MCU 250. Positive potentials and negative potentials other than the potentials Vdd and GND are generated in the potential generation unit 261. For example, the potential generation unit 261 generates negative potentials such as potentials Vbg_ff and Vbg_mc. The potential Vbg_ff is input to the back gates of the OS transistors of the backup circuit 272. The potential Vbg_mc is input to the back gates of the OS transistors of the cell array 283. The potential Vdd here is a drive potential for OS transistors. The potential Vdd is supplied to the LS and buffer circuit 267 and the cell array 283. The potential generation unit 261 generates positive potentials such as a reference potential, a high-power-supply potential for driving a Si transistor, and the like. Needless to say, the potential generation unit 261 may generate the drive potential for the OS transistors.

The voltage holding portion 43, the voltage generation portion 42, and the control portion 41 described in either of the above embodiments can be used in the MCU 250.

The potential generation unit 261 preferably includes the voltage holding portion 43 described in either of the above embodiments. The voltage holding portion 43 can apply a negative potential and/or a positive potential. For example, the potential Vbg_ff is applied from the voltage holding portion 43 to the back gates of the OS transistors included in the cell array 283. The control portion 41 and the voltage generation portion 42 may be included in the potential generation unit 261, or in another circuit region.

A clock signal, an interrupt request signal, and the like are input to the MCU 250 from the outside. The external clock signal is input to the PMU 260. The interrupt request signal is input to the PMU 260 and the core 270.

The PMU 260 has a function of controlling clock gating and power gating. The PMU 260 generates a gated clock signal (hereinafter referred to as GCLK) from an external clock signal. The signal GCLK is input to the core 270 and the memory 280. The PMU 260 generates a variety of control signals. The control signals include control signals for the power switches 264 and 265, a control signal for the backup circuit 272, and a control signal for the scan flip-flop 273 (e.g., a reset signal).

The control signal for the backup circuit 272 is input to the LS and buffer circuit 267. The LS and buffer circuit 267 has a function of level-shift the control signal and of holding the level-shifted control signal. The control signal held by the LS and buffer circuit 267 is input to the backup circuit 272.

The power switch 264 controls supply of a positive potential to the core 270. The power switch 265 controls supply of a positive potential to the memory 280. When the core 270 includes a plurality of power supply domains, power switches corresponding to the power supply domains are provided as the power switch 264. The same applies to the power switch 265. Other than the potential Vdd, a plurality of positive potentials corresponding to the circuit configuration is input to the memory 280 through the power switch 265. The positive potentials input to the memory 280 include a power-supply potential for the control portion 281, a power-supply potential for the peripheral circuit 282, a precharge potential for the bit line, a reference potential for reading data, and the like.

A signal SLEEP is output from the processor core 270 to the PMU 260. The signal SLEEP is a trigger signal for transferring the core 270 to the sleep mode (standby mode). When the signal SLEEP is input to the PMU 260, the PMU 260 outputs a control signal for transition from the active mode to the sleep mode to a functional circuit to be controlled. The core 270 can be transferred from the active mode to the sleep mode in response to an interrupt request signal.

First, the PMU 260 stops supplying the clock signal to the core 270 to transfer it from the active mode to the sleep mode. Then, data in the scan flip-flop 273 is written to the backup circuit 272. The PMU 260 controls the power switch 264 and stops the supply of a positive potential to the core 270 as necessary.

Processing for returning the core 270 from the sleep mode to the active mode is executed by input of an interrupt request signal, for example. In response to the interrupt request signal, the PMU 260 outputs a control signal for transition from the sleep mode to the active mode to a functional circuit which is to be controlled. The PMU 260 controls the power switches 264 and 265 to restart the potential supply to the core 270 and the memory 280. Then, data held in the backup circuit 272 is recovered to the scan flip-flop 273. Finally, the supply of clock signals to the core 270 and the memory 280 is restarted.

The PMU 260 performs clock gating and power gating of the memory 280 like the core 270.

A timer circuit for counting time may be provided in the PMU 260 for power gating of the core 270 and the memory 280 on the basis of the counted time.

<Flip-flop 271>

Figure 23:
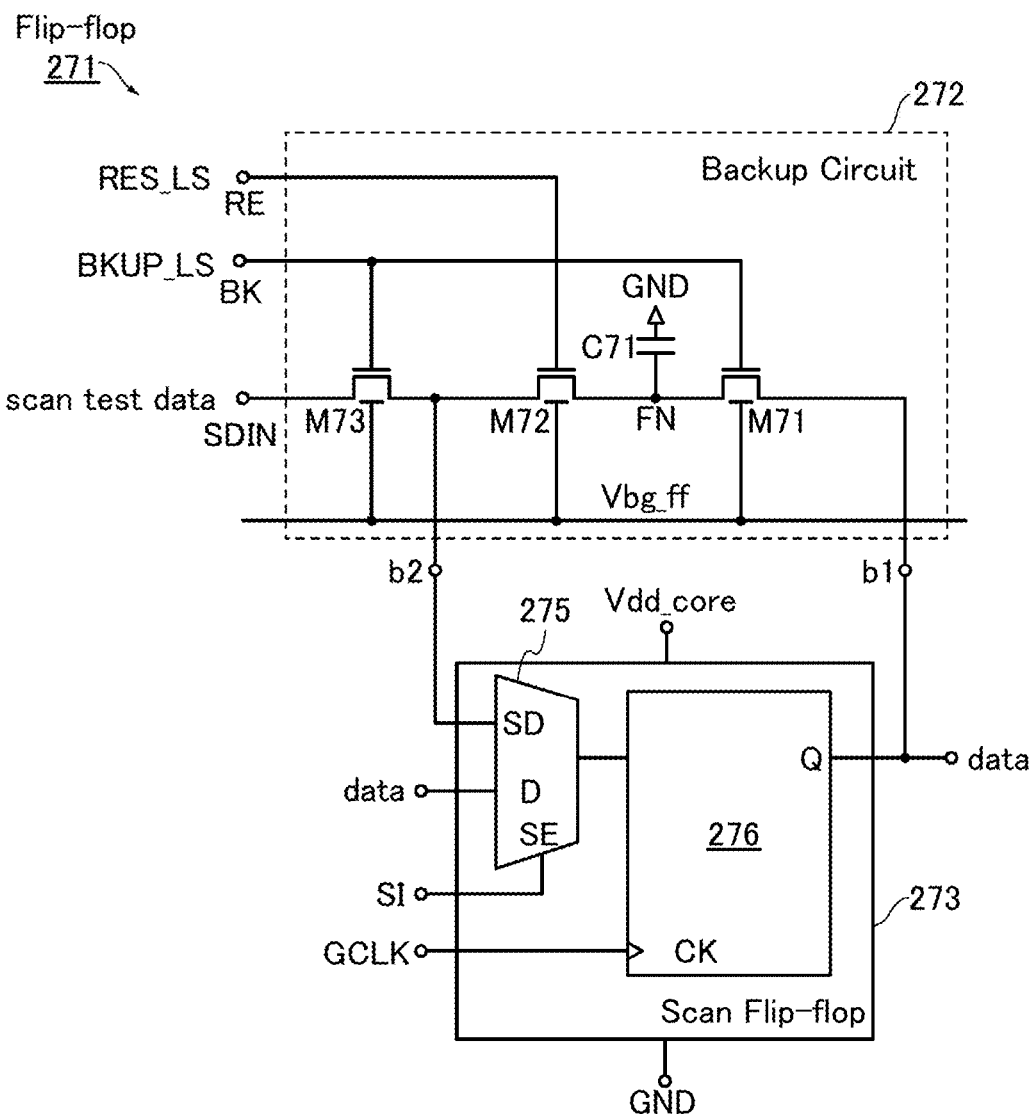
FIG. 23 is a block diagram illustrating a configuration example of a flip-flop.

FIG. 23 illustrates a configuration example of the flip-flop 271 (the backup circuit 272 and the scan flip-flop 273).

There is no particular limitation on the circuit structure of the scan flip-flop 273. A scan flip-flop that is prepared in a circuit library can be used. The scan flip-flop 273 includes nodes D, Q, CK, SD, and SE, a selector 275, and a flip-flop 276. A signal SI is input to the node SE. The selector 275 selects either the node D or the node SD depending on the logic of the signal SI and outputs data to be input to the selected node to the flip-flop 276. The signal SI is output from the PMU 260.

A potential Vdd_core and GND are input to the scan flip-flop 273 as power supply potentials. The potential Vdd_core is a positive potential generated in the potential generation unit 261. The potential Vdd_core is supplied to the core 270 through the power switch 264.

The backup circuit 272 includes nodes RE, BK, SDIN, FN, b1, and b2, transistors M71 to M73, and a capacitor C71. The node FN is a data retention node. The capacitor C71 is electrically connected to the node FN. The node b1 is electrically connected to the node Q. The node b2 is electrically connected to the node SD. A backup signal (BKUP_LS) is input to the node BK, and a restore signal (RES_LS) is input to the node RE. The signals BKUP_LS and RES_LS are output from the LS and buffer circuit 267. The node SDIN is an input node of a scan test data.

The transistors M71 to M73 are OS transistors each including a back gate. A potential Vbg_ff is input to these back gates. Gates of the transistors M71 and M73 are electrically connected to the node BK. A gate of the transistor M72 is electrically connected to the node RE.

Note that the voltage holding portion 43, the voltage generation portion 42, and the control portion 41 described in either of the above embodiments can be used for generating the potential Vbg_ff.

Figure 24A:
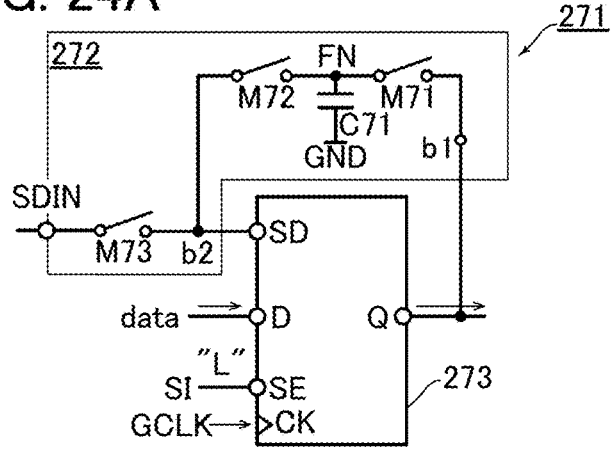
FIGS. 24A to 24C are circuit diagrams illustrating operation examples of a flip-flop.
Figure 24B:
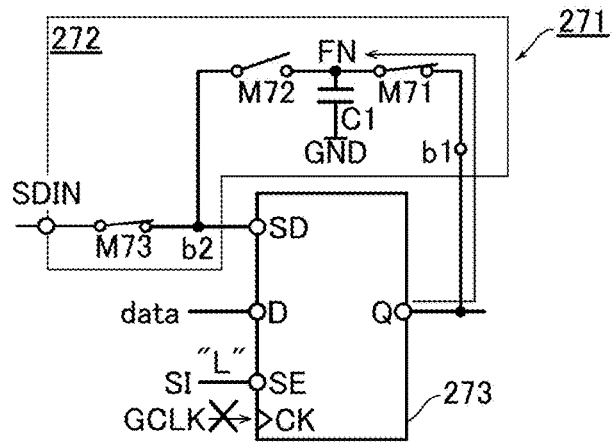
Figure 24C:
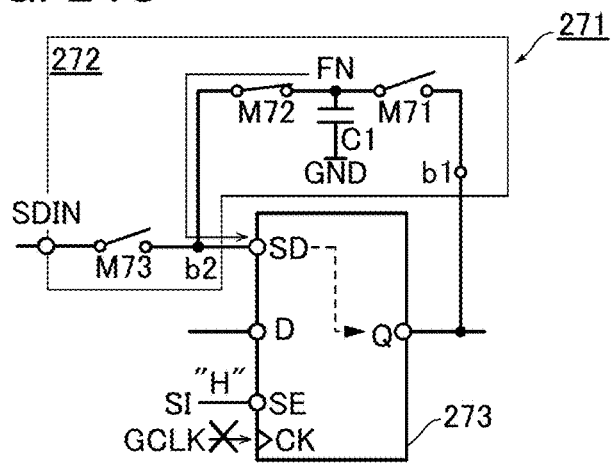

An operation example of the flip-flop 271 is described with reference to circuit diagrams in FIGS. 24A to 24C. In FIGS. 24A to 24C, the transistors M71 to M73 are denoted by switches.

(Normal Operation)

FIG. 24A illustrates an operation example of the flip-flop 271 in an active mode, where the flip-flop 271 performs normal operation. The flip-flop 271 takes data input from the node D and outputs retained data from the node Q in synchronization with the rise (or fall) of the signal GCLK. Since the flip-flop 271 takes data from the node D, the signal SI at "L" (low level) is input to the node SE. Since the signals BKUP_LS and RES_LS are at "L," the transistors M71 to M73 are off (Backup Operation)

First, the input of the signal GCLK is stopped in order to backup data of the scan flip-flop 273. The logic of the node Q is determined by this clock gating. Next, the signal BKUP_LS at "H" (high level) is input to the node BK to turn on the transistors M71 and M73 (FIG. 24B). Since the node FN is electrically connected to the node Q, the logic of the node FN is the same as that of the node Q. When the logic of the node Q is "1," the logic of the node FN is also "1." When the logic of the node Q is "0," the logic of the node FN is also "0."

Next, the signal BKUP_LS at "L" is input to the node BK to turn off the transistor M71. Thus, the node FN is brought into an electrically floating state and the backup operation terminates. After the backup operation, supply of the potential Vdd_core to the scan flip-flop 273 is stopped as necessary. Since the transistors M71 and M72 are OS transistors that have an extremely low off-state current, the backup circuit 272 can retain data for a long time.

(Restore Operation)

To start data restore operation of the scan flip-flop 273, the supply of the potential Vdd_core to the scan flip-flop 273 is restarted. Next, the signal SI at "H" is input to the node SE so that data of the node SD is input to the scan flip-flop 273. The signal RES_LS at "H" is input to the node RE to turn on the transistor M72. The node FN is electrically connected to the node SD, so that data of the node FN is written to the node SD (FIG. 24C). Then, the signal GCLK for one clock cycle is input to write the data of the node SD to the node Q. The scan flip-flop 273 returns to the state immediately after the stop of the input of the signal GCLK. In other words, the logic of the node Q of the scan flip-flop 273 is the same as the logic of the node Q immediately after the stop of the input of the signal GCLK.

The signal RES_LS at "L" is input to the node RE to turn off the transistor M72; thus, the restore operation is terminated. The scan flip-flop 273 starts normal operation by restart of the input of the signal GCLK.

Since the transistors M71 and M72 are OS transistors that have an extremely low off-state current, the backup circuit 272 can retain data for a long time. Input of a negative potential to the back gates of the transistors M71 and M72 is effective in increasing data retention time because cutoff current of the transistors M71 and M72 can be reduced.

When the transistors M71 to M73 are OS transistors, the transistors M71 to M73 can be stacked over the scan flip-flop 273. Thus, the backup circuit 272 can be provided without any change in design and layout of the scan flip-flop 273. Consequently, the area overhead due to the backup circuit 272 can be substantially zero.

The flip-flop 271 can backup and restore data at high speed. For example, the flip-flop 271 can complete backup operation and restore operation within several clock cycles. The backup operation and the restore operation correspond to charging and discharging of the node FN by switching operation of the transistors M71 and M72; thus, energy required for these operations is low as in the case of a DRAM cell. In addition, since the backup circuit 272 does not consume power for data retention, the standby power of the flip-flop 271 can be reduced. Supply of power to the backup circuit 272 is not needed in normal operation; thus, even when the backup circuit 272 is provided, the dynamic power of the flip-flop 271 is not increased substantially.

Note that when the backup circuit 272 is provided, parasitic capacitance of the transistor M71 is added to the node Q. However, the parasitic capacitance of the transistor M71 is lower than parasitic capacitance due to a logic circuit connected to the node Q; thus, the influence of the parasitic capacitance of the transistor M71 on the normal operation of the flip-flop 271 is negligible. In other words, even when the backup circuit 272 is provided, there is no substantial decrease in the performance of the flip-flop 271 in the active mode.

The semiconductor device of this embodiment includes a circuit block that operates using a negative potential. Owing to the potential generation system in Embodiment 2, a negative potential generated with high accuracy can be input to the circuit block, so that the semiconductor device can be operated stably. In addition, owing to the potential generation system, a semiconductor device that requires a negative potential can operate with a single power source.

<<Imaging Device>>

Figure 25A:
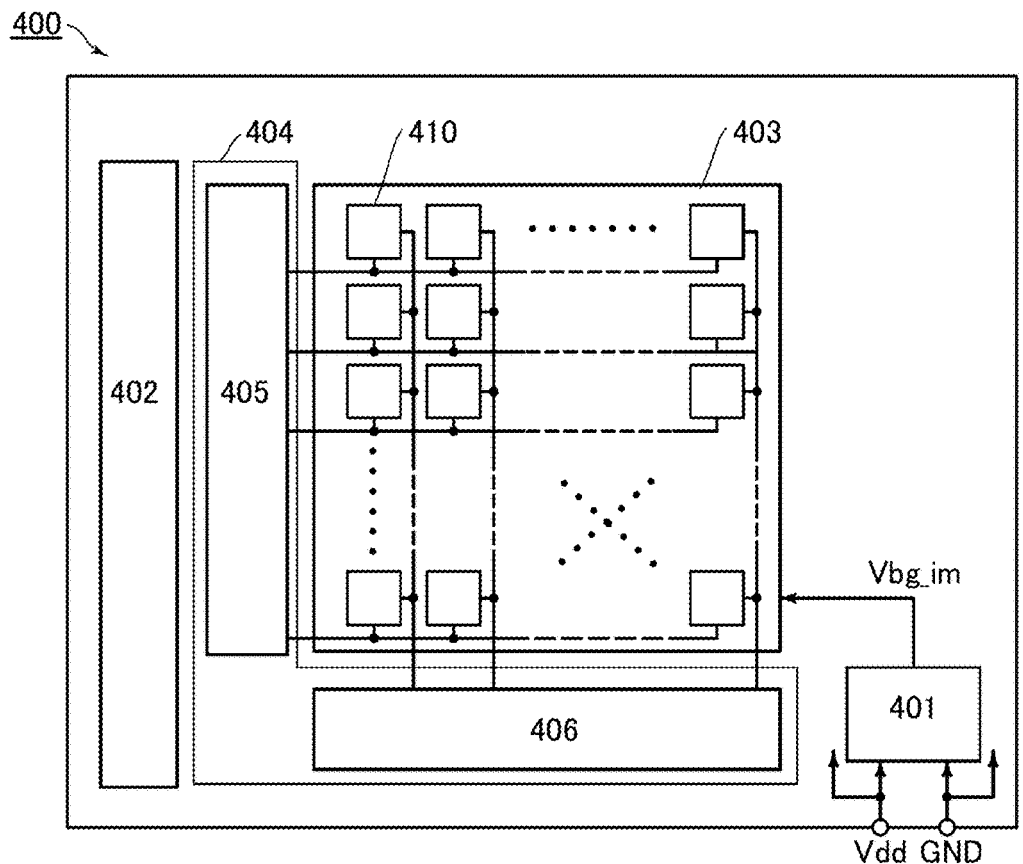
FIG. 25A is a block diagram illustrating a configuration example of an imaging device and FIG. 25B is a circuit diagram illustrating a configuration example of a pixel.
Figure 25B:
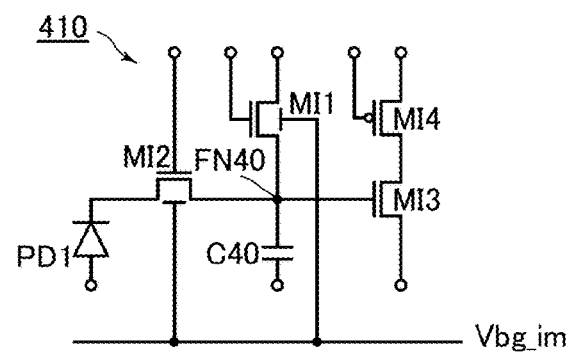

An imaging device 400 illustrated in FIG. 25A includes a potential generation unit 401, a control portion 402, a pixel array 403, and a peripheral circuit 404. The peripheral circuit 404 includes a row driver 405 and a column driver 406. The pixel array 403 includes a plurality of pixels 410 arranged in a matrix of rows and columns. The pixel 410 is an image sensor, and has a function of converting light into electric charge, a function of accumulating electric charge, and the like. FIG. 25B illustrates an example of the pixel 410.

The pixel 410 in FIG. 25B includes a photodiode PD1, transistors MI1 to MI4, a capacitor C40, and a node FN40. The node FN40 serves as a data-holding node. The capacitor C40 is a storage capacitor for holding the voltage of the node FN40. The transistor MI1 is referred to as a reset transistor. The transistor MI1 has a function of resetting the voltage of the node FN40. The transistor MI2 is referred to as an exposure transistor that controls an exposure operation. The transistor MI2 is a pass transistor that controls a conduction state between the node FN40 and the photodiode PD1. With the transistor MI2, the exposure operation timing can be controlled; thus, an image can be taken by a global shutter method. The transistor MI3 is referred to as an amplifier transistor. The transistor MI3 has a function of generating on-state current corresponding to the voltage of the node FN40. The transistor MI4 is referred to as a selection transistor. The transistor MI4 is a pass transistor that controls a conduction state between the transistor MI3 and an output terminal of the pixel 410.

Here, the transistors MI1 and MI2 are OS transistors having back gates, the transistor MI3 is an n-channel Si transistor, the transistor MI4 is a p-channel Si transistor. A potential Vbg_im is input to the back gates of the transistors MI1 and MI2.

A p-n junction or p-i junction diode element in a silicon substrate, a p-i-n diode element using an amorphous silicon film (amorphous silicon film or a microcrystalline silicon film), or the like can be used as the photodiode PD1. Note that another photoelectric conversion element may be used instead of the photodiode in the pixel 410. For example, a diode-connected transistor may be used. A variable resistor or the like utilizing a photoelectric effect may be formed using silicon, germanium, selenium, or the like. A photoelectric conversion element that includes selenium utilizing a phenomenon called avalanche multiplication may be used. In the photoelectric conversion element, a highly sensitive sensor in which the amount of amplification of electrons with respect to the amount of incident light is large can be obtained. Amorphous selenium or crystalline selenium can be used as a selenium-based material. Crystalline selenium may be obtained by, for example, depositing amorphous selenium and then performing heat treatment. When the crystal grain size of crystalline selenium is smaller than a pixel pitch, variation in characteristics between pixels can be reduced.

The potentials Vdd and GND are input as power supply potentials to the imaging device 400. The potential Vdd is used as a drive potential for the OS transistors (the transistors MI1 and MI2). The drive potential for the OS transistors may be generated in the potential generation unit 401.

Potentials other than the potentials Vdd and GND are generated in the potential generation unit 401 and input to the circuits in the imaging device 400. The potential generation unit 401 has a function of generating the potential Vbg_im. Since the potential Vbg_im is set to a negative potential, cut-off current of the transistors MI1 and MI2 can be reduced. Thus, variation in potential of the node FN40 can be suppressed, and the imaging device 400 can perform high-accuracy imaging.

The potential generation unit 401 preferably includes the voltage holding portion 43 described in either of the above embodiments. The voltage holding portion 43 can apply a negative potential and/or a positive potential. For example, the potential Vbg_im is generated by the voltage holding portion 43 and supplied to the back gates of the transistors MI1 and MI2.

The control portion 41, the voltage generation portion 42, and the like described in either of the above embodiments may be included in the potential generation unit 401, or in another circuit region such as the control portion 402.

<Programmable Circuit>

A programmable circuit will be described below as an example of the semiconductor device of one embodiment of the present invention. A programmable circuit 700 includes a plurality of PLEs 701 arranged in an array. Here, the expression "arranged in an array" means that the PLEs are arranged in a matrix at regular intervals, and the arrangement is not limited to that illustrated in FIG. 26.

Figure 26:
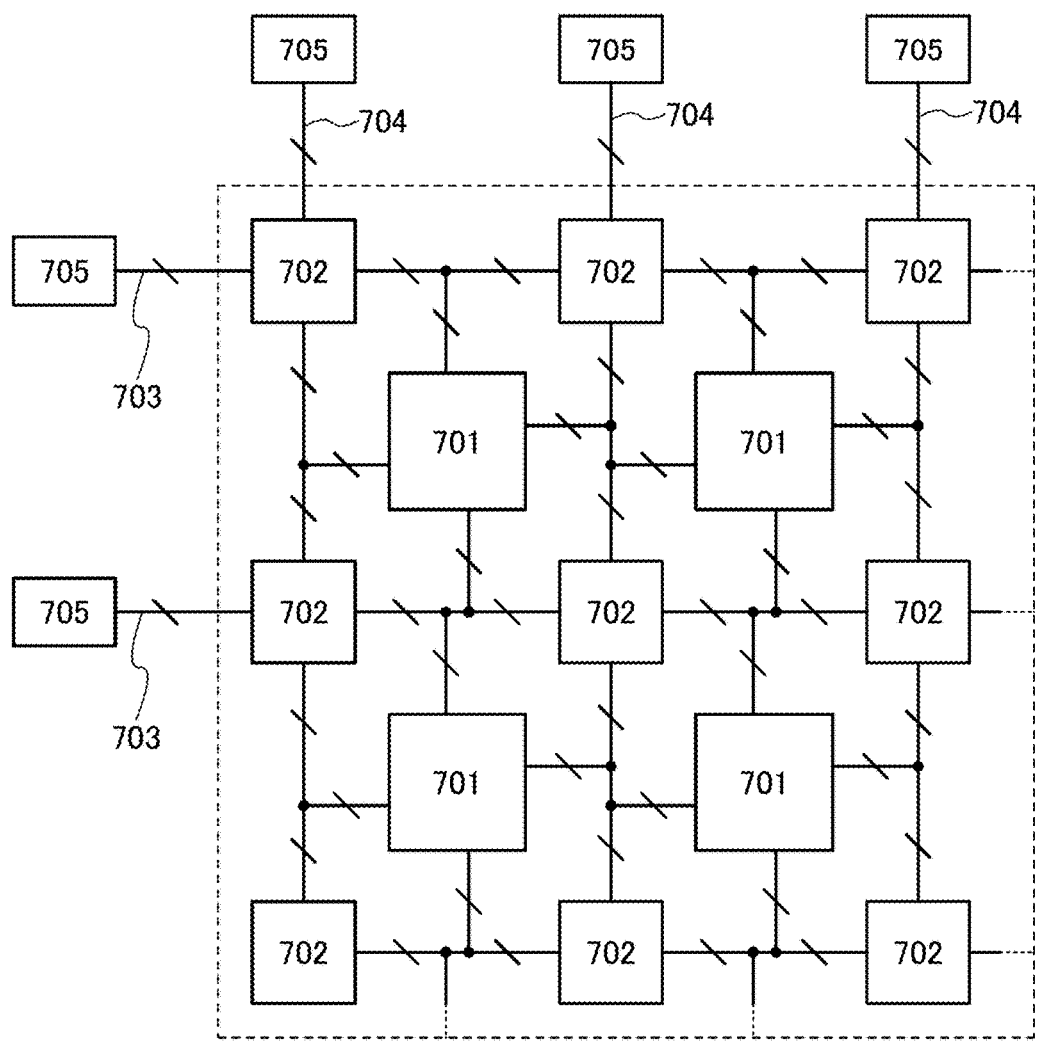
FIG. 26 illustrates a configuration example of a programmable circuit.

A plurality of wirings are formed to surround the PLEs 701. In FIG. 26, these wirings consist of a plurality of horizontal wiring groups 703 and a plurality of vertical wiring groups 704. A wiring group is a bundle of wirings. A PSE 702 is provided at an intersection of the horizontal wiring group 703 and the vertical wiring group 704. The horizontal wiring groups 703 and the vertical wiring groups 704 are connected to input/output terminals 705 to transmit and receive signals to and from a circuit provided outside the programmable circuit 700.

The input/output terminals 705 are connected to the horizontal wiring groups 703 and the vertical wiring groups 704 provided around the PLEs 701. For example, in FIG. 26, the input/output terminals 705 are connected to the horizontal wiring groups 703 and the vertical wiring groups 704 on the left, right, top, and bottom sides. With the use of the horizontal wiring groups 703 and the vertical wiring groups 704, each of the PLEs 701 can be connected to other PLEs 701. A connection path between one PLE 701 and another PLE 701 is determined by a switch included in the PSE 702.

The on/off state of the switch in the PSE 702 for switching connection between wirings is determined by a configuration memory that retains configuration data. The configuration memory with a rewritable structure, which is provided in the PSE 702, preferably includes a nonvolatile memory element to prevent stored configuration data from being lost by stop of supply of power supply voltage.

The PLE 701 includes, for example, a look-up table (LUT), a flip-flop, and a configuration memory.

The LUT can be used to change a logic function to be determined, depending on the content of configuration data stored in the configuration memory.

The flip-flop holds a signal output from the LUT and outputs an output signal corresponding to the signal in synchronization with the clock signal CLK.

Any of the above-described memory devices can be used for the configuration memories included in the PLE 701 and the PSE 702, for example. Voltage is preferably supplied to the memory device from the voltage holding portion described in either of the above embodiments.

(Embodiment 4)

In this embodiment, a semiconductor device or the like having a function of directly comparing two negative voltages is described as a comparator that can be used as the comparator 51 described in Embodiment 1 or the like. The terminal CI, the terminal REF, and the terminal CO described in Embodiment 1 are applicable to a terminal IN1, a terminal IN2, and a terminal OUT1 of the comparator described in this embodiment, respectively.

The comparator described in this embodiment preferably includes an OS transistor. The OS transistor preferably has a back gate. A structure example of a semiconductor device including the OS transistor and the transistors FE1 and FE2 described in Embodiment 1 will be described later in another embodiment.

<Configuration Example 1 of Comparator>

Figure 27A:
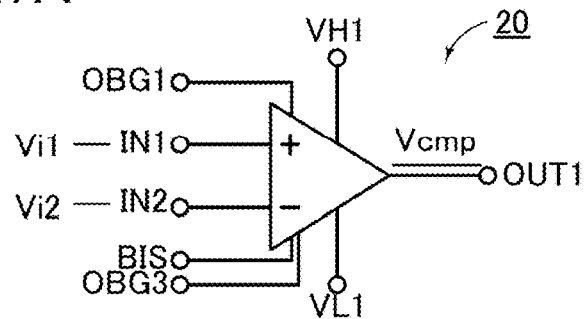
FIGS. 27A and 27B are circuit diagrams each illustrating a configuration example of a comparator circuit and FIG. 27C is a diagram schematically showing drain current-gate voltage characteristics of a transistor.

FIG. 27A is a circuit diagram illustrating a configuration example of a comparator. A comparator 20 includes terminals IN1, IN2, OUT1, VH1, VL1, BIS, OBG1, and OBG3. The comparator 20 has a function of comparing a potential Vi1 of the terminal IN1 and a potential Vi2 of the terminal IN2 and a function of outputting a potential Vcmp, which has a potential level corresponding to the comparison results, from the terminal OUT1.

In the example of FIG. 27A, the terminal IN1 and the terminal IN2 are a non-inverting input terminal (terminal (+)) and an inverting input terminal (terminal (−)), respectively. Therefore, when Vi1<Vi2 is satisfied, the potential Vcmp output from the terminal OUT1 is at a low level, whereas when Vi1>Vi2 is satisfied, the potential Vcmp is at a high level.

The terminal VH1 is an input terminal for supplying a high power supply potential Vdd (hereinafter referred to as potential Vdd). The terminal VL1 is an input terminal for supplying a low power supply potential Vss (hereinafter referred to as potential Vss). Terminals BIS, OBG1, and OBG3 are input terminals for bias potentials.

Figure 27B:
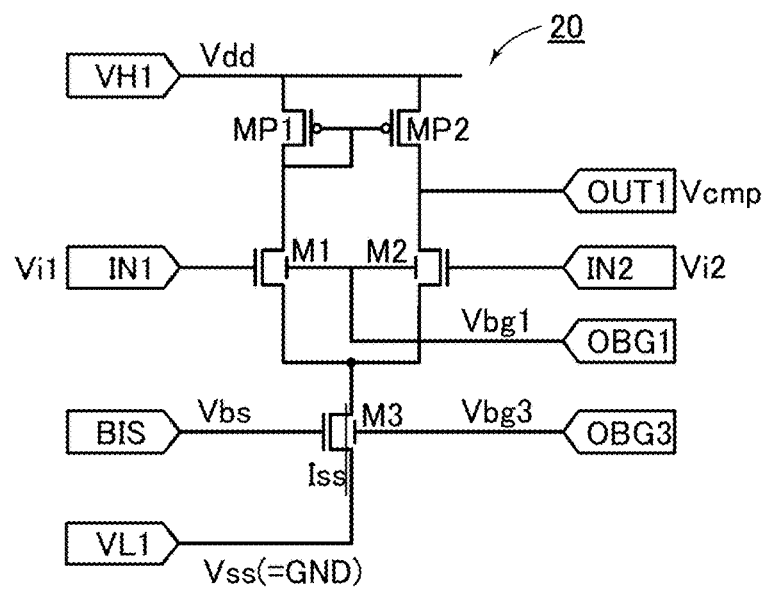

FIG. 27B illustrates a specific configuration example of the comparator 20. FIG. 27B is an example in which the comparator 20 is composed of a differential amplifier circuit having a differential pair. The comparator 20 includes transistors MP1, MP2, M1, M2, and M3. The differential amplifier circuit is composed of these transistors.

The differential pair is composed of the transistors M1 and M2. A gate of the transistor M1 is electrically connected to the terminal IN1. A gate of the transistor M2 is electrically connected to the terminal IN2. Each back gate of the transistors M1 and M2 is electrically connected to the terminal OBG1. A drain of the transistor M2 is electrically connected to the terminal OUT1.

The transistor M3 serves as a current source for supplying a current Iss. A gate, a back gate, and a source of the transistor M3 are electrically connected to the terminal BIS, the terminal OBG3, and the terminal VL1, respectively. A bias potential Vbg3 for controlling a back gate potential of the transistor M3 (hereinafter referred to as potential Vbg3) is input to the terminal OBG3. For example, the potential Vss is input to the terminal OBG3. A bias potential Vbs for determining the level of the current Iss (hereinafter referred to as potential Vbs) is input to the terminal BIS.

The transistors MP1 and MP2 serve as loads for the transistors M1 and M2, respectively. A current mirror circuit is composed of the transistors MP1 and MP2 in this example.

The transistors MP1 and MP2 are p-channel transistors, and there is no particular limitation on the type of the transistors. For example, the transistors MP1 and MP2 are Si transistors.

The transistors M1 to M3 are n-channel transistors including back gates. As each of the transistors M1 to M3, a transistor whose back gate and gate face to each other with a channel formation region sandwiched therebetween can be used.

A semiconductor containing a metal oxide (an oxide semiconductor), silicon, or the like can be used for channel formation regions of the transistors M1, M2, and M3. The transistors M1, M2, and M3 are preferably OS transistors. The transistor 100 or the transistor 200 described later can be used as the OS transistor.

A metal oxide used for a channel formation region, an OS transistor, and a structure example of a semiconductor device in which a Si transistor and an OS transistor are stacked will be described in Embodiment 6.

<Operation Example of Comparator>

The case where the transistors M1 to M3 do not have back gates is described here. Each of transistors MN1 to MN3 has Vt higher than 0 V.

Figure 33:
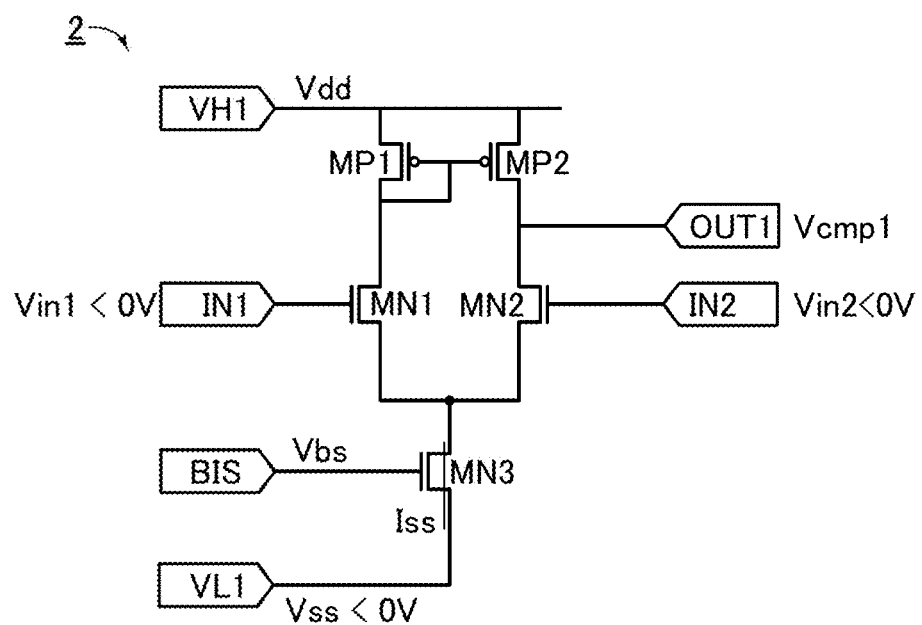
FIG. 33 is a circuit diagram illustrating a configuration example of a comparator circuit.

To provide a comparator 2 illustrated in FIG. 33 with a function of comparing the potential Vi1 and the potential Vi2, the transistors MN1 and MN2 need to be turned on and the current Iss needs to flow in the transistor MN3. In the case where the potentials Vdd, Vbs, Vi1, and Vi2 are 3 V, 3 V, −2 V, and −3 V, respectively, for example, the potential Vss needs to be lower than −3 V. In other words, the potential Vss in the comparator 2 becomes a negative potential when the potentials Vi1 and Vi2 are negative potentials. High-accuracy supply of the potential Vss is required for a high-accuracy comparison by the comparator 2; however, the negative potential Vss causes a reduction in comparison accuracy. Thus, a comparator more complex than the comparator 2 is required to compare two negative potentials at high accuracy.

When the substrate potential is a ground potential (=0 V) and the negative potential Vss is input to the source of the n-channel transistor (the transistor MN3) in the comparator 2, a forward bias potential is applied to a parasitic diode (a p-n junction diode) between a p-well and a source region. This causes backflow of large current from the substrate to the source region. In order to prevent the backflow of current, a triple-well n-channel transistor in which an n-channel transistor is surrounded by an n-well is generally employed (e.g., see FIG. 3b and FIG. 5 in Patent Document 3). However, the area of the comparator 2 is increased due to the triple-well n-channel transistor.

This embodiment can provide the comparator 20 that is free of the problem. An operation example of the comparator 20 is described with reference to FIGS. 27B and 27C. The example described here is the operation of the comparator 20 when the potentials Vdd, Vbs, Vi1, and Vi2 are 3 V, 3 V, −2 V, and −3 V, respectively.

Figure 27C:
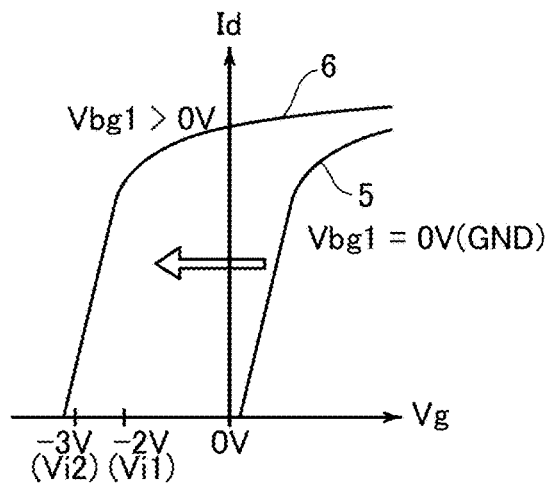

FIG. 27C schematically shows drain current-gate voltage ($I_d$–$V_g$) characteristics of the transistors M1 and M2. A curve 5 represents the $I_d$–$V_g$ characteristics when the potential Vbg1 is 0 V. A curve 6 represents the $I_d$–$V_g$ characteristics when the potential Vbg1 is a positive potential.

When the potential Vbg1 is 0 V and the potential Vss is a ground potential (hereinafter also referred to as a potential GND), the Vt of the transistors M1 and M2 are higher than the potentials Vi1 and Vi2, respectively; thus, the comparator 20 is out of operation.

By the input of a positive potential to the terminal OBG1, the Vt of the transistors M1 and M2 can be shifted on the negative-potential side to be lower than the potentials Vi1 and Vi2. For example, by the input of the potential Vdd to the terminals OBG1 and OBG3, the Vt of the transistors M1 to M3 can be shifted on the negative-potential side without the increase in number of potentials needed for the operation.

Even when the potential Vss is 0 V (the ground potential), the transistors M1 and M2 can be turned on owing to the characteristics of the curve 6. The comparator 20 can thus be operated to detect a difference between the potentials Vi1 and Vi2. The comparator 20 outputs the high-level potential Vcmp because Vi1>Vi2.

As described above, the comparator 20 can directly compare two negative potentials without a complex circuit configuration. Since the potential Vss can be 0 V (ground potential), the comparator 20 can have high accuracy. Since OS transistors are used as the transistors M1 to M3 instead of a triple-well structure, the channel formation regions of the transistors M1 to M3 can be insulated from the substrate. As a result, the circuit area of the comparator 20 can be reduced.

Other configuration examples of the comparator will be described below.

<Configuration Examples 2 to 4 of Comparator>

Here, modification examples of the transistor M3 functioning as a current source of the comparator 20 are described. The back gate of the transistor M3 illustrated in FIG. 27B may be electrically connected to the front gate or drain thereof. Alternatively, a transistor having no back gate may be used instead of the transistor M3 illustrated in FIG. 27B. The use of the transistor M3 having a back gate as a current source can produce the following effect, for example. As is understood from FIG. 27C, the potential Vbs can be a low potential such as GND when the positive potential Vbg3 is input to the back gate of the transistor M3. The potential Vbg3 can be used to control the transconductance of the comparator 20; as a result, the comparator 20 can operate at high speed.

Hereinafter, configuration examples of the comparator will be described with reference to FIGS. 28A to 28C, FIG. 29, FIGS. 30A to 30C, FIGS. 31A to 31C, and FIGS. 32A and 32B.

A modification example of a current source of the comparator 20 is described. A comparator 21 illustrated in FIG. 28A includes a transistor M13 without a back gate instead of the transistor M3. The structure of the transistor M13 is similar to that of the transistor M3 except the absence of back gate.

When the transistor M3 having a back gate is used as a current source, the following effect can be obtained, for example. As is found from FIG. 27C, the potential Vbs can be lowered (e.g., GND) by the input of the positive potential Vbg3 to the back gate of the transistor M3. The potential Vbg3 can be used to control the transconductance of the comparator 20; as a result, the comparator 20 can be operated at high speed.

Figure 28A:
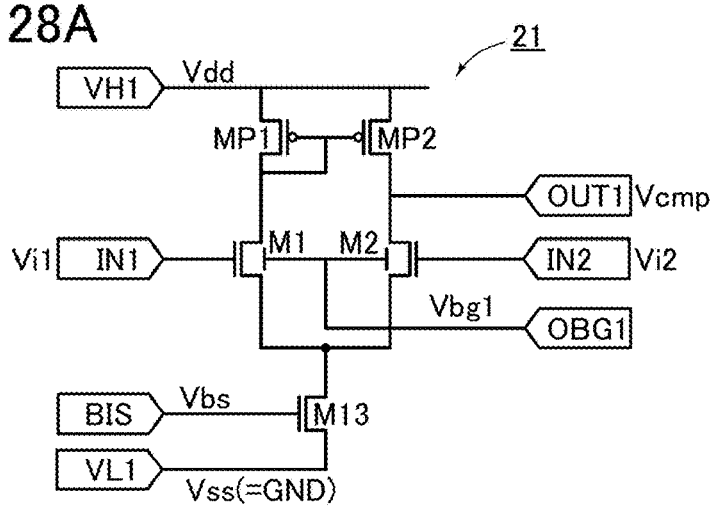
FIGS. 28A to 28C are circuit diagrams each illustrating a configuration example of a comparator circuit.
Figure 28B:
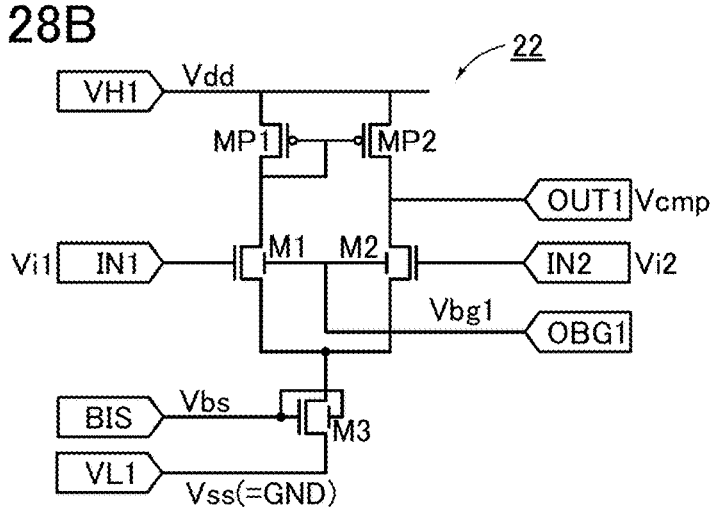
Figure 28C:
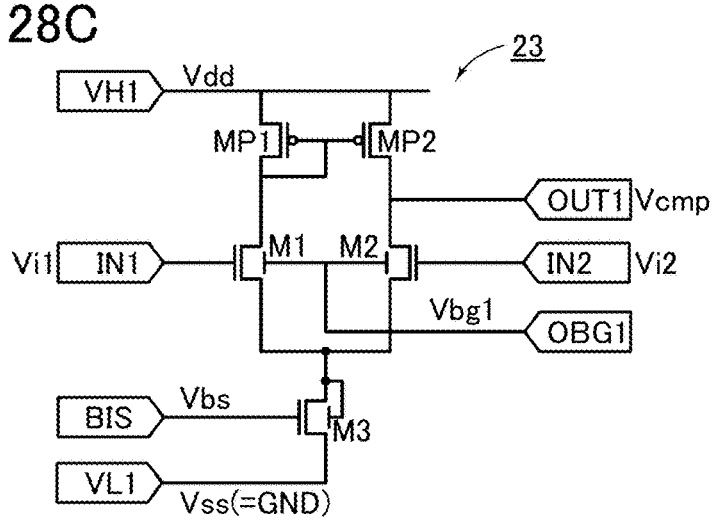
Figure 29:
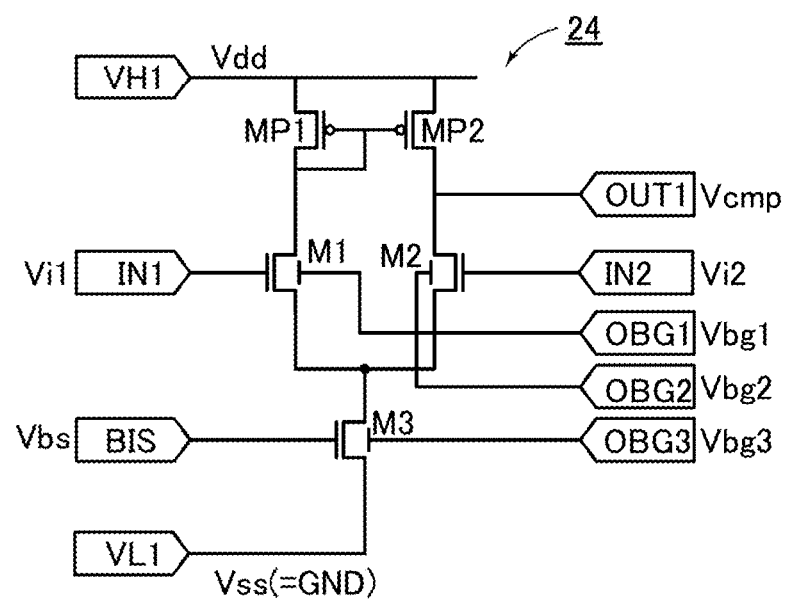
FIG. 29 is a circuit diagram illustrating a configuration example of a comparator circuit.

Comparators 22 and 23 are modification examples of the comparator 20 (FIGS. 28B and 28C). The comparator 22 includes the transistor M3 whose back gate is electrically connected to its gate. The comparator 23 includes the transistor M3 whose back gate is electrically connected to its drain.

<Configuration Example 5 of Comparator>

A modification example of a differential pair is described here. A comparator 24 illustrated in FIG. 29 includes a terminal OBG2. The terminal OBG2 is a terminal for inputting a bias potential. The potential Vbg2 is input to the terminal OBG2. The terminal OBG2 is electrically connected to a back gate of the transistor M2.

For example, when the potential Vss, Vbg1, or Vbg2 is input to the terminal OBG3, the number of potentials the comparator 24 handle can be reduced. In addition, when one of the potentials Vbg1 and Vbg2 is the potential Vdd, the number of potentials the comparator 24 handles can be reduced.

In the comparator 24, the back gate potentials of the transistors M1 and M2 can be controlled independently. Although the transistors M1 and M2 are designed to have the same electrical characteristics, in practice, the electrical characteristics of the transistors M1 and M2 do not perfectly correspond to each other due to variation in process. In view of this, the potentials Vbg1 and Vbg2 are determined to cancel an offset voltage.

FIGS. 30A to 30C and FIGS. 31A to 31C illustrate modification examples of the load.

<Configuration Examples 6 to 8 of Comparator>

Figure 30A:
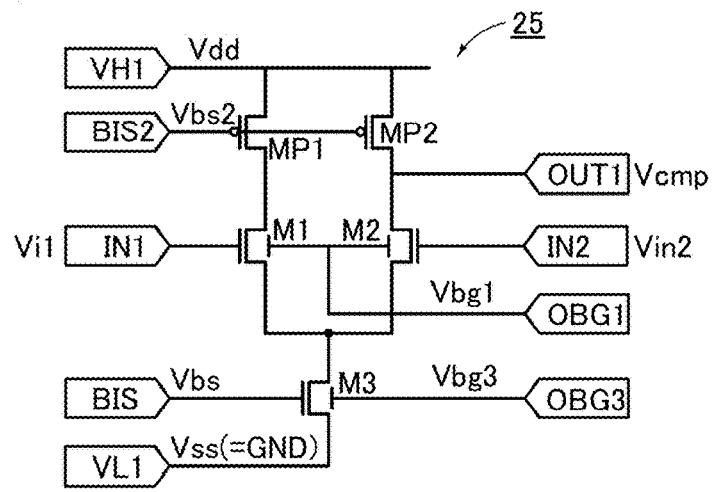
FIGS. 30A to 30C are circuit diagrams each illustrating a configuration example of a comparator circuit.

In a comparator 25 illustrated in FIG. 30A, the transistors MP1 and MP2 serve as constant current sources. Gates of the transistors MP1 and MP2 are electrically connected to a terminal BIS2. The bias potential Vbs2 is input to the terminal BIS2.

Figure 30B:
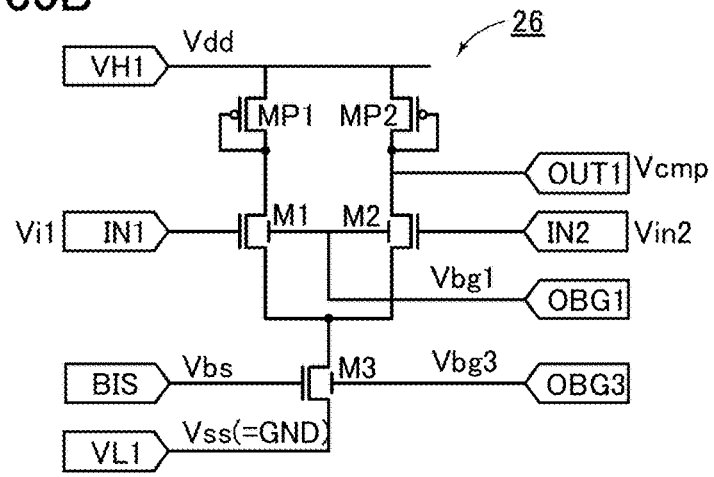

In a comparator 26 illustrated in FIG. 30B, the transistors MP1 and MP2 are diode-connected transistors.

Figure 30C:
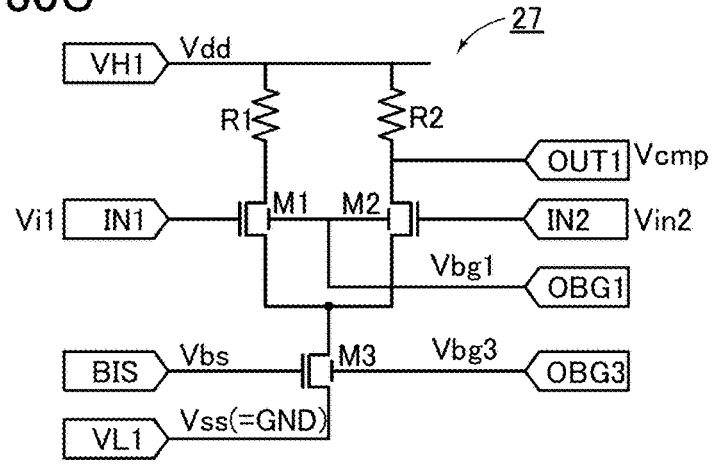

In a comparator 27 illustrated in FIG. 30C, resistors R1 and R2 are provided instead of the transistors MP1 and MP2, respectively.

<Configuration Examples 9 to 11 of Comparator>

Figure 31A:
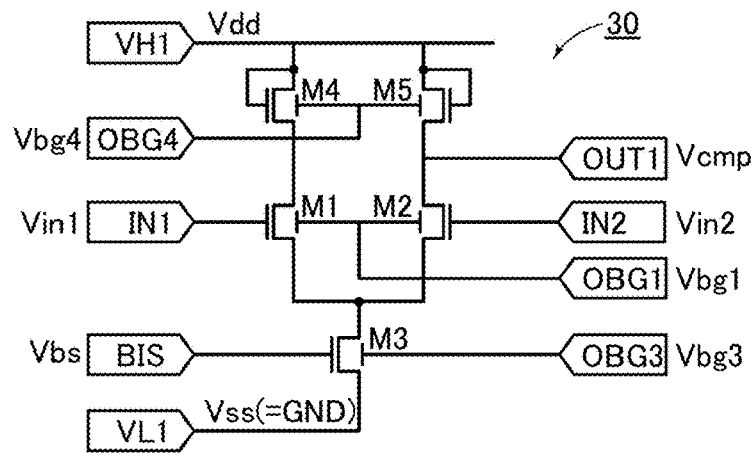
FIGS. 31A to 31C are circuit diagrams each illustrating a configuration example of a comparator circuit.
Figure 31B:
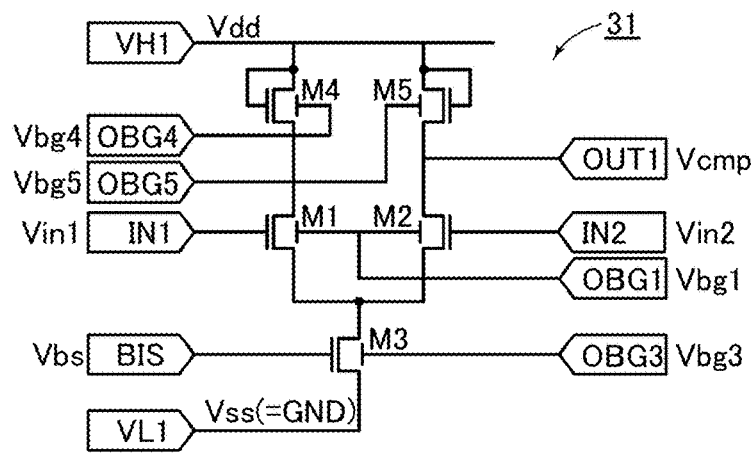
Figure 31C:
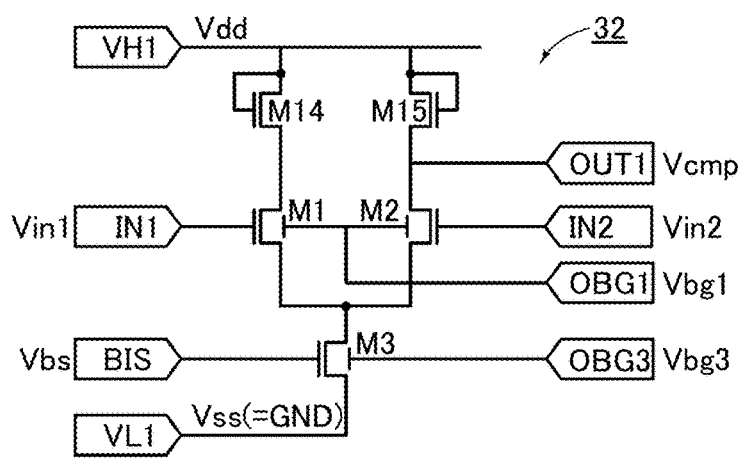

Comparators illustrated in FIGS. 31A to 31C are each an example in which a load is formed using two n-channel transistors.

A comparator 30 illustrated in FIG. 31A includes a terminal OBG4 and transistors M4 and M5. The transistors M4 and M5 are diode-connected transistors and serve as loads.

The transistors M4 and M5 each have a back gate. The transistors M4 and M5 can be OS transistors like the transistor M1. The back gates of the transistors M4 and M5 are electrically connected to the terminal OBG4. The terminal OBG4 is a terminal for inputting a bias potential. A potential Vbg4 is input to the terminal OBG4. The back gate potentials of the transistors M4 and M5 are adjusted with the potential Vbg4, whereby drain current flowing in the transistors M4 and M5 can be adjusted. For example, when the potential Vbg4 is a positive potential, the transistors M4 and M5 can have higher current drive capabilities.

A comparator 31 illustrated in FIG. 31B is a modification example of the comparator 30. The comparator 31 includes a terminal OBG5. The back gate of the transistor M5 is electrically connected to the terminal OBG5. The terminal OBG5 is a terminal for inputting a bias potential. A potential Vbg5 is input to the terminal OBG5.

In the comparator 31, the back gate potentials of the transistors M4 and M5 can be controlled independently. In other words, by the input of the potentials Vbg4 and Vbg5, the amount of Vt shift of the transistor M4 and that of the transistor M5 can be determined independently. The potentials Vbg4 and Vbg5 are determined to cancel variation in electrical characteristics of the transistors M4 and M5.

A comparator 32 illustrated in FIG. 31C is a modification example of the comparator 30. The comparator 31 includes, instead of the transistors M4 and M5, transistors M14 and M15 which do not have a back gate. The transistors M14 and M15 can be OS transistors like the transistor M1, or may be Si transistors.

<Configuration Examples 12 and 13 of Comparator>

Figure 32A:
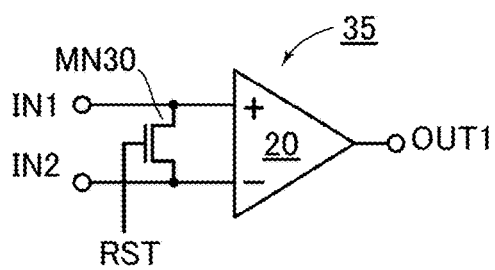
FIGS. 32A and 32B are circuit diagrams each illustrating a configuration example of a comparator circuit.
Figure 32B:
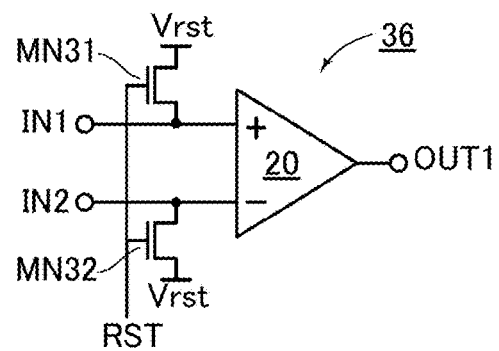

FIGS. 32A and 32B illustrate configuration examples of a resettable comparator.

A comparator 35 illustrated in FIG. 32A corresponds to the comparator 20 provided with a transistor MN30. A comparator 36 illustrated in FIG. 32B corresponds to the comparator 20 provided with transistors MN31 and MN32. Note that the comparator described in any of the other configuration examples may be provided as the comparator 35 or the comparator 36.

The transistor MN30 of the comparator 35 serves as a switch for setting the terminals IN1 and IN2 to the same potential. A signal RST (a reset signal) is input to a gate of the transistor MN30.

The transistor MN31 of the comparator 36 has a function of resetting the potential of the terminal IN1 to a potential Vrst. The transistor MN32 has a function of resetting the potential of the terminal IN2 to the potential Vrst. The signal RST is input to gates of the transistors MN31 and MN32. For example, the potential Vss is input as the potential Vrst.

The transistor MN30 may be a Si transistor or an OS transistor. When the transistor MN30 is an OS transistor, the transistor MN30 can have a back gate that is electrically connected to the gate. The transistor MN30 may be a p-channel transistor. The same is applied to the transistors MN31 and MN32.

<Operation Example of Comparator>

In Patent Documents 1 to 3, a comparator is used for monitoring a negative potential generated by a charge pump circuit. For example, in a comparator in Patent Document 2, a negative potential generated by a charge pump circuit is converted into a positive potential by a divider circuit, and the positive potential is compared to a positive reference potential. The same applies to the comparator in Patent Document 3. In contrast, the comparator 20 can directly compare two negative potentials and convert the two input potentials Vi1 and Vi2 into negative potentials. The comparator 20 is described below.

(Embodiment 5)

In this embodiment, an IC chip, an electronic component, an electronic device, and the like will be described as examples of a semiconductor device.

<Example of Manufacturing Method of Electronic Component>

Figure 34A:
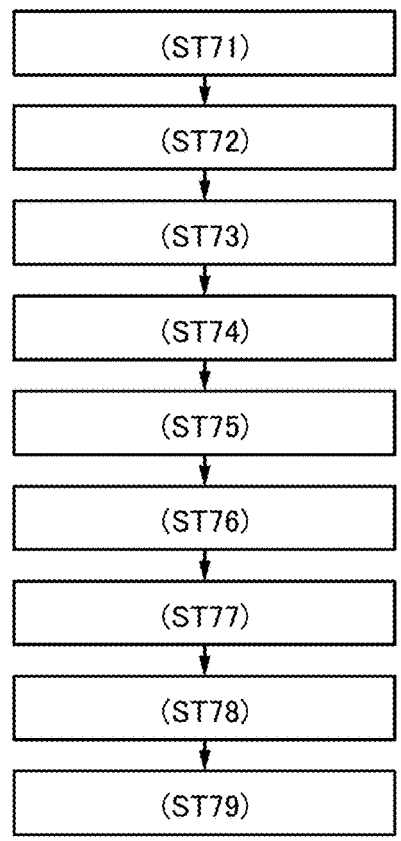
FIG. 34A is a flow chart showing an example of a method for manufacturing an electronic component.

FIG. 34A is a flow chart showing an example of a method for manufacturing an electronic component. The electronic component is also referred to as a semiconductor package or an IC package. The electronic component has a plurality of standards and names depending on a terminal extraction direction and a terminal shape. Thus, examples of the electronic component are described in this embodiment.

A semiconductor device including a transistor is completed by integrating detachable components on a printed board through the assembly process (post-process). The post-process can be completed through steps shown in FIG. 34A. Specifically, after an element substrate obtained in the pre-process is completed (Step ST71), a back surface of the substrate is ground. The substrate is thinned in this step to reduce warpage or the like of the substrate in the pre-process and to reduce the size of the component. Then, a dicing step of dividing the substrate into a plurality of chips is performed (Step ST72).

Figure 34B:
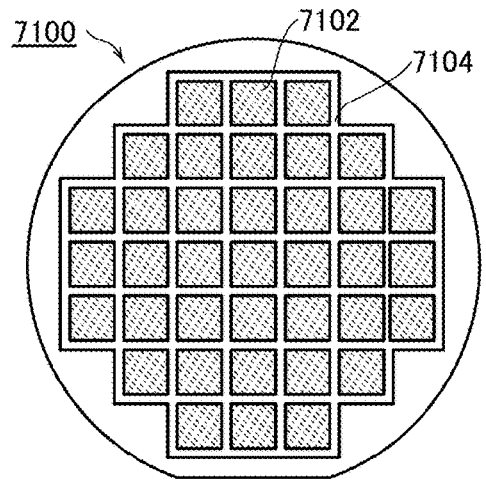
FIG. 34B is a top view of a semiconductor wafer.
Figure 34C:
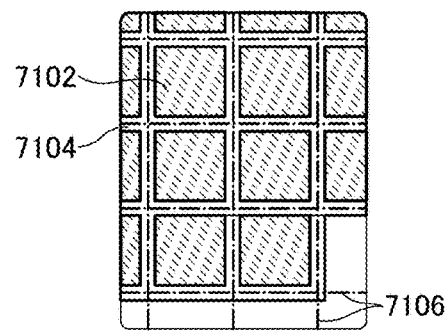
FIG. 34C is an enlarged view of the top view.

FIG. 34B is a top view of a semiconductor wafer 7100 on which a dicing process is not yet performed. FIG. 34C is a partially enlarged view of FIG. 34B. A plurality of circuit regions 7102 is provided on the semiconductor wafer 7100. A semiconductor device of one embodiment of the present invention (e.g., the holding circuit, the memory device, the imaging device, or the MCU) is provided in each circuit region 7102.

Figure 34D:
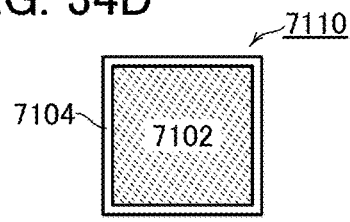
FIG. 34D is a schematic diagram illustrating a structure example of a chip.

The circuit regions 7102 are each surrounded by a separation region 7104. Separation lines (also referred to as "dicing lines") 7106 are set at a position overlapping with the separation regions 7104. In the dicing step (Step ST72), the semiconductor wafer 7100 is cut along the separation lines 7106, whereby chips 7110 including the circuit regions 7102 are cut out from the semiconductor wafer 7100. FIG. 34D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Thus, semiconductor devices can be manufactured with improved productivity.

After Step ST72, the divided chips are separately picked up, placed on a lead frame, and bonded thereto in a die bonding step (Step ST73). In the die bonding step, the chip may be bonded to the lead frame by an appropriate method depending on the product, for example, with a resin or a tape. As the bonding method, a suitable method for the product may be selected; for example, the chips and the lead frame may be bonded with a resin or tape. In the die bonding step, the chip may be mounted on an interposer and bonded thereto. In a wire bonding step, a lead of the lead frame and an electrode on the chip are electrically connected to each other with a metal wire (Step ST74). A silver line or a gold line can be used as the metal wire. The wire bonding may be either ball bonding or wedge bonding.

A wire-bonded chip is subjected to a molding step of sealing the chip with an epoxy resin or the like (Step ST75). By the molding step, the inside of the electronic component is filled with a resin, thereby reducing damage to the circuit portion and the wire embedded in the component caused by external mechanical force as well as reducing deterioration of characteristics due to moisture or dust. The lead of the lead frame is plated. After that, the lead is cut and processed (Step ST76). The plating process prevents rust of the lead and facilitates soldering at the time of mounting the chip on a printed board in a later step. Next, printing process (marking) is performed on a surface of the package (Step ST77). After a testing step (Step ST78), the electronic component is completed (Step ST79). An electronic component including the semiconductor device described in the above embodiment can achieve low power consumption and a small size.

Figure 34E:
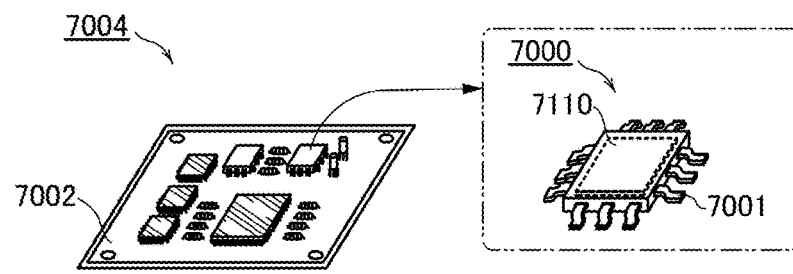
FIG. 34E is a schematic perspective view illustrating a structure example of an electronic component.

FIG. 34E illustrates a schematic perspective view of the completed electronic component. FIG. 34E illustrates a schematic perspective view of a quad flat package (QFP) as an example of the electronic component. As illustrated in FIG. 34E, an electronic component 7000 includes a lead 7001 and a chip 7110.

The electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. When an electronic device includes the electronic component 7000, the power consumption of the electronic device can be reduced. Alternatively, the electronic device can easily have a smaller size.

The electronic component 7000 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Structure examples of electronic devices are described with reference to FIGS. 35A to 35C and FIGS. 36A to 36E. A touch panel device including a touch sensor is preferably used in display portions of the electronic devices illustrated in FIG. 35A and the like. With the touch panel device, the display portion can also function as an input portion of the electronic device.

Figure 35A:
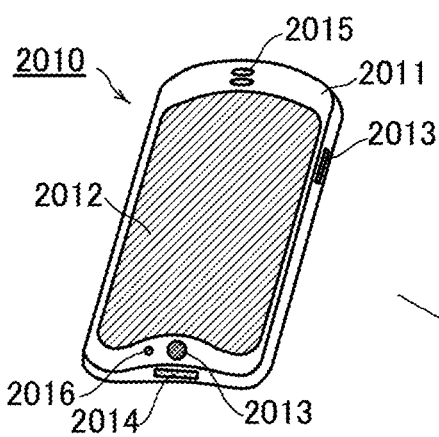
FIGS. 35A to 35C illustrate structure examples of electronic devices.

An information terminal 2010 illustrated in FIG. 35A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various kinds of operation such as making a call, inputting letters, and switching screen images on the display portion 2012 can be performed by touching the display portion 2012 with a finger or the like. The information terminal 2010 can be operated by inputting sound from the microphone 2016. Moreover, a variety of operations such as power on/off operation and screen switching of the display portion 2012 can be performed by pressing the operation button 2013.

Figure 35B:
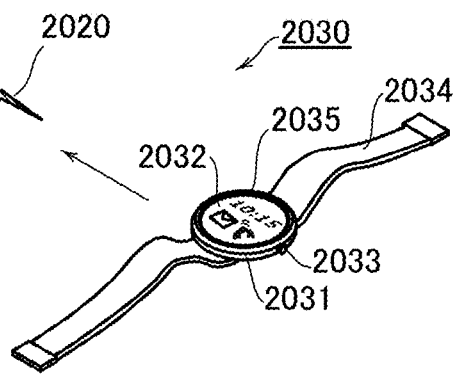

FIG. 35B illustrates an example of a watch-type information terminal. An information terminal 2030 includes a housing 2031, a display portion 2032, a winding crown 2033, a belt 2034, and a sensing unit 2035. The information terminal 2030 can be operated by rotating the winding crown 2033. The information terminal 2030 can be operated by touching the display portion 2032 with a finger.

The sensing unit 2035 has a function of obtaining information on usage environment and biological information. The sensing unit 2035 may be provided with a microphone, an imaging element, an acceleration sensor, a direction sensor, a pressure sensor, a temperature sensor, a humidity sensor, an illumination sensor, a positioning sensor (e.g., a global positioning system (GPS)), or the like.

Wireless communication devices with the same standard may be incorporated into the information terminal 2010 and the information terminal 2030 so that interactive communication is possible through a wireless signal 2020. When the information terminal 2010 receives an incoming e-mail or call, for example, information notifying the incoming e-mail or call can be displayed on the display portion 2032 of the information terminal 2030.

Figure 35C:
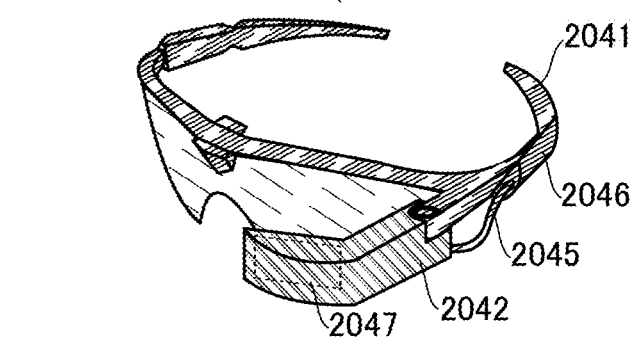

FIG. 35C illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a storage device, and a variety of electronic components. Power is supplied from the battery 2046 to the display portion 2047 and the electronic components in the housing 2042 through the cable 2045. A variety of information such as an image or the like transmitted wirelessly is displayed on the display portion 2047.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, the biological sensor obtains biological information about the user and then stores the biological information in the storage device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 36A:
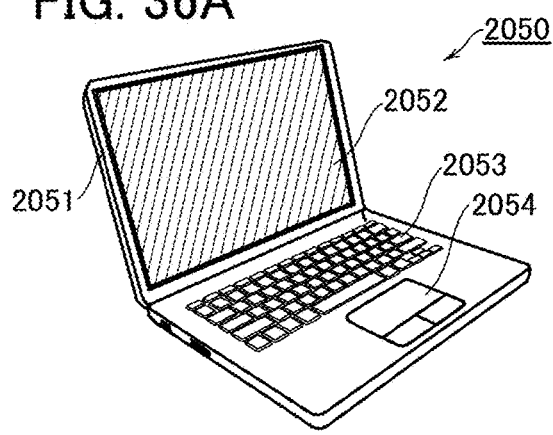
FIGS. 36A to 36E illustrate structure examples of electronic devices.

A notebook personal computer (PC) 2050 in FIG. 36A includes a housing 2051, a display portion 2052, a keyboard 2053, and a pointing device 2054. The notebook PC 2050 can be operated by touch operation on the display portion 2052.

Figure 36B:
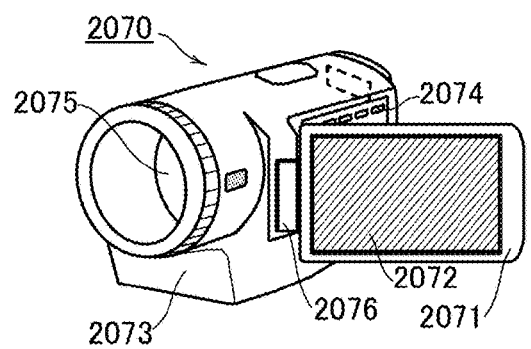

A video camera 2070 in FIG. 36B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched depending on the angle between the housing 2071 and the housing 2073 at the joint 2076. A variety of operations such as start and stop of recording, zoom adjustment, and change of shooting range can be executed by touch operation on the display portion 2072.

Figure 36C:
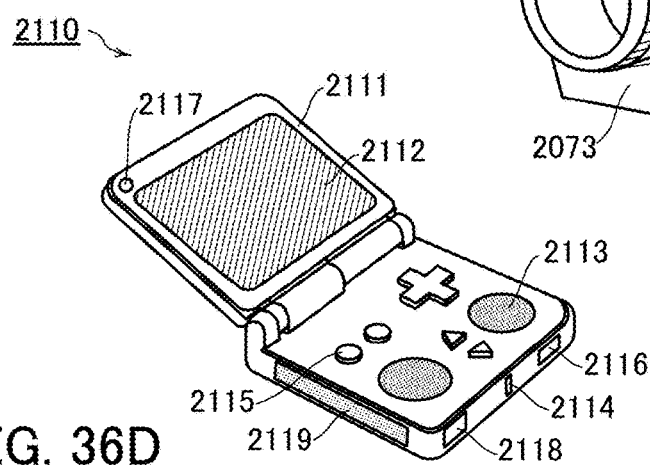

A portable game console 2110 in FIG. 36C includes a housing 2111, a display portion 2112, speakers 2113, an LED lamp 2114, operation key buttons 2115, a connection terminal 2116, a camera 2117, a microphone 2118, and a recording medium read portion 2119.

Figure 36D:
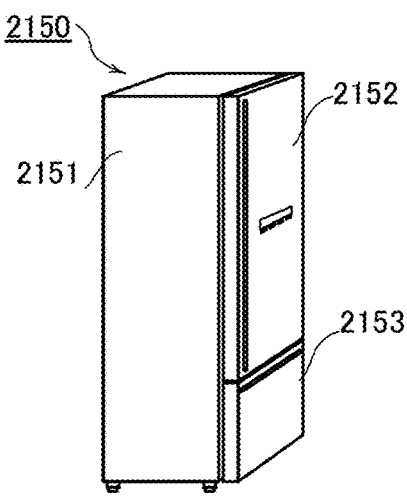

An electric refrigerator-freezer 2150 in FIG. 36D includes a housing 2151, a refrigerator door 2152, a freezer door 2153, and the like.

Figure 36E:
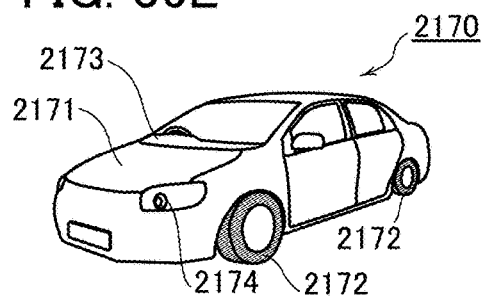

A motor vehicle 2170 in FIG. 36E includes a car body 2171, wheels 2172, a dashboard 2173, lights 2174, and the like. The processor described in Embodiment 2 is used as each of processors in the motor vehicle 2170.

(Embodiment 6)

In this embodiment, the semiconductor device of one embodiment of the present invention and a transistor included in the semiconductor device will be described.

<Transistor 100>

Figure 37A:
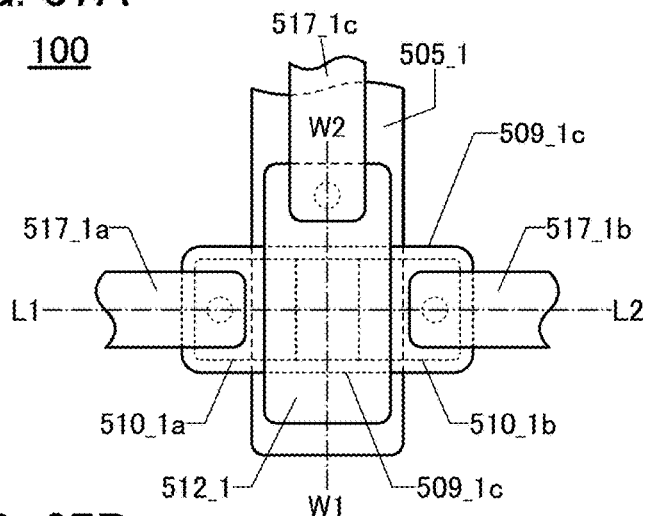
FIGS. 37A to 37D are a top view and cross-sectional views of a transistor.
Figure 37B:
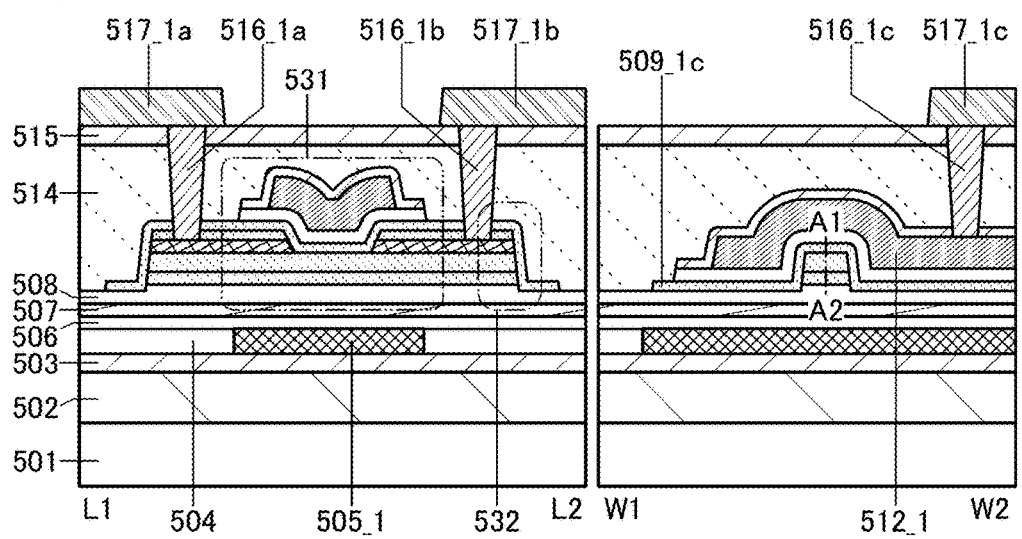
Figure 37C:
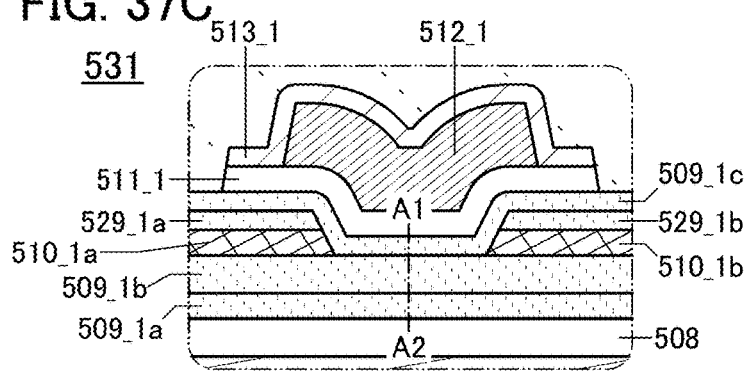

The transistor 100 includes an electrode 505_1, an insulating layer 506, an insulating layer 507, an insulating layer 508, a semiconductor layer 509_1a, a semiconductor layer 509_1b, a semiconductor layer 509_1c, an electrode 510_1a, an electrode 510_1b, a layer 529_1a, a layer 529_1b, an insulating layer 511_1, an electrode 512_1, and an insulating layer 513_1 (see FIGS. 37A to 37C).

The transistor 100 illustrated in FIGS. 37A to 37C is provided over a substrate 501 with an insulating layer 502 and an insulating layer 503 located therebetween. Specifically, an insulating layer 504 is provided over the insulating layer 503, and a portion of the insulating layer 504 is removed and the electrode 505_1 is embedded. The insulating layer 506 is provided over the electrode 505_1 and the insulating layer 504, the insulating layer 507 is provided over the insulating layer 506, and the insulating layer 508 is provided over the insulating layer 507. The insulating layer 508 has a projection, the semiconductor layer 509_1a is provided over the projection, and the semiconductor layer 509_1b is provided over the semiconductor layer 509_1a.

The semiconductor layer 509_1b includes a first region, a second region, and a third region. In the plan view, the third region is located between the first region and the second region.

The transistor 100 includes the electrode 510_1a over the first region of the semiconductor layer 509_1b and the electrode 510_1b over the second region of the semiconductor layer 509_1b. One of the electrode 510_1a and the electrode 510_1b can function as one of a source electrode and a drain electrode, and the other can function as the other of the source electrode and the drain electrode. Thus, one of the first region and the second region of the semiconductor layer 509_1b can function as the source region and the other can function as the drain region. Furthermore, the third region of the semiconductor layer 509_1b can function as a channel formation region.

The transistor 100 further includes the layer 529_1a over the electrode 510_1a and the layer 529_1b over the electrode 510_1b. The semiconductor layer 509_1c covering the layer 529_1a, the layer 529_1b, the electrode 510_1a, the electrode 510_1b, the semiconductor layer 509_1b, and the semiconductor layer 509_1a is provided. The semiconductor layer 509_1c includes a region in contact with a side surface of the electrode 510_1a, a region in contact with a side surface of the electrode 510_1b, a region in contact with the third region of the semiconductor layer 509_1b, a region in contact with a side surface of the semiconductor layer 509_1b, and a region in contact with a side surface of the semiconductor layer 509_1a.

The insulating layer 511_1 is provided over the semiconductor layer 509_1c, and the electrode 512_1 is provided over the insulating layer 511_1. The insulating layer 511_1 and the electrode 512_1 include a region overlapping with the third region.

The transistor 100 further includes the insulating layer 513_1 over the electrode 512_1. The insulating layers 511_1 and 513_1 extend beyond an end portion of the electrode 512_1 and have a region where the insulating layers 511_1 and 513_1 are in contact with each other in the extended portion.

In this embodiment, an insulating layer 514 is provided over the semiconductor layer 509_1c and the insulating layer 513_1, and an insulating layer 515 is provided over the insulating layer 514.

An electrode 516_1a is provided in an opening which overlaps with the electrode 510_1a and which is provided in the insulating layer 515, the insulating layer 514, the semiconductor layer 509_1c, and the layer 529_1a. An electrode 516_1b is provided in an opening which overlaps with the electrode 510_1b and which is provided in the insulating layer 515, the insulating layer 514, the semiconductor layer 509_1c, and the layer 529_1b. An electrode 516_1c is provided in an opening which overlaps with the electrode 512_1 and which is provided in the insulating layer 515, the insulating layer 514, and the insulating layer 513_1.

In this embodiment, an electrode 517_1a, an electrode 517_1b, and an electrode 517_1c are provided over the insulating layer 515. The electrode 517_1a is electrically connected to the electrode 510_1a through the electrode 516_1a. The electrode 517_1b is electrically connected to the electrode 510_1b through the electrode 516_1b. The electrode 517_1c is electrically connected to the electrode 512_1 through the electrode 516_1c.

As illustrated in FIG. 37B, in the transistor 100, the semiconductor layer 509_1b is located between the electrode 505_1 and the electrode 512_1 in the channel width direction. As described above, the insulating layer 508 has the projection. The semiconductor layer 509_1a and the semiconductor layer 509_1b are provided over the projection. By providing the projection, a bottom surface of the electrode 512_1 in a region not overlapping with the projection (a region not overlapping with the semiconductor layer 509_1b) can be closer to the substrate than a bottom surface of the semiconductor layer 509_1b is. The height of the projection is preferably larger than or equal to the thickness of the insulating layer 511_1. Alternatively, the height of the projection is preferably greater than or equal to the sum of the thickness of the insulating layer 511_1 and the thickness of the semiconductor layer 509_1c. Thus, the side surface of the semiconductor layer 509_1b can be covered with the electrode 512_1.

In other words, the transistor 100 can have a structure in which the semiconductor layer 509_1b can be electrically surrounded by an electric field between the electrode 505_1 and the electrode 512_1. Such a structure of a transistor in which a semiconductor layer where a channel is formed is electrically surrounded by an electric field between conductive layers (the electrodes 505_1 and 512_1 in the transistor 100) is called a surrounded channel (s-ch) structure. In the transistor 100 having an s-ch structure, a channel can be formed in the whole (bulk) of the semiconductor layer 509_1b. In the s-ch structure, the drain current of the transistor can be increased, so that a larger amount of on-state current (current which flows between the source and the drain when the transistor is on) can be obtained. Furthermore, the entire channel formation region of the semiconductor layer 509_1b can be depleted by the electric field between the electrode 505_1 and the electrode 512_1. Accordingly, the off-state current of the s-ch transistor can be further reduced. When the channel width is shortened, the effects of the s-ch structure, such as an increase in on-state current and a reduction in off-state current, can be enhanced.

One of the electrodes 505_1 and 512_1 can function as a gate electrode and the other can function as a back gate electrode. In general, a gate electrode and a back gate electrode are formed using a conductive layer and positioned so that the channel formation region of the semiconductor layer is located between the gate electrode and the back gate electrode. Thus, the back gate electrode can function in a manner similar to that of the gate electrode. The potential of the back gate electrode may be the same as that of the gate electrode or may be a ground potential or a predetermined potential. By changing the potential of the back gate electrode independently of the potential of the gate electrode, the threshold voltage of the transistor can be changed.

The electrode 505_1 and the electrode 512_1 can each function as a gate electrode. Thus, the insulating layers 506, 507, 508, and 511_1 can each function as a gate insulating layer.

In the case where one of the electrode 505_1 and the electrode 512_1 is referred to as a "gate electrode" or a "gate," the other can be referred to as a "back gate electrode" or a "back gate." For example, in the transistor 100, in the case where the electrode 505_1 is referred to as a "gate electrode," the electrode 512_1 is referred to as a "back gate electrode." In the case where the electrode 512_1 is used as a "gate electrode," the transistor 100 can be regarded as a kind of top-gate transistor.

The transistor including the back gate electrode has a smaller change in threshold voltage by a positive GBT stress test in which positive charges are applied to a gate than a transistor including no back gate electrode.

<Transistor 200>

The transistor 100 and the transistor 200 are preferably n-channel transistors. The threshold value of the transistor 200 is preferably larger than that of the transistor 100.

The transistor 200 is a kind of top-gate transistor. The transistor 200 includes an electrode 505_2, the insulating layer 506, the insulating layer 507, the insulating layer 508, a semiconductor layer 509_2a1, a semiconductor layer 509_2a2, a semiconductor layer 509_2b1, a semiconductor layer 509_2b2, a semiconductor layer 509_2c, an electrode 510_2a, an electrode 510_2b, a layer 529_2a, a layer 529_2b, an insulating layer 511_2, an electrode 512_2, and an insulating layer 513_2 (see FIGS. 38A to 38C).

Figure 38A:
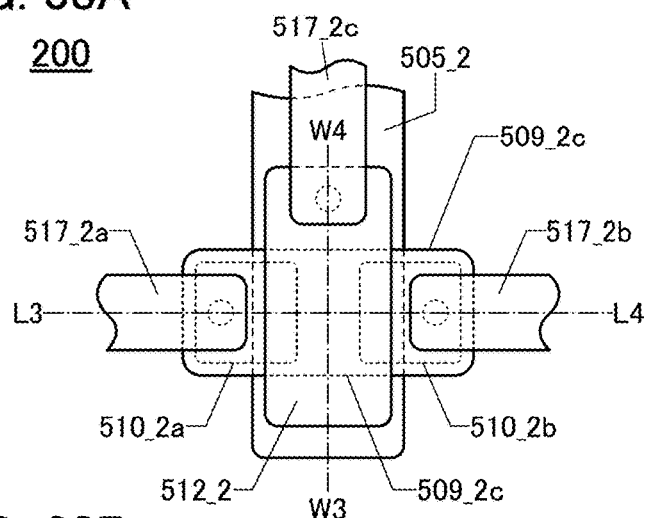
FIGS. 38A to 38C are a top view and cross-sectional views of a transistor.
Figure 38B:
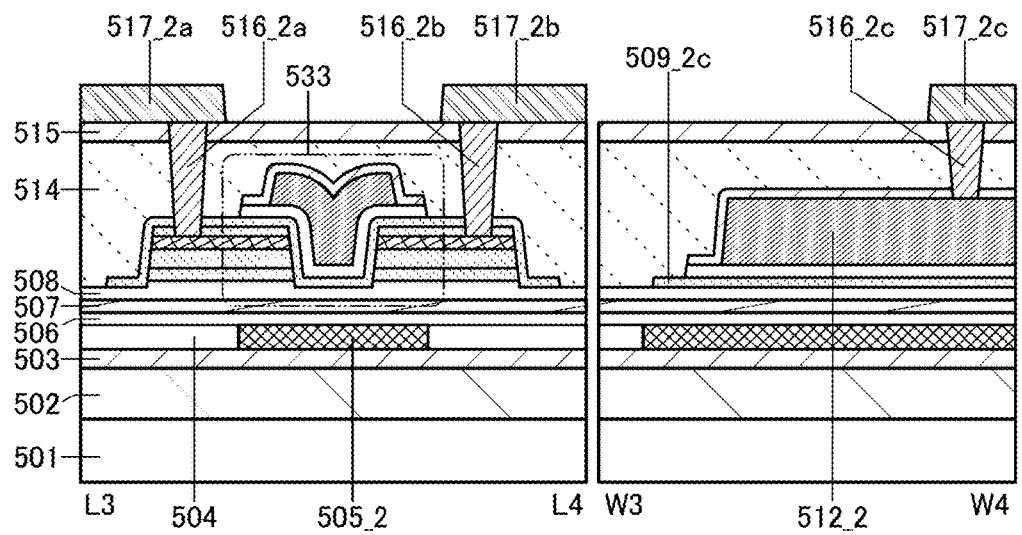
Figure 38C:
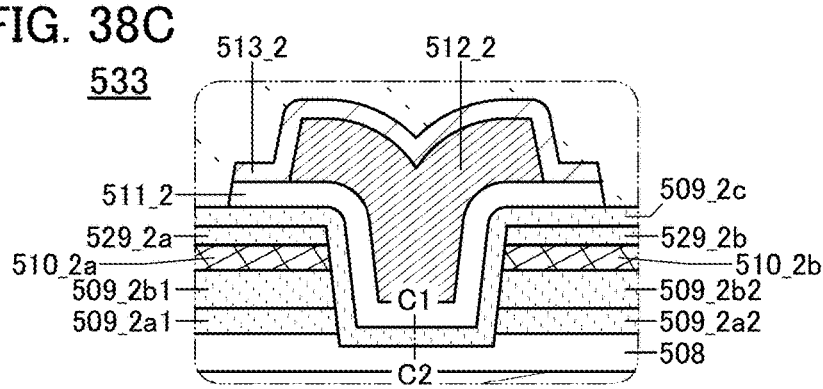

The transistor 200 illustrated in FIGS. 38A to 38C is provided over the substrate 501 with the insulating layer 502 and the insulating layer 503 located therebetween. Specifically, the insulating layer 504 is provided over the insulating layer 503, and a portion of the insulating layer 504 is removed and the electrode 505_2 is embedded. The insulating layer 506 is provided over the electrode 505_2 and the insulating layer 504, the insulating layer 507 is provided over the insulating layer 506, and the insulating layer 508 is provided over the insulating layer 507.

The insulating layer 508 includes a first projection and a second projection. The transistor 200 includes the semiconductor layer 509_2a1 over the first projection and the semiconductor layer 509_2b1 over the semiconductor layer 509_2a1. The transistor 200 includes the electrode 510_2a over the semiconductor layer 509_2b1 and the layer 529_2a over the electrode 510_2a. The transistor 200 includes the semiconductor layer 509_2a2 over the second projection and the semiconductor layer 509_2b2 over the semiconductor layer 509_2a2. The transistor 200 includes the electrode 510_2b over the semiconductor layer 509_2b2 and the layer 529_2b over the electrode 510_2b. One of the electrode 510_2a and the electrode 510_2b can function as one of a source electrode and a drain electrode, and the other can function as the other of the source electrode and the drain electrode.

The semiconductor layer 509_2c covers the layer 529_2a, the layer 529_2b, the electrode 510_2a, the electrode 510_2b, the semiconductor layer 509_2b1, the semiconductor layer 509_2b2, the semiconductor layer 509_2a1, and the semiconductor layer 509_2a2. The semiconductor layer 509_2c includes a region in contact with a side surface of the electrode 510_2a, a region in contact with a side surface of the semiconductor layer 509_2b1, and a region in contact with a side surface of the semiconductor layer 509_2a1. The semiconductor layer 509_2c also includes a region in contact with a side surface of the electrode 510_2b, a region in contact with a side surface of the semiconductor layer 509_2b2, and a region in contact with a side surface of the semiconductor layer 509_2a2.

The semiconductor layer 509_2c includes a first region, a second region, and a third region. In the plan view, the third region is located between the first region and the second region.

The first region of the semiconductor layer 509_2c overlaps with the layer 529_2a, the electrode 510_2a, the semiconductor layer 509_2b1, and the semiconductor layer 509_2a1. The second region of the semiconductor layer 509_2c overlaps with the layer 529_2b, the electrode 510_2b, the semiconductor layer 509_2b2, and the semiconductor layer 509_2a2. Furthermore, the third region of the semiconductor layer 509_2c can function as a channel formation region.

The transistor 200 includes the insulating layer 511_2 over the semiconductor layer 509_2c and the electrode 512_2 over the insulating layer 511_2. The insulating layer 511_2 and the electrode 512_2 include a region overlapping with the third region of the semiconductor layer 509_2c.

The transistor 200 further includes the insulating layer 513_2 over the electrode 512_2. The insulating layers 511_2 and 513_2 extend beyond an end portion of the electrode 512_2 and have a region where the insulating layers 511_2 and 513_2 are in contact with each other in the extended portion.

In this embodiment, the insulating layer 514 is provided over the semiconductor layer 509_2c and the insulating layer 513_2, and the insulating layer 515 is provided over the insulating layer 514.

An electrode 516_2a is provided in an opening which overlaps with the electrode 510_2a and which is provided in the insulating layer 515, the insulating layer 514, the semiconductor layer 509_2c, and the layer 529_2a. An electrode 516_2b is provided in an opening which overlaps with the electrode 510_2b and which is provided in the insulating layer 515, the insulating layer 514, the semiconductor layer 509_2c, and the layer 529_2b. An electrode 516_2c is provided in an opening which overlaps with the electrode 512_2 and which is provided in the insulating layer 515, the insulating layer 514, and the insulating layer 513_2.

In this embodiment, an electrode 517_2a, an electrode 517_2b, and an electrode 517_2c are provided over the insulating layer 515. The electrode 517_2a is electrically connected to the electrode 510_2a through the electrode 516_2a. The electrode 517_2b is electrically connected to the electrode 510_2b through the electrode 516_2b. The electrode 517_2c is electrically connected to the electrode 512_2 through the electrode 516_2c.

As in the transistor 100, one of the electrode 505_2 and the electrode 512_2 in the transistor 200 can function as a gate electrode, and the other can function as a back gate electrode. Thus, the insulating layers 506, 507, 508, and 511_2 can each function as a gate insulating layer.

In the case where one of the electrode 505_2 and the electrode 512_2 is simply referred to as a "gate electrode" or a "gate," the other can be referred to as a "back gate electrode" or a "back gate." For example, in the transistor 200, in the case where the electrode 505_2 is referred to as a "gate electrode," the electrode 512_2 is referred to as a "back gate electrode." In the case where the electrode 512_2 is used as a "gate electrode," the transistor 200 can be regarded as a kind of top-gate transistor.

In the transistor 100, a channel is formed in the semiconductor layer 509b. In the transistor 200, a channel is formed in a semiconductor layer 509c. The semiconductor layer 509b and the semiconductor layer 509c are preferably formed using semiconductor materials having different physical properties. When the semiconductor layer 509b and the semiconductor layer 509c are formed using semiconductor materials having different physical properties, the transistor 100 and the transistor 200 can have different electrical characteristics. When semiconductors having different energy band gaps are used for the semiconductor layers 509b and 509c, for example, the transistors 100 and 200 can have different field-effect mobilities.

When a semiconductor having lower electron affinity than that of the semiconductor layer 509b is used for the semiconductor layer 509c, for example, the transistor 200 can have higher $V_{th}$ than the transistor 100. Specifically, when the semiconductor layer 509b is an In-M-Zn oxide (an oxide containing In, an element M, and Zn) at an atomic ratio of $x_2:y_2:z_2$ and the semiconductor layer 509c is an In-M-Zn oxide at an atomic ratio of $x_1:y_1:z_1$, $y_1/x_1$ needs to be larger than $y_2/x_2$. With such In-M-Zn oxides, the transistor 200 can have larger $V_{th}$ than the transistor 100.

Although the transistor 200 in FIGS. 38A to 38C includes the electrode 512_2 functioning as a first gate and the electrode 505_2 functioning as a second gate, the transistor 200 may include only the electrode 512_2 or the electrode 505_2 (e.g., the electrode 505_2). In the case where a gate insulating film on the second gate side is thicker than an insulating film on the first gate side, the withstand voltage of the insulating film on the second gate side is higher in some cases. When the transistors FE1 and FE2 included in the holding circuit 50 described in Embodiment 1 need to withstand a high gate voltage, a high voltage is applied only to the electrode 505_2, or only the electrode 505_2 is provided without providing the electrode 512_2, whereby the reliability of the transistors can be increased.

<Structure Example of Semiconductor Device>

Figure 39:
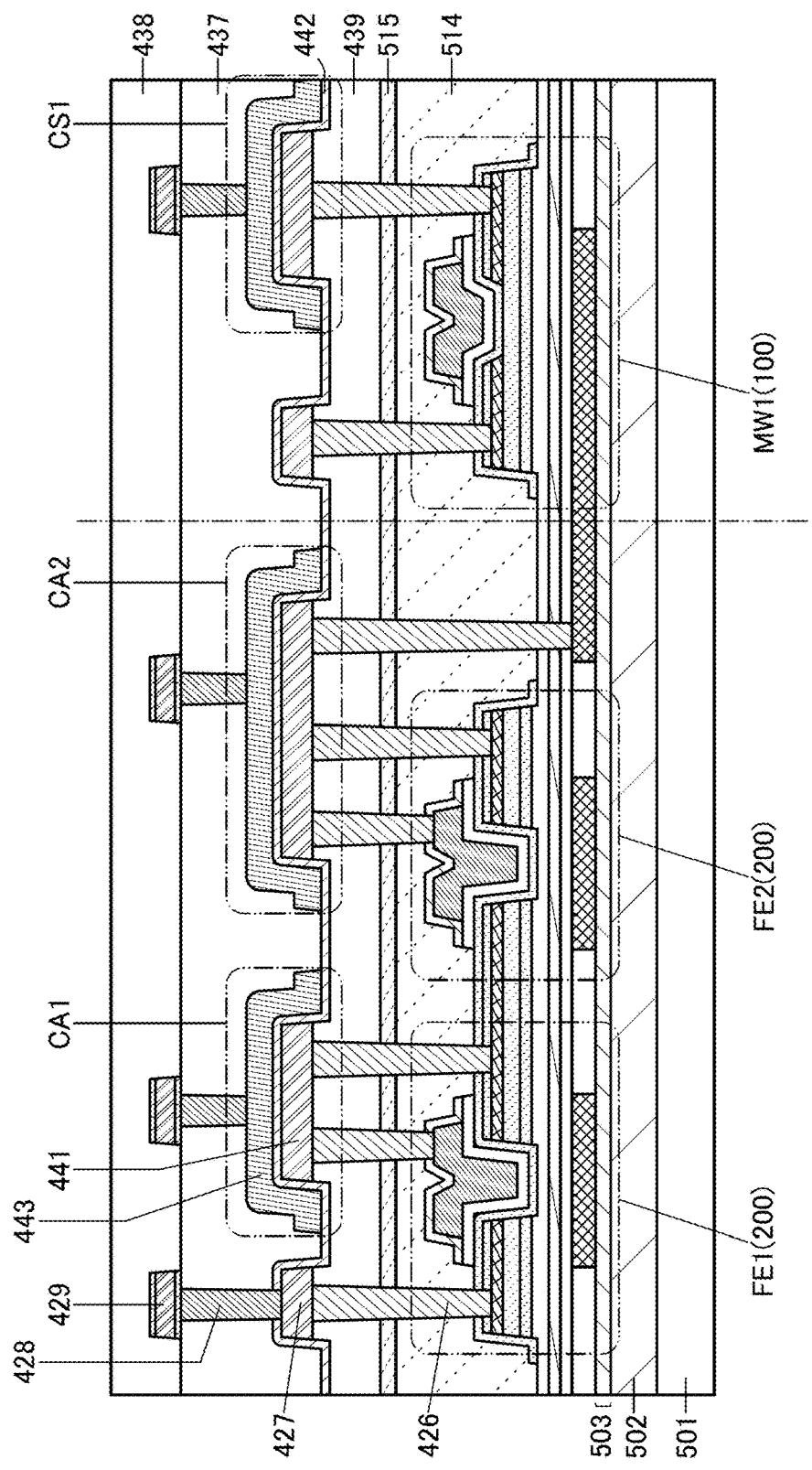
FIG. 39 is a cross-sectional view of a semiconductor device.

Next, a structure example of the semiconductor device of one embodiment of the present invention is described below. FIG. 39 is a cross-sectional view illustrating part of the cross-sectional structure of the semiconductor device 300 in which the memory cell 209 is included in the cell array 44, the transistor 100 is used as the transistor MW1 included in the memory cell 209, and the transistor 200 is used as each of the transistors FE1 and FE2 in the voltage holding portion 43. The transistor FE1, the transistor FE2, and the transistor MW1 are preferably n-channel OS transistors. The threshold value of the transistor FE2 and that of the transistor FE1 are preferably larger than the threshold value of the transistor MW1. When the transistor FE1 and the transistor FE2 have large threshold values, cutoff currents can be extremely low, which leads to improved (favorable) holding characteristics of the voltage holding portion 43. The transistor MW1 can have an extremely low cutoff current when a negative potential is supplied to its back gate from the voltage holding portion 43.

In FIG. 39, the semiconductor device 300 includes the transistor FE1, the transistor FE2, and the transistor MW1 over the substrate 501 with the insulating layers 502 and 503 provided therebetween. The insulating layer 515 and an insulating layer 439 are provided over the transistor FE1, the transistor FE2, and the transistor MW1. In addition, electrodes such as an electrode 441 and an electrode 427 are provided over the insulating layer 439. Furthermore, an insulating layer 442 that covers the electrodes such as the electrode 441 and the electrode 427 is provided, and electrodes such as an electrode 443 that covers the electrode 441 are provided over the insulating layer 442.

A region where the electrode 441, the insulating layer 442, and the electrode 443 overlap with each other functions as the capacitor CA1. Since the electrode 443 covers the electrode 441, not only the top surface but also side surfaces of the electrode 441 can function as the capacitor. Similarly, since the insulating layer 442 is provided between electrodes, the capacitor CA2 and the capacitor CS1 are formed.

An insulating layer 437 is provided over the electrode 443 and the insulating layer 442, an electrode 429 is provided over the insulating layer 437, and an insulating layer 438 is provided over the electrode 429. The electrode 429 is electrically connected to the electrode 427 through an electrode 428 provided in a portion of the insulating layer 437.

The transistor 100 and the transistor 200 included in the semiconductor device 300 described in this embodiment can be used as the transistors described in the above embodiments.

For example, the structures of the transistor MW1 and the capacitor CS1 illustrated in FIG. 39 can be applied to the transistor MW2 and the capacitor CS2 included in the memory cell 227, the transistor MW3 and the capacitor CS3 included in the memory cell 241, the transistor MW5 and the capacitor CS5 included in the memory cell 242, or the transistor MW6 and the capacitor CS6 included in the memory cell 243.

In FIG. 39, the electrode 441 included in the capacitor CA1 is connected to one of the source and the drain of the transistor FE1 and the gate of the transistor FE1 through electrodes. Furthermore, one electrode of the capacitor CA2 is connected to one of the source and the drain of the transistor FE2, the gate of the transistor FE2, and the back gate of the transistor MW1 through electrodes.

Figure 40:
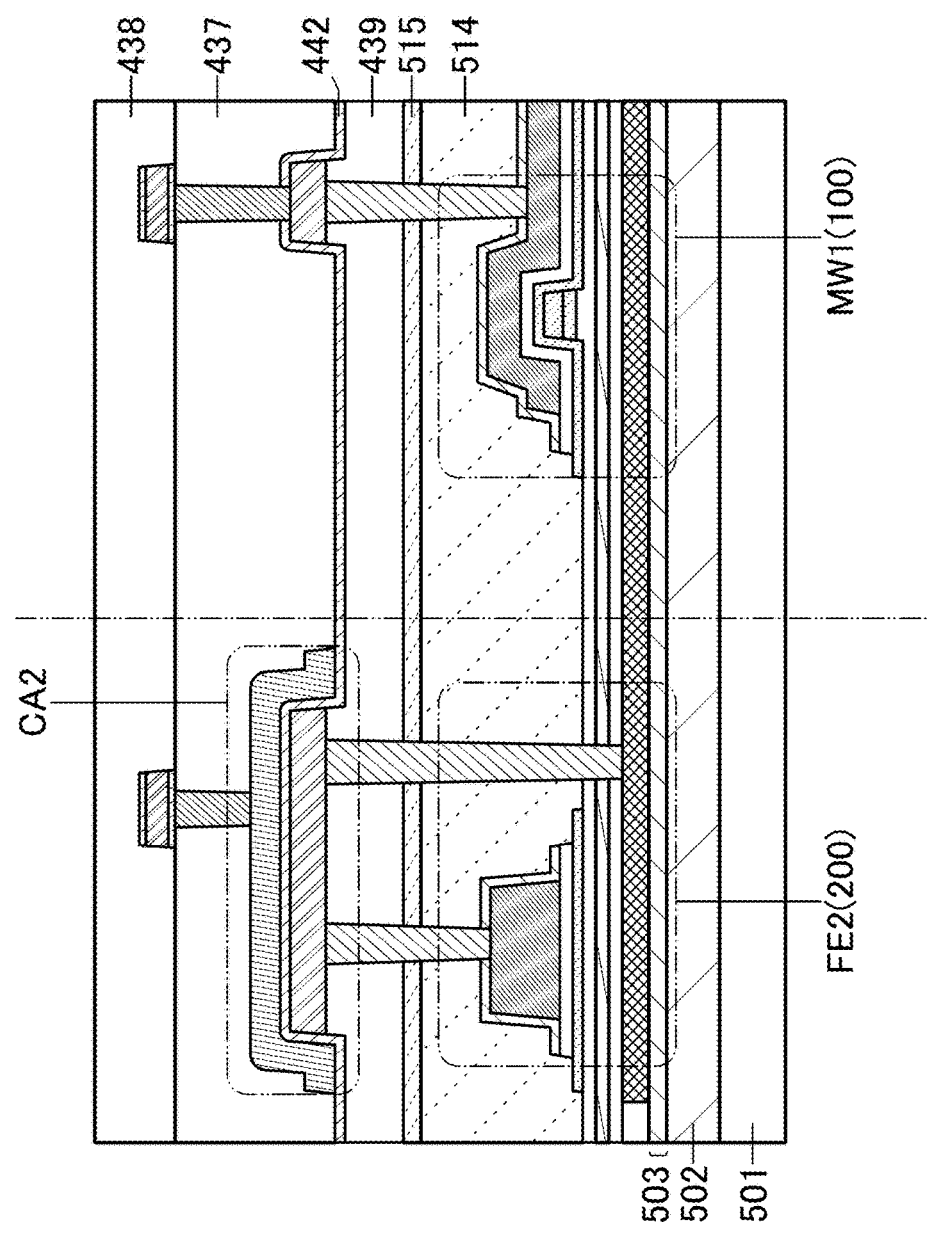
FIG. 40 is a cross-sectional view of a semiconductor device.

The back gate of the transistor FE2 may be extended in the channel width direction and electrically connected to the front gate of the transistor FE2, as illustrated in FIG. 40. FIG. 40 illustrates a cross section of the transistor FE2 in the semiconductor device 300 in a direction corresponding to the direction W3-W4 in FIGS. 38A to 38C.

Figure 41:
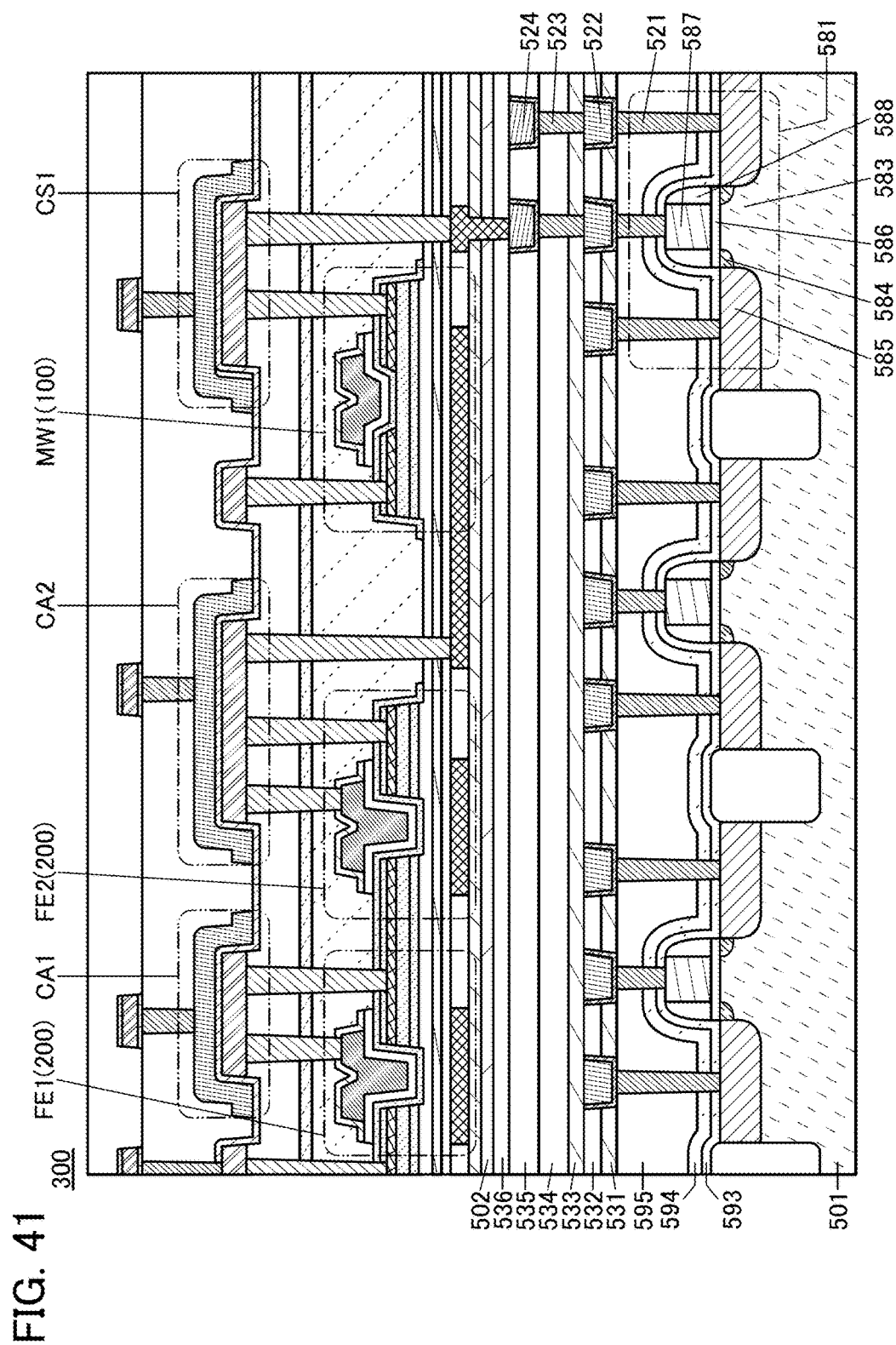
FIG. 41 is a cross-sectional view of a semiconductor device.

FIG. 41 illustrates an example of the cross-sectional structure of the semiconductor device 300. In FIG. 41, an insulating layer is provided over Si transistors such as a transistor 581, and OS transistors such as the transistor FE1, the transistor FE2, and the transistor MW1 are provided over the insulating layer.

The transistor 581 can be used as, for example, a transistor included in the cell array 44 (e.g., the transistor MR2), a transistor included in the comparator 20 (e.g., the transistor MP1), and a Si transistor in a circuit included in the semiconductor device 300, such as the logic circuit 52.

The transistor 100 can be used as an OS transistor included in the comparator described in Embodiment 4, such as the transistor M1, the transistor M2, the transistor M3, the transistor M4, the transistor M5, the transistor M14, or the transistor M15.

In the semiconductor device 300, an n-type semiconductor is used for a substrate 501. The transistor 581 includes a channel formation region 583, high-concentration p-type impurity regions 585, an insulating layer 586, an electrode 587, and a sidewall 588. In regions overlapping with the sidewall 588 with the insulating layer 586 located therebetween, low-concentration p-type impurity regions 584 are provided. The insulating layer 586 can function as a gate insulating layer. The electrode 587 can function as a gate electrode. The channel formation region 583 of the transistor 581 is formed in part of the substrate 501.

The low-concentration p-type impurity regions 584 can be formed in such a manner that an impurity element is added with the use of the electrode 587 as a mask after the formation of the electrode 587 and before the formation of the sidewall 588. The low-concentration p-type impurity regions 584 are not necessarily provided depending on circumstances.

The transistor 581 is electrically isolated from other transistors by an element isolation layer. The element isolation layer can be formed by a local oxidation of silicon (LOCOS) method, a shallow trench isolation (STI) method, or the like.

The transistor 581 can function as a p-channel transistor. An insulating layer 593 is formed over the transistor 581, and an insulating layer 594 is formed over the insulating layer 593. Note that the insulating layer 593 and the insulating layer 594 are preferably formed using an insulating material that has a function of preventing diffusion of impurities such as oxygen, hydrogen, water, alkali metal, and alkaline earth metal. Note that one of the insulating layers 593 and 594 may be omitted or another insulating layer may be stacked thereover.

Although an example of using a p-channel transistor is described here, an n-channel transistor can also be provided on the substrate 501.

The semiconductor device 300 includes an insulating layer 595 having a flat surface over the insulating layer 594.

An electrode 522 or the like is formed over the insulating layer 595. The electrode 522 or the like is electrically connected to one of the high concentration p-type impurity regions 585 through a contact plug 521 or the like. An insulating layer 531, an insulating layer 532, an insulating layer 533, an insulating layer 534, an insulating layer 535, and an insulating layer 536 are provided over the insulating layer 595. Furthermore, in the semiconductor device 300, the electrode 522 and an electrode 524 are provided over the insulating layer 595. The electrode 522 is provided to be embedded in the insulating layers 531 and 532 and is electrically connected to the transistor 581 through the contact plug 521 provided in the insulating layer 593, the insulating layer 594, and the insulating layer 595. The electrode 524 is provided to be embedded in the insulating layer 535. The electrode 524 is electrically connected to the electrode 522 through an electrode 523 provided in the insulating layers 533 and 534.

In the example illustrated in FIG. 41, the electrode 587 functioning as the gate electrode of the transistor 581 is connected to one electrode of the capacitor CS1 through plugs and electrodes.

<Modification Example>

Figure 42:
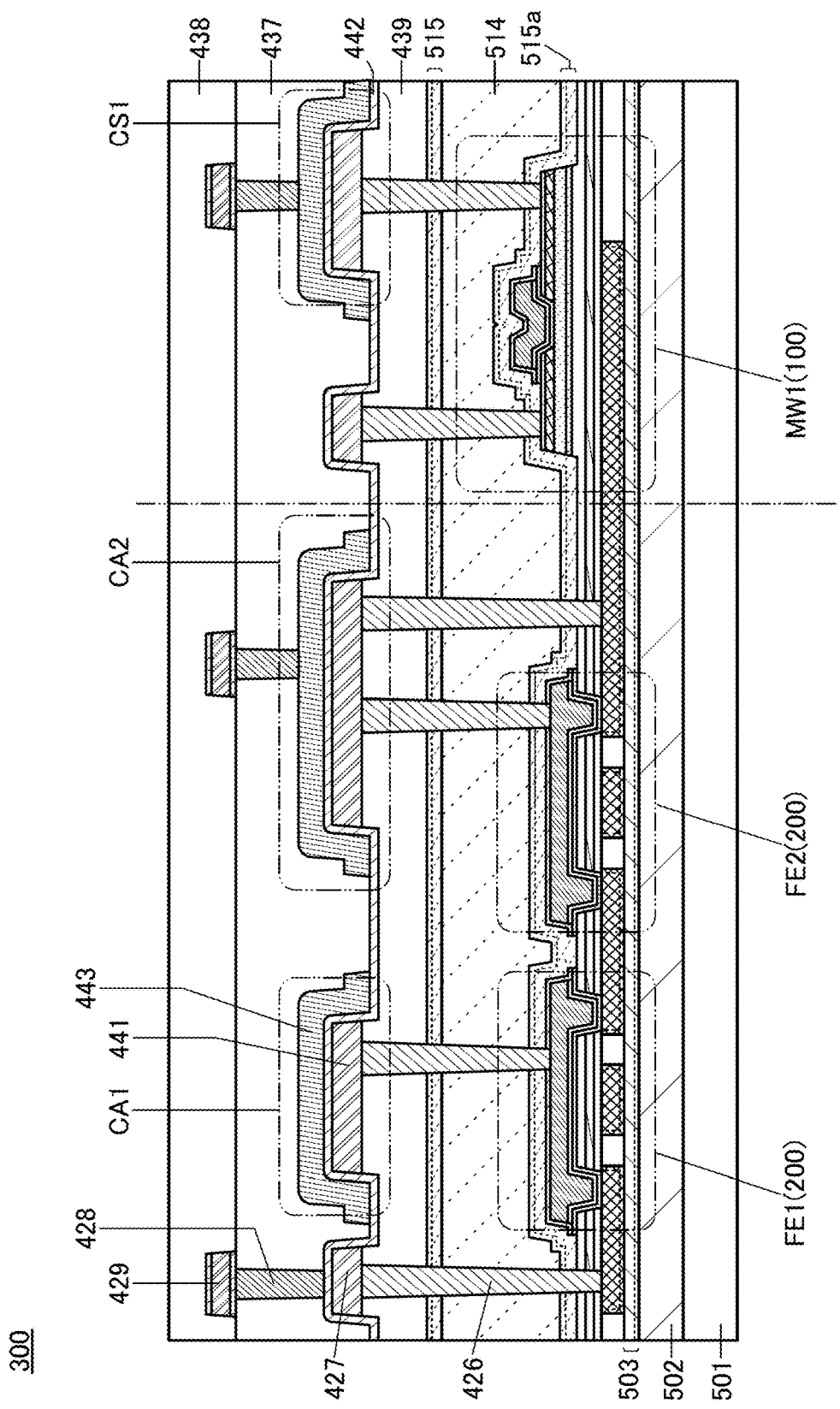
FIG. 42 is a cross-sectional view of a semiconductor device.
Figure 43C:
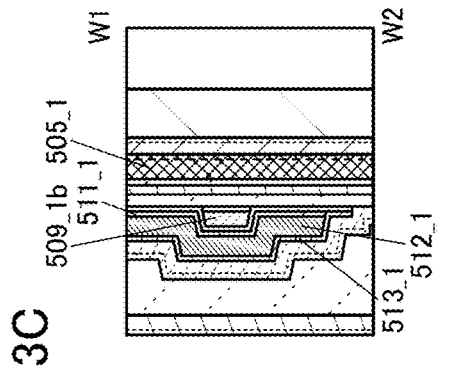
FIGS. 43A to 43D are a top view and cross-sectional views of transistors.
Figure 43D:
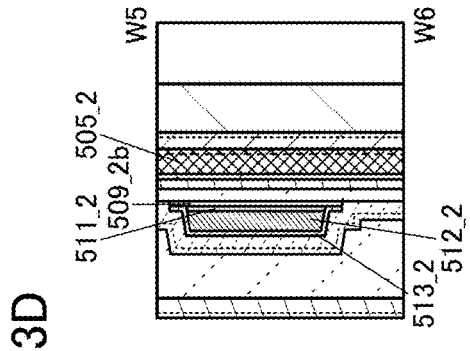
Figure 43A:
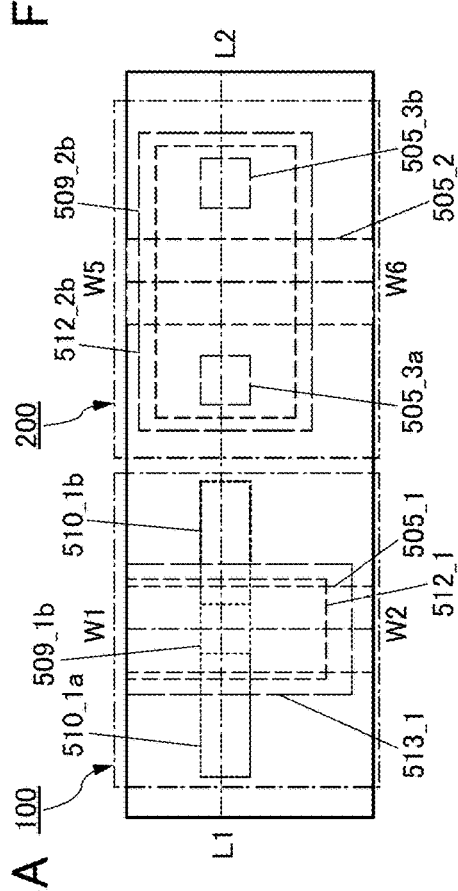
Figure 43B:
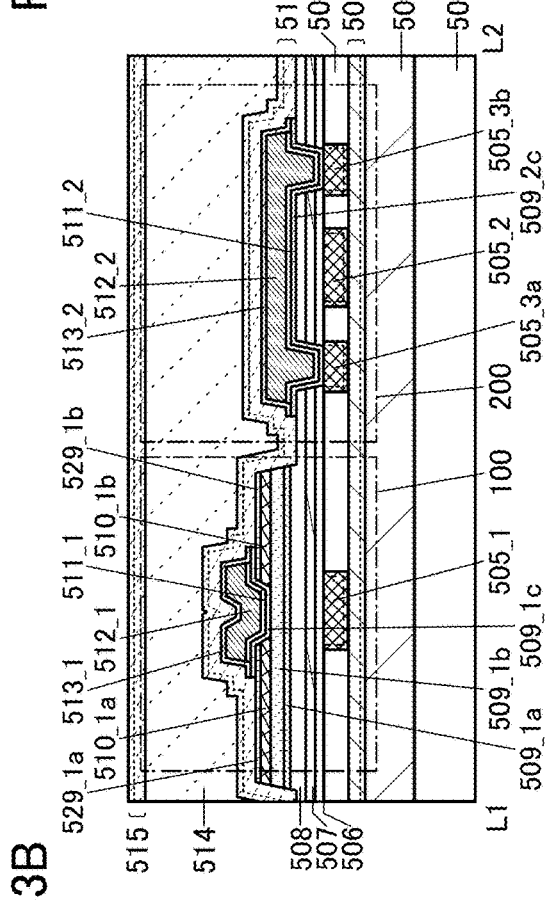

FIG. 42 illustrates an example of the cross-sectional structure of the semiconductor device 300 including the transistor 100 and the transistor 200 having structures different from those in FIG. 39. FIGS. 43A to 43D illustrate the details of the transistor 100 and the transistor 200 illustrated in FIG. 42.

The transistor 200 illustrated in FIGS. 43A to 43D includes the electrode 512_2 functioning as the first gate and the electrode 505_2 functioning as the second gate. An electrode 505_3a and an electrode 505_3b formed in the same layer as the electrode 505_2 function as the source and the drain of the transistor 200. The bottom surface of the semiconductor layer 509_2c is in contact with the electrode 505_3a and the electrode 505_3b.

The electrode 512_1 and the electrode 512_2 are covered with the insulating layer 513_1 and the insulating layer 513_2, respectively, and the insulating layer 513_1, the insulating layer 513_2, the layer 529_1a, and the layer 529_1b are covered with an insulating layer 519. For the insulating layer 519, the description of the insulating layer 515 can be referred to, for example.

Note that each of the insulating layers 503, 519, and 515 can be a stacked film of two or more different materials. Alternatively, each of the insulating layers 503, 519, and 515 may be formed using different deposition methods. For example, aluminum oxide formed by a sputtering method and aluminum oxide formed by an ALD method may be stacked.

In FIG. 42, an electrode functioning as one of the source and the drain of the transistor FE2 is connected to the gate of the transistor FE2 and one electrode of the capacitor CA2 through contact plugs. The electrode functioning as one of the source and the drain of the transistor FE2 also functions as the second gate of the transistor MW1.

<Materials>

Hereinafter, materials for the semiconductor device of one embodiment of the present invention will be described.

(Semiconductor Layer)

For the semiconductor layer 509, a single-crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor, an organic semiconductor, or the like may be used.

A semiconductor layer 509a, the semiconductor layer 509b, and the semiconductor layer 509c may be formed using semiconductors having different crystal states or different semiconductor materials. Hereinafter, the description of the semiconductor layer 509a can also be used for the semiconductor layers 509_1a, 509_2a1, and 509_2a2, the description of the semiconductor layer 509b can also be used for the semiconductor layers 509_1b, 509_2b1, and 509_2b2, and the description of the semiconductor layer 509c can also be used for the semiconductor layers 509_1c and 509_2c.

The energy band gap of an oxide semiconductor is greater than or equal to 2 eV; thus, when the oxide semiconductor is used for the semiconductor layer 509, a transistor with an extremely low off-state current can be provided. Specifically, the off-state current per micrometer in channel width at room temperature (typically 25° C.) and at a source-drain voltage of 3.5 V can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits. A transistor using an oxide semiconductor in the semiconductor layer 509 has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

In this embodiment, the case where an oxide semiconductor is used for the semiconductor layer 509 will be described.

(Oxide Semiconductor)

An oxide semiconductor according to the present invention will be described below. An oxide semiconductor preferably contains at least indium or zinc. In particular, indium and zinc are preferably contained. In addition to these, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

<Structure>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in many cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, a lattice arrangement is distorted so that formation of a crystal grain boundary is inhibited. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention. Furthermore, a CAC-OS may be included.

<Atomic Ratio>

First, preferred ranges of the atomic ratio of indium, the element M, and zinc contained in an oxide semiconductor according to the present invention are described with reference to FIGS. 44A to 44C. Note that the proportion of oxygen atoms is not shown in FIGS. 44A to 44C. The terms of the atomic ratio of indium, the element M, and zinc contained in the oxide semiconductor are denoted by [In], [M], and [Zn], respectively.

Figure 44A:
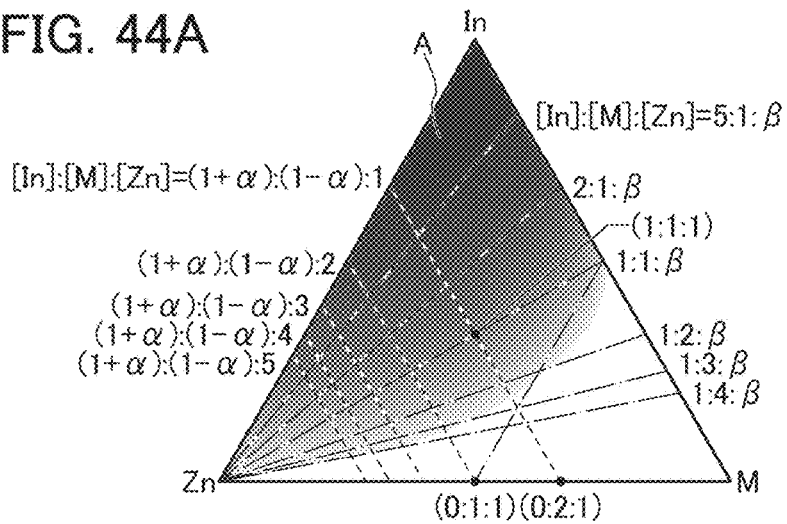
FIGS. 44A to 44C each illustrate an atomic ratio of an oxide of one embodiment of the present invention.
Figure 44B:
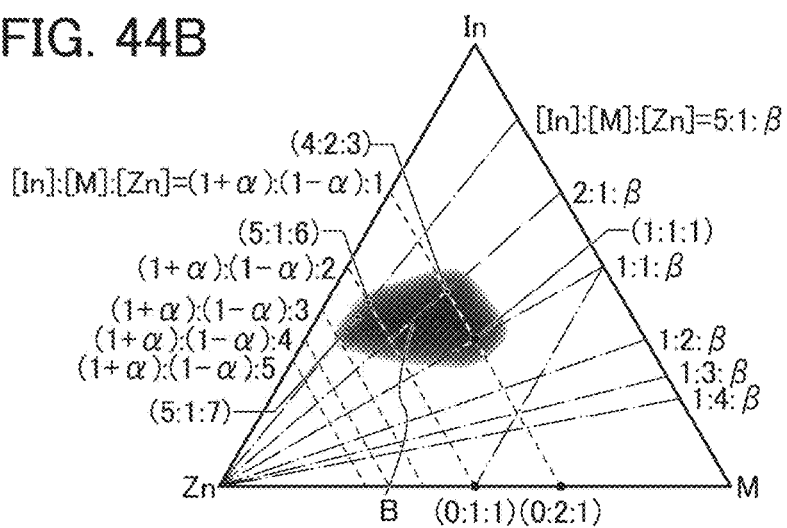
Figure 44C:
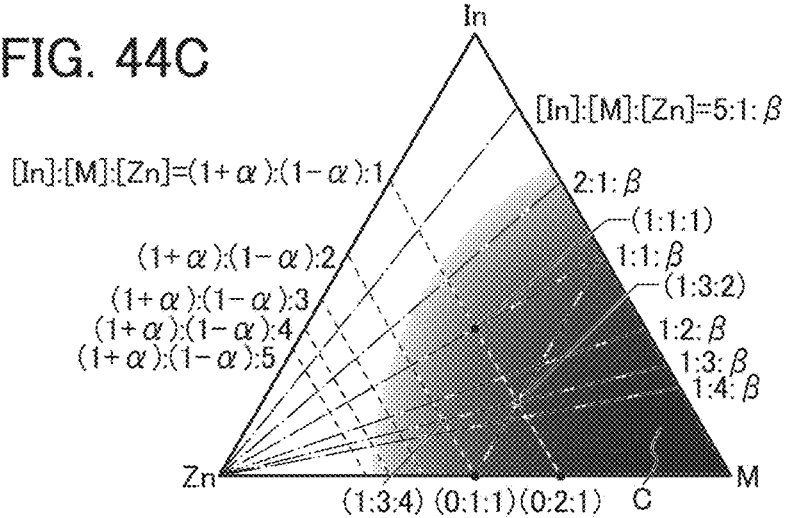

In FIGS. 44A to 44C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Dashed-double dotted lines indicate a line where the atomic ratio [In]:[M]:[Zn] is $(1+\gamma):2:(1-\gamma)$, where $-1 \leq \gamma \leq 1$. Furthermore, an oxide semiconductor with the atomic ratio of [In]:[M]:[Zn]=0:2:1 or a neighborhood thereof in FIGS. 44A to 44C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 44A represents examples of the preferred ranges of the atomic ratio of indium, the element M, and zinc contained in an oxide semiconductor.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased. Therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio [In]:[M]:[Zn] of 0:1:0 and the vicinity thereof (e.g., a region C in FIG. 44C), insulation performance becomes better.

Accordingly, an oxide semiconductor of one embodiment of the present invention preferably has an atomic ratio represented by the region A in FIG. 44A. With the atomic ratio, a layered structure with high carrier mobility and a few grain boundaries is easily obtained.

An oxide semiconductor with an atomic ratio in the region A, particularly in a region B in FIG. 44B, is excellent because the oxide semiconductor easily becomes a CAAC-OS and has high carrier mobility.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the region B includes an atomic ratio [In]:[M]:[Zn] of 4:2:3 to 4:2:4.1 and the vicinity thereof. The vicinity includes an atomic ratio [In]:[M]:[Zn] of 5:3:4. Note that the region B includes an atomic ratio [In]:[M]:[Zn] of 5:1:6 and the vicinity thereof and an atomic ratio [In]:[M]:[Zn] of 5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

[Transistor Including Oxide Semiconductor]

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ is used.

A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, a transistor whose channel region is formed in an oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, an alkali metal, an alkaline earth metal, iron, nickel, and silicon.

<Impurities>

Here, the influence of impurities in the oxide semiconductor will be described.

When silicon or carbon, which is one of Group 14 elements, is contained in the oxide semiconductor, defect states are formed. Thus, the concentration of silicon or carbon in the oxide semiconductor and around an interface with the oxide semiconductor (measured by secondary ion mass spectrometry, SIMS) is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the oxide semiconductor. Specifically, the concentration of an alkali metal or an alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel region in a transistor, the transistor can have stable electrical characteristics.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}$/cm$^3$, preferably lower than $1\times10^{11}$/cm$^3$, further preferably lower than $1\times10^{10}$/cm$^3$, and higher than or equal to $1\times10^{-9}$/cm$^3$ is used.

The carrier density of the oxide semiconductor is preferably reduced in order to inhibit the negative shift of the threshold voltage of the OS transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

To obtain stable electrical characteristics of the transistor, it is effective to reduce the concentration of impurities in the oxide semiconductor.

The concentration of silicon or carbon in the oxide semiconductor and around an interface with the oxide semiconductor (measured by SIMS) is set lower than or equal to $2\times10^{18}$ atoms/cm$^3$, preferably lower than or equal to $2\times10^{17}$ atoms/cm$^3$.

The concentration of an alkali metal or an alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

For the semiconductor layer 509b, an oxide semiconductor with a wide energy band gap is used, for example. The energy band gap of the semiconductor layer 509b is, for example, greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

In the case where the semiconductor layer 509 is formed by a sputtering method, the atomic ratio of In to M and Zn contained in the target may be 3:1:1, 3:1:2, 3:1:4, 1:1:0.5, 1:1:1, 1:1:2, 1:4:4, 4:2:4.1, 1:3:2, or 1:3:4, for example.

In the cases where the semiconductor layer 509 is formed by a sputtering method, a film having an atomic ratio different from the atomic ratio of the target may be formed. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target in some cases.

The semiconductor layer 509a and the semiconductor layer 509c are preferably formed using a material including one or more kinds of metal elements, other than oxygen, included in the semiconductor layer 509b. With the use of such a material, interface states at interfaces between the semiconductor layer 509a and the semiconductor layer 509b and between the semiconductor layer 509c and the semiconductor layer 509b are less likely to be generated. Accordingly, carriers are not likely to be scattered or captured at the interfaces, which results in an improvement in field-effect mobility of the transistor. Further, variation in threshold voltage (hereinafter also referred to as "$V_{th}$") of the transistor can be reduced. Thus, a semiconductor device having favorable electrical characteristics can be obtained.

When the semiconductor layer 509b is an In-M-Zn oxide (an oxide containing In, the element M, and Zn) at an atomic ratio of $x_2:y_2:z_2$ and each of the semiconductor layer 509a and the semiconductor layer 509c is an In-M-Zn oxide at an atomic ratio of $x_1:y_1:z_1$, $y_1/x_1$ is preferably larger than $y_2/x_2$. Further preferably, the semiconductor layer 509a, the semiconductor layer 509c, and the semiconductor layer 509b are selected so that $y_1/x_1$ is 1.5 or more times as large as $y_2/x_2$. Still further preferably, the semiconductor layer 509a, the semiconductor layer 509c, and the semiconductor layer 509b are selected so that $y_1/x_1$ is 2 or more times as large as $y_2/x_2$. Still further preferably, the semiconductor layer 509a, the semiconductor layer 509c, and the semiconductor layer 509b are selected so that $y_1/x_1$ is 3 or more times as large as $y_2/x_2$. In the semiconductor layer 509b at this time, $y_2$ is preferably larger than or equal to $x_2$ because the transistor can have stable electrical characteristics. However, when $y_2$ is five or more times as large as $x_2$, the field-effect mobility of the transistor is reduced; accordingly, $y_2$ is preferably smaller than five times $x_2$. When the semiconductor layers 509a and 509c each have the above structure, each of the semiconductor layers 509a and 509c can be a layer in which oxygen vacancy is less likely to occur than in the semiconductor layer 509b.

In the case of using an In-M-Zn oxide as the semiconductor layer 509a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor layer 509b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor layer 509c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor layer 509c and the semiconductor layer 509a may be formed using the same type of oxide.

For example, an In—Ga—Zn oxide which is formed using a target containing In, Ga, and Zn at an atomic ratio of 1:3:2, 1:3:4, 1:3:6, 1:4:5, 1:6:4, or 1:9:6 or an In—Ga oxide which is formed using a target containing In and Ga at an atomic ratio of 1:9 or 7:93 can be used for each of the semiconductor layers 509a and 509c containing In or Ga. For the semiconductor layer 509b, an In—Ga—Zn oxide formed using a target containing In, Ga, and Zn at an atomic ratio of 1:1:1, 3:1:2, or the like can be used, for example. Note that the atomic ratio of each of the semiconductor layers 509a, 509b, and 509c may vary within a margin of ±20% of the corresponding atomic ratio.

For the semiconductor layer 509b, an oxide having an electron affinity higher than that of each of the semiconductor layers 509a and 509c is used. For example, for the semiconductor layer 509b, an oxide having an electron affinity higher than that of each of the semiconductor layers 509a and 509c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has a low electron affinity and a high oxygen-blocking property. Therefore, the semiconductor layer 509c preferably includes an indium gallium oxide. The gallium atomic ratio [Ga/(In+Ga)] is, for example, higher than or equal to 70%, preferably higher than or equal to 80%, further preferably higher than or equal to 90%.

The semiconductor layer 509a and/or the semiconductor layer 509c may be formed using gallium oxide. The use of gallium oxide can reduce the off-state current of a transistor, in some cases.

At this time, when a gate voltage is applied, in the transistor 100, a channel is formed in the semiconductor layer 509b having the highest electron affinity among the semiconductor layers 509a to 509c.

The layer 529 (the layers 529_1a, 529_1b, 529_2a, and 529_2b) may be formed using a material and a method which are similar to those of the semiconductor layer 509. In the case where the layer 529 is formed using an oxide semiconductor layer, an oxide semiconductor layer which is less likely to release oxygen and/or which is less likely to absorb oxygen is preferably used.

Figure 45A:
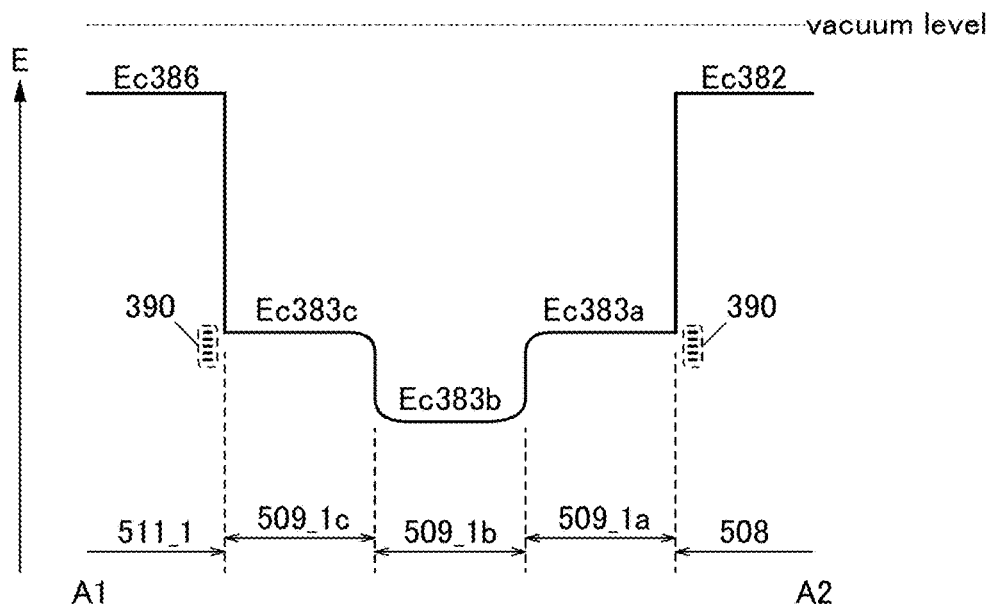
FIGS. 45A and 45B show energy band diagrams.
Figure 45B:
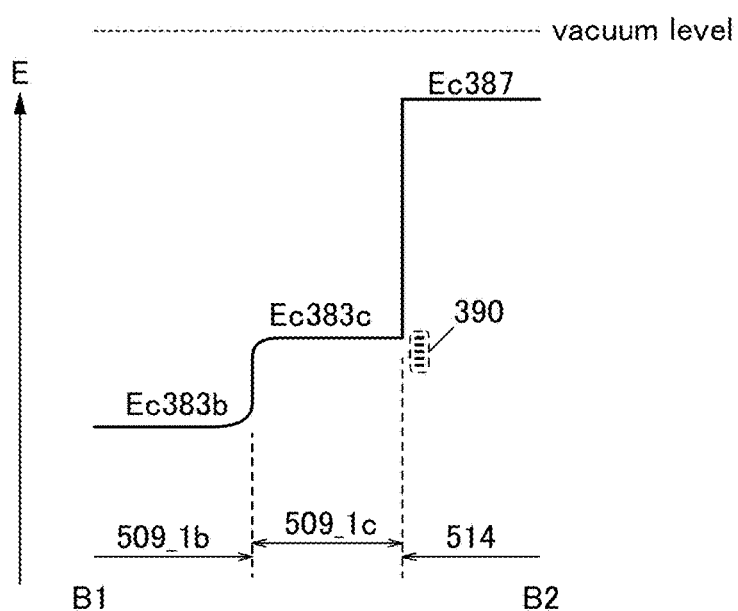

A function and an effect of the semiconductor layer 509 consisting of the semiconductor layers 509_1a, 509_1b, and 509_1c are described using an energy band diagram in FIGS. 45A and 45B. FIG. 45A illustrates the energy band structure of a portion along dashed dotted line A1-A2 in FIGS. 37B and 37C. In other words, FIG. 45A illustrates the energy band structure of a channel formation region of the transistor 100.

In FIG. 45A, Ec382, Ec383a, Ec383b, Ec383c, and Ec386 indicate the energy of the conduction band minimum of the insulating layer 508, the semiconductor layer 509_1a, the semiconductor layer 509_1b, the semiconductor layer 509_1c, and the insulating layer 511_1, respectively.

Since the insulating layer 508 and the insulating layer 511_1 are insulators, Ec382 and Ec386 are closer to the vacuum level (have a lower electron affinity) than Ec383a, Ec383b, and Ec383c.

Ec383a is closer to the vacuum level than Ec383b. Specifically, Ec383a is preferably located closer to the vacuum level than Ec383b by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV.

Ec383c is closer to the vacuum level than Ec383b. Specifically, Ec383c is preferably located closer to the vacuum level than Ec383b by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV.

In the case where the transistor 100 has an s-channel structure, a channel is formed in the whole of the semiconductor layer 509_1b. Therefore, as the semiconductor layer 509_1b has a larger thickness, a channel formation region becomes larger. In other words, the thicker the semiconductor layer 509_1b is, the larger the on-state current of the transistor 100 is. The thickness of the semiconductor layer 509_1b is 5 nm or larger, preferably 10 nm or larger, further preferably 20 nm or larger, still further preferably 50 nm or larger.

Moreover, the thickness of the semiconductor layer 509_1c is preferably as small as possible to increase the on-state current of the transistor 100. The thickness of the semiconductor layer 509_1c is less than 20 nm, preferably less than or equal to 10 nm, further preferably less than or equal to 5 nm. Meanwhile, the semiconductor layer 509_1c has a function of blocking entry of elements other than oxygen (such as hydrogen and silicon) included in the adjacent insulator into the semiconductor layer 509_1b where a channel is formed. For this reason, it is preferable that the semiconductor layer 509_1c have a certain thickness. The semiconductor layer 509_1c may have a thickness greater than or equal to 0.3 nm, preferably greater than or equal to 1 nm, further preferably greater than or equal to 2 nm.

To improve reliability, preferably, the thickness of the semiconductor layer 509_1a is large. The semiconductor layer 509_1a may have a thickness greater than or equal to 10 nm, preferably greater than or equal to 20 nm, further preferably greater than or equal to 40 nm, still further preferably greater than or equal to 60 nm. When the thickness of the semiconductor layer 509_1a is made large, the distance from an interface between the adjacent insulator (the insulating layer 508) and the semiconductor layer 509_1a to the semiconductor layer 509_1b in which a channel is formed can be large. However, to prevent the productivity of the transistor 100 or the semiconductor device including the transistor 100 from being decreased, the semiconductor layer 509_1a has, for example, a thickness less than or equal to 50 nm, preferably less than or equal to 20 nm, further preferably less than or equal to 10 nm.

Figure 37D:
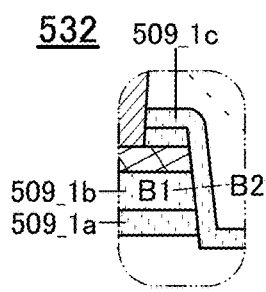

FIG. 45B illustrates the energy band structure of a portion along dashed dotted line B1-B2 in FIG. 37D. In other words, FIG. 45B illustrates the energy band structure of a side surface of the semiconductor layer 509_1b.

In FIG. 45B, Ec387, Ec383c, and Ec383b indicate the energy of the conduction band minimum of the insulating layer 514, that of the semiconductor layer 509_1c, and that of the semiconductor layer 509_1b, respectively. Although the trap states 390 due to impurities or defects might be formed in the vicinity of the interface between the side surface of the semiconductor layer 509_1b and the insulating layer 514, the side surface of the semiconductor layer 509_1b can be apart from the trap states owing to the existence of the semiconductor layer 509_1c.

Figure 46:
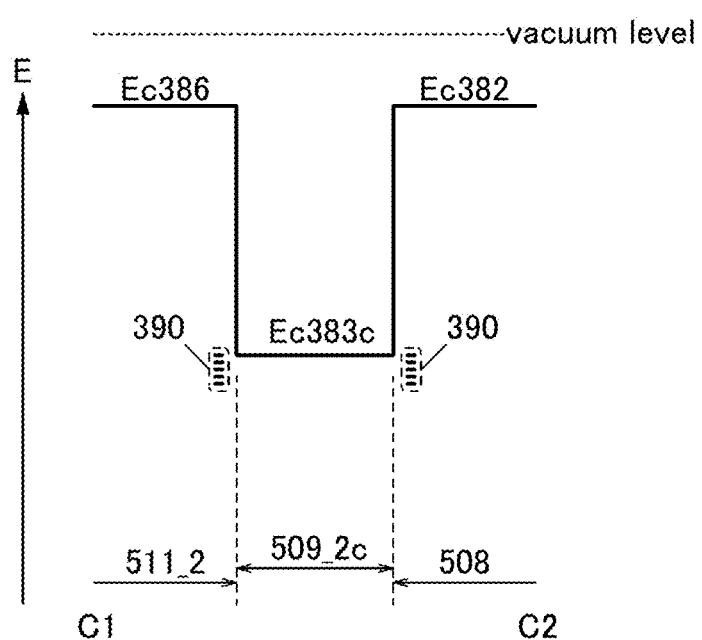
FIG. 46 shows an energy band diagram.

FIG. 46 illustrates the energy band structure of a portion along a dashed dotted line C1-C2 in FIG. 38C. In other words, FIG. 46 illustrates the energy band structure of a channel formation region of the transistor 200.

In FIG. 46, Ec382, Ec383c, and Ec386 indicate the energy of the conduction band minimum of the insulating layer 508, that of the semiconductor layer 509_2c, and that of the insulating layer 511_2, respectively. Since a region of the semiconductor layer 509_2c where a channel is formed is in direct contact with the insulating layer 508 and the insulating layer 511_2 in the transistor 200, the transistor 200 is likely to be affected by interface scattering and the trap states 390. Thus, the transistor 200 has lower on-state current and field-effect mobility than the transistor 100. Furthermore, the transistor 200 has higher $V_{th}$ than the transistor 100.

Although the semiconductor layer of the transistor 100 has the above three-layer structure in this embodiment, one embodiment of the present invention is not limited thereto. For example, the semiconductor layer may have a two-layer structure without one of the semiconductor layer 509_1a and the semiconductor layer 509_1c. Alternatively, a single layer structure using any one of the semiconductor layer 509_1a, the semiconductor layer 509_1b, and the semiconductor layer 509_1c may be employed. Alternatively, a four-layer structure in which any one of the above-described semiconductor layers is provided under or over the semiconductor layer 509_1a or under or over the semiconductor layer 509_1c may be employed. Further alternatively, it is possible to employ an n-layer structure (n is an integer of 5 or more) in which any one of the semiconductor layers described as examples of the semiconductor layer 509a, the semiconductor layer 509b, and the semiconductor layer 509c is provided at two of the following positions: under the semiconductor layer 509a; over the semiconductor layer 509a; under the semiconductor layer 509c; and over the semiconductor layer 509c.

(Substrate)

There is no particular limitation on a material used for the substrate 501 as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate 501. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 501 is not limited to a simple supporting substrate, and may be a substrate where a device such as a transistor is formed. In this case, at least one of the gate, the source, and the drain of the transistor 100 and/or the transistor 200 may be electrically connected to the device.

Further alternatively, as the substrate 501, a glass substrate of barium borosilicate glass, aluminoborosilicate glass, or the like, a ceramic substrate, a quartz substrate, or a sapphire substrate can be used. Note that a flexible substrate may be used as the substrate 501. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate 501 preferably has a lower coefficient of linear expansion because deformation due to an environment is suppressed. The flexible substrate used as the substrate 501 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

(Insulating Layer)

The insulating layers 502 to 504 and 506 to 508, the insulating layers 511_1 and 511_2 (hereinafter, also referred to as the insulating layer 511), and the insulating layers 513_1, 513_2, 514, and 515 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 515 and the insulating layer 502 and/or the insulating layer 503 be formed using an insulating material that is relatively impermeable to impurities. Examples of such an insulating material include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material that is relatively impermeable to impurities is used for the insulating layer 502 and/or the insulating layer 503, impurity diffusion from the substrate 501 side can be suppressed, and the reliability of the transistor can be improved. When the insulating material that is relatively impermeable to impurities is used for the insulating layer 515, impurity diffusion from layers above the insulating layer 515 can be suppressed, and the reliability of the transistor can be improved.

Note that a stack of a plurality of insulating layers formed with these materials may be used as the insulating layer 515 and the insulating layer 502 and/or the insulating layer 503. One of the insulating layer 502 and the insulating layer 503 may be omitted.

When an oxide semiconductor is used for the semiconductor layer 509, the hydrogen concentrations in the insulating layers is preferably lowered in order to prevent an increase in the hydrogen concentration in the semiconductor layer 509. Specifically, the hydrogen concentration in the insulating layer that is measured by SIMS is set lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is particularly preferable to lower the hydrogen concentrations of the insulating layers 504, 506 to 508, 511, and 514. It is preferable to lower at least the hydrogen concentrations of the insulating layers 508, 511, and 514 in contact with the semiconductor layer 509.

Furthermore, the nitrogen concentrations in the insulating layers are preferably low in order to prevent an increase in the nitrogen concentration in the semiconductor layer 509. Specifically, the nitrogen concentration in the insulating layer, which is measured by SIMS, is set lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

At least one of the insulating layers 508, 511, and 514 is preferably formed using an insulating layer from which oxygen is released by heating. Specifically, it is preferable to use an insulating layer of which the amount of released oxygen converted into oxygen atoms is $1.0\times10^{18}$ atoms/cm$^3$ or more, preferably $3.0\times10^{20}$ atoms/cm$^3$ or more, in TDS analysis performed under such a condition that a surface of the layer is heated at a temperature higher than or equal to 100° C. and lower than or equal to 700° C., preferably higher than or equal to 100° C. and lower than or equal to 500° C. Note that oxygen released by heating is also referred to as excess oxygen.

A heat-resistant organic material such as a polyimide, an acrylic resin, a benzocyclobutene-based resin, a polyamide, or an epoxy-based resin may be used to form the insulating layer 514. Other than the above organic materials, a low-dielectric constant material (low-k material), a siloxane-based resin, phosphosilicate glass (PSG), borophosphosilicate glass (BPSG), or the like can be used. Note that the insulating layer 514 may be formed by stacking a plurality of insulating layers formed using any of these materials.

Any of the above insulating layers may be used as the layer 529. In the case where the layer 529 is an insulating layer, an insulating layer which is less likely to release oxygen and/or which is less likely to absorb oxygen is preferably used.

(Electrode)

As a conductive material for forming the electrodes 505_1, 505_2, 510_1a, 510_1b, 510_2a, 510_2b, 512_1, 512_2, 516_1a, 516_1b, 516_1c, 516_2a, 516_2b, 516_2c, 517_1a, 517_1b, 517_1c, 517_2a, 517_2b, and 517_2c, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or a silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen may be used.

A stack of a plurality of conductive layers formed with the above materials may be used.

The electrode 516 may be formed using, for example, a conductive material with high embeddability, such as tungsten or polysilicon. A conductive material with high embeddability and a barrier layer (a diffusion prevention layer) such as a titanium layer, a titanium nitride layer, or a tantalum nitride layer may be used in combination. Note that each of the electrodes 516_1a, 516_1b, 516_1c, 516_2a, 516_2b, and 516_2c may be referred to as a contact plug.

Any of the above conductive materials may be used for the layer 529. In the case where the layer 529 is formed using a conductive material, a conductive material which is less likely to release oxygen and/or which is less likely to absorb oxygen is preferably used.

<Deposition Method>

An insulating material for forming the insulating layers, a conductive material for forming the electrodes, or a semiconductor material for forming the semiconductor layers can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, or a pulsed laser deposition (PLD) method.

By using a plasma CVD method, a high-quality film can be formed at a relatively low temperature. By using a deposition method that does not use plasma for deposition, such as an MOCVD method, an ALD method, or a thermal CVD method, a film can be formed with few defects because damage is not easily caused on a surface on which the film is deposited.

In the case where a film is formed by an ALD method, a gas that does not contain chlorine is preferably used as a material gas.

This application is based on Japanese Patent Application serial no. 2016-082257 filed with Japan Patent Office on Apr. 15, 2016 and Japanese Patent Application serial no. 2016-091517 filed with Japan Patent Office on Apr. 28, 2016, the entire contents of which are hereby incorporated by reference.

What is claimed is:

1. A semiconductor device comprising:
    a first transistor and a second transistor;
    a first capacitor and a second capacitor;
    a comparator; and
    a logic circuit,
    wherein one of a source and a drain of the first transistor is electrically connected to one electrode of the first capacitor and one of a source and a drain of the second transistor,
    wherein the other of the source and the drain of the second transistor is electrically connected to one electrode of the second capacitor and a non-inverting input terminal of the comparator,
    wherein a gate of the first transistor is electrically connected to the one of the source and the drain of the first transistor,
    wherein a gate of the second transistor is electrically connected to the other of the source and the drain of the second transistor,
    wherein an input terminal the logic circuit is electrically connected to an output terminal of the comparator,
    wherein an output terminal of the logic circuit is electrically connected to the other electrode of the first capacitor, and
    wherein each of a channel region of the first transistor and the second transistor comprises an oxide semiconductor comprising indium.

2. The semiconductor device according to claim 1, wherein the other of the source and the drain of the first transistor is electrically connected to an inverting input terminal of the comparator.

3. The semiconductor device according to claim 1 comprising a charge pump,
    wherein an output terminal of the charge pump is electrically connected to the other of the source and the drain of the first transistor, and
    wherein the charge pump comprises a transistor containing silicon in a channel region.

4. The semiconductor device according to claim 1 comprising a memory device,
    wherein the memory device comprises a plurality of transistors each having a back gate and a channel region containing an oxide semiconductor, and
    wherein the back gate of each of the plurality of transistors is electrically connected to the other of the source and the drain of the second transistor.

5. The semiconductor device according to claim 4, wherein the channel region of the second transistor comprises a portion whose energy band gap is larger than an energy band gap of any of the plurality of transistors included in the memory device.

6. The semiconductor device according to claim 4,
    wherein the channel region of the second transistor and the channel regions of the plurality of transistors in the memory device contain indium, an element M, and zinc,
    wherein the element M is one or more selected from aluminum, gallium, yttrium, tin, boron, silicon, titanium, iron, nickel, germanium, zirconium, molybdenum, lanthanum, cerium, neodymium, hafnium, tantalum, tungsten, and magnesium,
    wherein an atomic ratio of indium to the element M and zinc in the channel region of the second transistor is $x_2:y_2:z_2$,
    wherein an atomic ratio of indium to the element M and zinc in the channel region of any of the plurality of transistors in the memory device is $x_5:y_5:z_5$, and
    wherein $y_5/x_5$ is larger than $y_2/x_2$.

7. The semiconductor device according to claim 1, wherein a reference potential is supplied to an inverting input terminal of the comparator.

8. A semiconductor device comprising:
    a first transistor and a second transistor;
    a first capacitor and a second capacitor; and
    a comparator,
    wherein one of a source and a drain of the first transistor is electrically connected to one electrode of the first capacitor and one of a source and a drain of the second transistor,
    wherein the other of the source and the drain of the second transistor is electrically connected to one electrode of the second capacitor and a non-inverting input terminal of the comparator,
    wherein each of the first transistor and the second transistor comprises a gate and a back gate,
    wherein the gate of the first transistor is electrically connected to the one of the source and the drain of the first transistor and the back gate of the first transistor, wherein the gate of the second transistor is electrically connected to the other of the source and the drain of the second transistor and the back gate of the second transistor, and wherein each of a channel region of the first transistor and the second transistor comprises an oxide semiconductor comprising indium.

9. The semiconductor device according to claim 8, wherein the other of the source and the drain of the first transistor is electrically connected to an inverting input terminal of the comparator.

10. The semiconductor device according to claim 8, wherein a reference potential is supplied to an inverting input terminal of the comparator.

11. The semiconductor device according to claim 8, further comprising a logic circuit,
wherein an input terminal the logic circuit is electrically connected to an output terminal of the comparator, and
wherein an output terminal of the logic circuit is electrically connected to the other electrode of the first capacitor.

12. The semiconductor device according to claim 8, further comprising:
a charge pump electrically connected to the other of the source and the drain of the first transistor; and
a memory device electrically comprising a plurality of transistors each having a back gate,
wherein the back gate of each of the plurality of transistors is electrically connected to the other of the source and the drain of the second transistor.

13. A semiconductor device comprising:
a first transistor and a second transistor;
a first capacitor and a second capacitor;
a comparator; and
a logic circuit, wherein one of a source and a drain of the first transistor is electrically connected to one electrode of the first capacitor and one of a source and a drain of the second transistor, wherein the other of the source and the drain of the second transistor is electrically connected to one electrode of the second capacitor and a non-inverting input terminal of the comparator, wherein a gate of the first transistor is electrically connected to the other of the source and the drain of the first transistor, wherein a gate of the second transistor is electrically connected to the one of the source and the drain of the second transistor, wherein an input terminal the logic circuit is electrically connected to an output terminal of the comparator, wherein an output terminal of the logic circuit is electrically connected to the other electrode of the first capacitor, and wherein each of a channel region of the first transistor and the second transistor comprises an oxide semiconductor comprising indium.

14. The semiconductor device according to claim 13, wherein the other of the source and the drain of the first transistor is electrically connected to an inverting input terminal of the comparator.

15. The semiconductor device according to claim 13, further comprising:
a charge pump electrically connected to the other of the source and the drain of the first transistor; and
a memory device electrically comprising a plurality of transistors each having a back gate,
wherein the back gate of each of the plurality of transistors is electrically connected to the other of the source and the drain of the second transistor.

* * * * *